United States Patent
Onuki et al.

(10) Patent No.: US 12,289,878 B2
(45) Date of Patent: Apr. 29, 2025

(54) SEMICONDUCTOR DEVICE AND METHOD OF MANUFACTURING SEMICONDUCTOR DEVICE

(71) Applicant: Semiconductor Energy Laboratory Co., Ltd., Atsugi (JP)

(72) Inventors: Tatsuya Onuki, Atsugi (JP); Takanori Matsuzaki, Atsugi (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 528 days.

(21) Appl. No.: 17/623,299

(22) PCT Filed: Jun. 30, 2020

(86) PCT No.: PCT/IB2020/056149
§ 371 (c)(1),
(2) Date: Dec. 28, 2021

(87) PCT Pub. No.: WO2021/009589
PCT Pub. Date: Jan. 21, 2021

(65) Prior Publication Data
US 2022/0328486 A1     Oct. 13, 2022

(30) Foreign Application Priority Data
Jul. 12, 2019   (JP) ................. 2019-129905

(51) Int. Cl.
*H01L 27/12*    (2006.01)
*H01L 29/66*    (2006.01)
(Continued)

(52) U.S. Cl.
CPC ......... *H10B 12/00* (2023.02); *H01L 27/1225* (2013.01); *H01L 27/1255* (2013.01);
(Continued)

(58) Field of Classification Search
CPC ............. H01L 29/7869; H01L 27/1225; H01L 27/1255; H01L 29/66969; H01L 29/78648;
(Continued)

(56) References Cited

U.S. PATENT DOCUMENTS 9,773,919 B2   9/2017   Sasagawa et al.
9,935,203 B2   4/2018   Sasagawa et al.
(Continued)

FOREIGN PATENT DOCUMENTS

CN   107980178 A   5/2018
CN   108886021 A   11/2018
(Continued)

OTHER PUBLICATIONS

Taiwanese Office Action (Application No. 109122285) Dated Feb. 21, 2024.
(Continued)

*Primary Examiner* — Ratisha Mehta
*Assistant Examiner* — Brad A Knudson
(74) *Attorney, Agent, or Firm* — Eric J. Robinson; Robinson Intellectual Property Law Office, P.C.

(57) ABSTRACT

A semiconductor device that can be miniaturized or highly integrated can be provided. The semiconductor device includes a first conductor positioned over a substrate; an oxide positioned in contact with atop surface of the first conductor; a second conductor, a third conductor, and a fourth conductor positioned over the oxide; a first insulator in which a first opening and a second opening are formed, the first insulator being positioned over the second conductor to the fourth conductor; a second insulator positioned in the first opening; a fifth conductor positioned over the second insulator; a third insulator positioned in the second opening; and a sixth conductor positioned over the third (Continued)

insulator. The third conductor is positioned to overlap with the first conductor. The first opening is formed to overlap with a region between the second conductor and the third conductor. The second opening is formed to overlap with a region between the third conductor and the fourth conductor.

8 Claims, 28 Drawing Sheets

(51) Int. Cl.
   *H01L 29/786* (2006.01)
   *H10B 12/00* (2023.01)
   *H01L 21/8258* (2006.01)
   *H01L 27/06* (2006.01)
(52) U.S. Cl.
   CPC .. *H01L 29/66969* (2013.01); *H01L 29/78648* (2013.01); *H01L 29/7869* (2013.01); *H10B 12/05* (2023.02); *H10B 12/30* (2023.02); *H01L 21/8258* (2013.01); *H01L 27/0688* (2013.01); *H01L 27/1207* (2013.01); *H10B 12/033* (2023.02); *H10B 12/315* (2023.02)
(58) Field of Classification Search
   CPC . H01L 21/8258; H01L 27/0688; H10B 12/00; H10B 12/05; H10B 12/30; H10B 12/033; H10B 12/315
   See application file for complete search history.

(56) References Cited

U.S. PATENT DOCUMENTS

| | | | |
|---|---|---|---|
| 9,978,774 B2 | 5/2018 | Yamazaki et al. | |
| 10,032,492 B2 | 7/2018 | Onuki | |
| 10,236,390 B2 | 3/2019 | Yamane et al. | |
| 10,367,005 B2 | 7/2019 | Yamazaki et al. | |
| 10,424,671 B2 | 9/2019 | Yamazaki et al. | |
| 10,475,931 B2 | 11/2019 | Yamazaki | |
| 10,727,356 B2 | 7/2020 | Yamazaki | |
| 2017/0062619 A1* | 3/2017 | Sasagawa | H01L 27/1207 |
| 2017/0278855 A1* | 9/2017 | Liaw | H10B 20/20 |
| 2020/0105883 A1 | 4/2020 | Yamazaki et al. | |
| 2020/0144310 A1 | 5/2020 | Onuki et al. | |
| 2020/0227561 A1 | 7/2020 | Yamazaki | |

FOREIGN PATENT DOCUMENTS

| | | |
|---|---|---|
| CN | 109478514 A | 3/2019 |
| CN | 110462803 A | 11/2019 |
| DE | 112018001745 | 12/2019 |
| JP | 2011-151383 A | 8/2011 |
| JP | 2012-257187 A | 12/2012 |
| JP | 2018-181890 A | 11/2018 |
| JP | 2018-195814 A | 12/2018 |
| KR | 2019-0133024 A | 11/2019 |
| TW | 201822286 | 6/2018 |
| TW | 201901971 | 1/2019 |
| WO | WO-2017/033102 | 3/2017 |
| WO | WO-2017/137864 | 8/2017 |
| WO | WO-2018/020350 | 2/2018 |
| WO | WO-2018/178806 | 10/2018 |
| WO | WO-2018/207048 | 11/2018 |

OTHER PUBLICATIONS

International Search Report (Application No. PCT/IB2020/056149) Dated Oct. 6, 2020.
Written Opinion (Application No. PCT/IB2020/056149) Dated Oct. 6, 2020.
Chinese Office Action (Application No. 202080047776.2) dated Oct. 31, 2024.

* cited by examiner

FIG. 3A
| Amorphous | Intermediate state<br>New crystalline phase<br>Crystalline | Crystal |
|---|---|---|
| •completely amorphous | •CAAC<br>•nc<br>•CAC<br>excluding single crystal and poly crystal | •single crystal<br>•poly crystal |
FIG. 3B
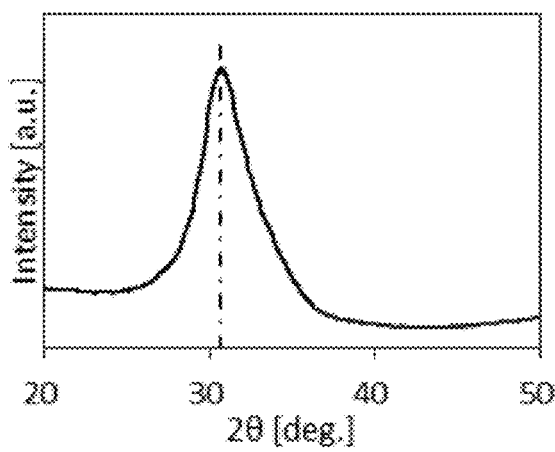
FIG. 3C
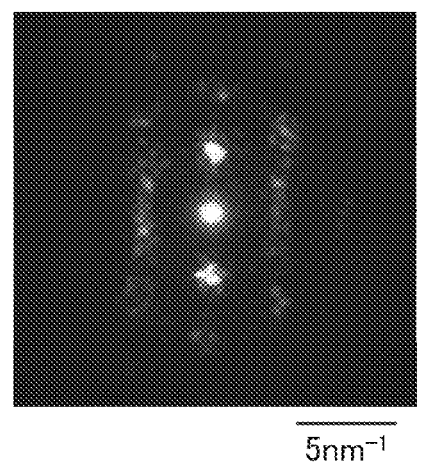

US 12,289,878 B2

SEMICONDUCTOR DEVICE AND METHOD OF MANUFACTURING SEMICONDUCTOR DEVICE

TECHNICAL FIELD

One embodiment of the present invention relates to a transistor, a semiconductor device, and an electronic device. Another embodiment of the present invention relates to a method for manufacturing a semiconductor device. Another embodiment of the present invention relates to a semiconductor wafer and a module.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

In recent years, semiconductor devices have been developed; in particular, an LSI, a CPU, and a memory have been actively developed. A CPU is an aggregation of semiconductor elements each provided with an electrode that is a connection terminal, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is used in a wide range of electronic devices such as an integrated circuit (IC) and an image display device (also simply referred to as a display device). A silicon-based semiconductor material is widely known as a semiconductor thin film applicable to the transistor; in addition, an oxide semiconductor has attracted attention as another material.

It is known that a transistor using an oxide semiconductor has an extremely low leakage current in a non-conduction state. For example, a low-power-consumption CPU utilizing a characteristic of a low leakage current of the transistor using an oxide semiconductor is disclosed (see Patent Document 1). Furthermore, a memory device that can retain stored contents for a long time by utilizing a characteristic of a low leakage current of the transistor using an oxide semiconductor is disclosed, for example (see Patent Document 2).

In recent years, demand for an integrated circuit with higher density has risen with reductions in size and weight of electronic devices. Furthermore, the productivity of a semiconductor device including an integrated circuit is required to be improved.

REFERENCES

Patent Documents

[Patent Document 1] Japanese Published Patent Application No. 2012-257187
[Patent Document 2] Japanese Published Patent Application No. 2011-151383

SUMMARY OF THE INVENTION

Problems to be Solved by the Invention

An object of one embodiment of the present invention is to provide a semiconductor device that can be miniaturized or highly integrated. Another object of one embodiment of the present invention is to provide a semiconductor device with high storage capacity. Another object of one embodiment of the present invention is to provide a semiconductor device in which variation of transistor characteristics is small. Another object of one embodiment of the present invention is to provide a semiconductor device having favorable reliability. Another object of one embodiment of the present invention is to provide a semiconductor device having favorable electrical characteristics. Another object of one embodiment of the present invention is to provide a semiconductor device with a high on-state current. Another object of one embodiment of the present invention is to provide a semiconductor device with low power consumption. Another object of one embodiment of the present invention is to provide a novel semiconductor device.

Note that the description of these objects does not preclude the existence of other objects. One embodiment of the present invention does not have to achieve all these objects. Other objects will be apparent from the description of the specification, the drawings, the claims, and the like, and other objects can be derived from the description of the specification, the drawings, the claims, and the like.

Means for Solving the Problems

One embodiment of the present invention is a semiconductor device including a first conductor positioned over a substrate; an oxide positioned in contact with a top surface of the first conductor; a second conductor, a third conductor, and a fourth conductor positioned over the oxide; a first insulator in which a first opening and a second opening are formed, the first insulator being positioned over the second conductor to the fourth conductor; a second insulator positioned in the first opening; a fifth conductor positioned over the second insulator; a third insulator positioned in the second opening; and a sixth conductor positioned over the third insulator. The third conductor is positioned to overlap with the first conductor. The first opening is formed to overlap with a region between the second conductor and the third conductor. The second opening is formed to overlap with a region between the third conductor and the fourth conductor.

In the above, a first capacitor and a second capacitor may be included, the first capacitor may be electrically connected to the second conductor, and the second capacitor may be electrically connected to the fourth conductor. In the above, the first capacitor is preferably positioned over the second conductor and the second capacitor is preferably positioned over the fourth conductor.

In the above, the first conductor is preferably connected to a wiring provided below the first conductor. In the above, the second insulator is preferably in contact with a top surface of the oxide and a side surface of the first insulator, and the third insulator is in contact with the top surface of the oxide and the side surface of the first insulator.

In the above, the oxide preferably includes a first oxide and a second oxide over the first oxide, the first oxide and the second oxide each include indium, an element M (M is one or more selected from gallium, aluminum, yttrium, and tin), and zinc, and an atomic ratio of indium to the element M in the first oxide is preferably lower than an atomic ratio of indium to the element M in the second oxide.

Another embodiment of the present invention is a method of manufacturing a semiconductor device, including the steps of: forming a first conductor over a substrate; depositing an oxide film in contact with a top surface of the first conductor; depositing a first conductive film over the oxide film; forming an oxide and a second conductor by processing the oxide film and the first conductive film into an island shape; forming a first insulator covering the oxide and the second conductor; removing parts of the second conductor that overlap with the first opening and the second opening to form a third conductor, a fourth conductor, and a fifth conductor, the fourth conductor being positioned to overlap with the first conductor; exposing regions of the oxide that do not overlap with the third to fifth conductors; depositing a first insulating film in contact with a top surface of the oxide; performing microwave treatment in an atmosphere including oxygen; depositing a second conductive film over the first insulating film; and forming a second insulator and a sixth conductor in the first opening and forming a third insulator and a seventh conductor in the second opening by performing CMP treatment on the first insulating film and the second conductive film until a top surface of the first insulator is exposed.

Effect of the Invention

One embodiment of the present invention can provide a semiconductor device that can be miniaturized or highly integrated. Another embodiment of the present invention can provide a semiconductor device with high storage capacity. Another embodiment of the present invention can provide a semiconductor device in which variation of transistor characteristics is small. Another embodiment of the present invention can provide a semiconductor device with favorable reliability. Another embodiment of the present invention can provide a semiconductor device having favorable electrical characteristics. Another embodiment of the present invention can provide a semiconductor device with a high on-state current. Another embodiment of the present invention can provide a semiconductor device that can be miniaturized or highly integrated. Another embodiment of the present invention can provide a semiconductor device with low power consumption. Another embodiment of the present invention can provide a novel semiconductor device.

Note that the description of these effects does not preclude the existence of other effects. One embodiment of the present invention does not have to have all these effects. Note that effects other than these will be apparent from the description of the specification, the drawings, the claims, and the like and effects other than these can be derived from the description of the specification, the drawings, the claims, and the like.

BRIEF DESCRIPTION OF THE DRAWINGS

FIG. 3A is a table showing classifications of crystal structures of IGZO. FIG. 3B is a graph showing an XRD spectrum of a CAAC-IGZO film. FIG. 3C is an image showing a nanobeam electron diffraction pattern of the CAAC-IGZO film.

MODE FOR CARRYING OUT THE INVENTION

Figure 1A:
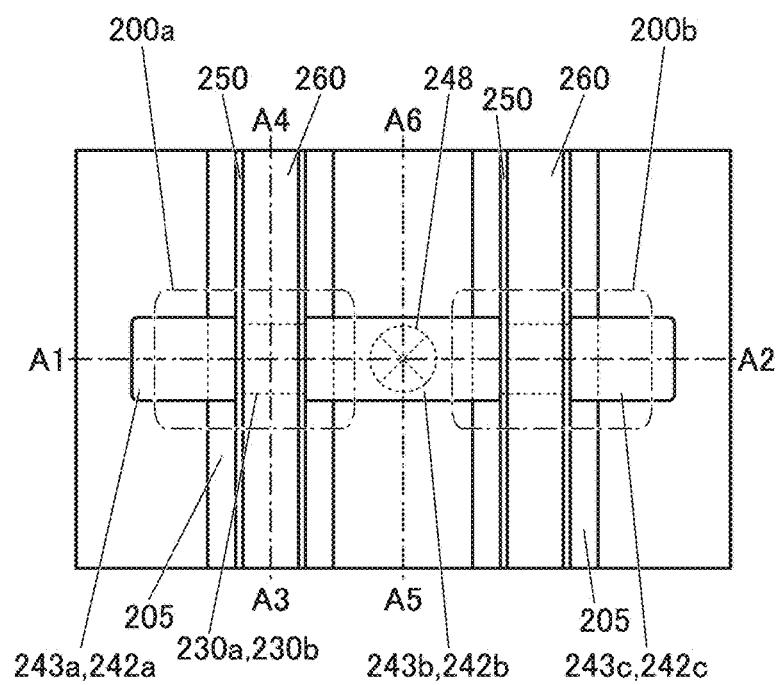
FIG. 1A, FIG. 1B, FIG. 1C, and FIG. 1D are a top view and cross-sectional views of a semiconductor device of one embodiment of the present invention.

Hereinafter, embodiments will be described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which might not be reflected in the drawings for easy understanding of the invention. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. In addition, some hidden lines and the like might not be shown.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not sometimes correspond to the ordinal numbers that are used to specify one embodiment of the present invention.

In this specification and the like, terms for describing arrangement, such as "over" and "under", are used for convenience to describe the positional relation between components with reference to drawings. The positional relation between components is changed as appropriate in accordance with a direction in which the components are described. Thus, without limitation to terms described in this specification, the description can be changed appropriately depending on the situation.

For example, when this specification and the like explicitly state that X and Y are connected, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, a connection relation other than one shown in drawings or text is regarded as being disclosed in the drawings or the text. Here, X and Y each denote an object (e.g., a device, an element, a circuit, a wiring, an electrode, a terminal, a conductive film, or a layer).

In this specification and the like, a transistor is an element having at least three terminals including a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which a current mainly flows.

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, and the average value in a channel formation region.

The channel width refers to, for example, the length of a channel formation region in a direction perpendicular to a channel length direction in a region where a semiconductor (or a portion where current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, and the average value in a channel formation region.

Note that in this specification and the like, depending on the transistor structure, a channel width in a region where a channel is actually formed (hereinafter also referred to as an "effective channel width") is sometimes different from a channel width shown in a top view of a transistor (hereinafter also referred to as an "apparent channel width"). For example, in a transistor whose gate electrode covers a side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. Note that water also serves as an impurity in some cases. In addition, oxygen vacancies (also referred to as $V_O$) are formed in an oxide semiconductor in some cases by entry of impurities, for example.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included.

Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Furthermore, "substantially perpendicular" indicates a state where two straight lines are placed at an angle greater than or equal to 60° and less than or equal to 120°.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

In this specification and the like, "normally off" means that a drain current per micrometer of channel width flowing through a transistor when no potential is applied to a gate or the gate is supplied with a ground potential is $1\times10^{-20}$ A or lower at room temperature, $1\times10^{-18}$ A or lower at 85° C., or $1\times10^{-16}$ A or lower at 125° C.

Embodiment 1

In this embodiment, an example of a semiconductor device including a transistor 200a and a transistor 200b of one embodiment of the present invention and a manufacturing method thereof are described using FIG. 1 to FIG. 17. In the following description, the transistor 200a and the transistor 200b are collectively referred to as a transistor 200, in some cases.

<Structure Example of Semiconductor Device>

Figure 1C:
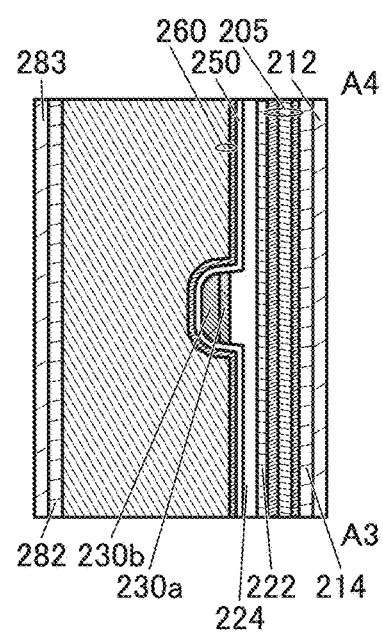
Figure 1B:
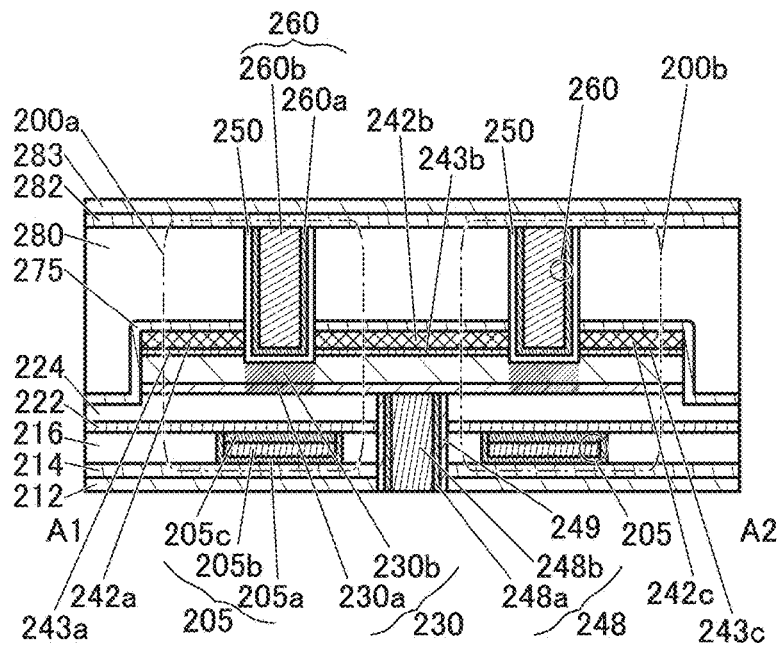
Figure 1D:
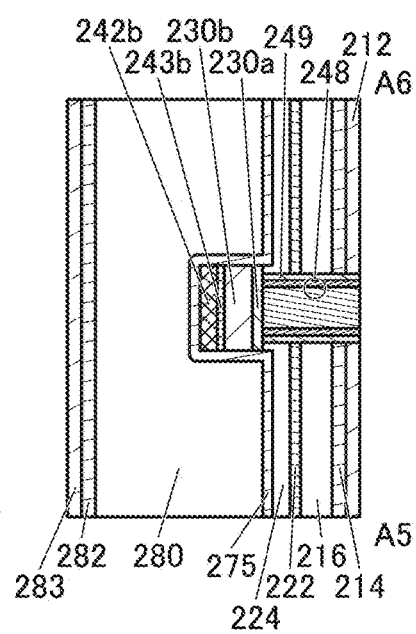

A structure of the semiconductor device including the transistor 200a and the transistor 200b is described using FIG. 1A to FIG. 1D. FIG. 1A is a top view of the semiconductor device. FIG. 1B to FIG. 1D are cross-sectional views of the semiconductor device. Here, FIG. 1B is a cross-sectional view of a portion indicated by a dashed-dotted line A1-A2 in FIG. 1A and also is a cross-sectional view of the transistor 200a and the transistor 200b in the channel length direction. FIG. 1C is a cross-sectional view of a portion indicated by the dashed-dotted line A3-A4 in FIG. 1A, and is also a cross-sectional view of the transistor 200a in the channel width direction. FIG. 1D is a cross-sectional view of a portion indicated by the dashed-dotted line A5-A6 in FIG. 1A. Note that for clarity of the drawing, some components are not shown in the top view of FIG. 1A.

The semiconductor device of one embodiment of the present invention includes an insulator 212 over a substrate (not shown), an insulator 214 over the insulator 212, the transistor 200 over the insulator 214, an insulator 280 over the transistor 200, an insulator 282 over the insulator 280, and an insulator 283 over the insulator 282. The insulator 212, the insulator 214, the insulator 280, the insulator 282, and the insulator 283 function as interlayer films. A conductor 248 (a conductor 248a and a conductor 248b) is provided to be embedded in the insulator 212 and the insulator 214 and between the transistor 200a and the transistor 200b. The conductor 248 is electrically connected to the transistor 200a and the transistor 200b and functions as a plug. Note that an insulator 249 is preferably provided in contact with a side surface of the conductor 248 functioning as a plug.

[Transistor 200]

As illustrated in FIG. 1A to FIG. 1D, the transistor 200a includes an insulator 216 over the insulator 214; a conductor 205 (a conductor 205a, a conductor 205b, and a conductor 205c) positioned to be embedded in the insulator 216; an insulator 222 over the insulator 216 and the conductor 205; an insulator 224 over the insulator 222; an oxide 230a over the insulator 224; an oxide 230b over the oxide 230a; an oxide 243a and an oxide 243b over the oxide 230b; a conductor 242a over the oxide 243a; a conductor 242b over the oxide 243b; an insulator 250 over the oxide 230b; and a conductor 260 (a conductor 260a and a conductor 260b) that is positioned over the insulator 250 and overlaps with part of the oxide 230b.

As illustrated in FIG. 1A to FIG. 1D, the transistor 200b includes the insulator 216 over the insulator 214; the conductor 205 positioned to be embedded in the insulator 214 or the insulator 216; the insulator 222 over the insulator 216 and the conductor 205; the insulator 224 over the insulator 222; the oxide 230a over the insulator 224; the oxide 230b over the oxide 230a; the oxide 243b and the oxide 243c over the oxide 230b; the conductor 242b over the oxide 243b; the conductor 242c over the oxide 243c; the insulator 250 over the oxide 230b; and the conductor 260 that is positioned over the insulator 250 and overlaps with part of the oxide 230b.

Hereinafter, the oxide 230a and the oxide 230b are collectively referred to as an oxide 230 in some cases. The oxide 243a, the oxide 243b, and the oxide 243c are sometimes collectively referred to as an oxide 243. The conductor 242a, the conductor 242b, and the conductor 242c are sometimes collectively referred to as a conductor 242.

An insulator 275 is provided to cover the insulator 224, the oxide 230, the oxide 243, and the conductor 242. As illustrated in FIG. 1B and FIG. 1C, a top surface of the conductor 260 is positioned to be substantially aligned with a top surface of the insulator 250 and a top surface of the insulator 280. The insulator 282 is in contact with the top surfaces of the conductor 260 and the insulator 280 and the uppermost portion of the insulator 250.

Here, as illustrated in FIG. 1A to FIG. 1D, the transistor 200b is provided opposite the transistor 200a with the conductor 248 interposed therebetween, and has a structure similar to that of the transistor 200a except for the conductor 242 and the oxide 243.

The insulator 212, the insulator 214, the insulator 216, the insulator 222, the insulator 224, the oxide 230a, the oxide 230b, the insulator 275, the insulator 280, the insulator 282, and the insulator 283 are common to the transistor 200a and the transistor 200b. By contrast, the conductor 205, the insulator 250, and the conductor 260 are provided in each of the transistor 200a and the transistor 200b. Each of the conductor 205, the insulator 250, and the conductor 260 in the transistor 200b has a structure similar to that in the transistor 200a and thus is denoted by a common reference numeral.

Over the oxide 230, the conductor 242a to the conductor 242c and the oxide 243a to the oxide 243c are arranged linearly in the channel length direction (A1-A2 direction). Here, the conductor 242b is positioned to overlap with the conductor 248. In addition, an opening overlapping with a region between the conductor 242a and the conductor 242b and an opening overlapping with a region between the conductor 242b and the conductor 242c are provided. In each opening, the insulator 250 and the conductor 260 positioned over the insulator 250 are provided.

The insulator 250 and the conductor 260 are positioned in the two openings provided in the insulator 280 and the insulator 275, which reach the oxide 230b. Specifically, in the transistor 200a, the insulator 250 is provided in contact with a top surface of the oxide 230b, side surfaces of the oxide 243a and the oxide 243b, side surfaces of the conductor 242a and the conductor 242b, a side surface of the insulator 275, and a side surface of the insulator 280. In the transistor 200b, the insulator 250 is provided in contact with a top surface of the oxide 230b, side surfaces of the oxide 243b and the oxide 243c, side surfaces of the conductor 242b and the conductor 242c, a side surface of the insulator 275, and a side surface of the insulator 280. In each of the transistor 200a and the transistor 200b, the conductor 260 is provided in contact with the top surface and a side surface of the insulator 250.

In each of the transistor 200a and the transistor 200b, the conductor 260 functions as a first gate (also referred to as a top gate) electrode, and the conductor 205 functions as a second gate (also referred to as a back gate) electrode. In each of the transistor 200a and the transistor 200b, the insulator 250 functions as a first gate insulator and the insulator 222 and the insulator 224 function as second gate insulators.

The conductor 242a functions as one of a source and a drain of the transistor 200a. The conductor 242b functions as the other of the source and the drain of the transistor 200a and one of a source and a drain of the transistor 200b. The conductor 242c functions as the other of the source and the drain of the transistor 200b. At least part of the region of the oxide 230 overlapping with the conductor 260 functions as a channel formation region of the transistor 200a or the transistor 200b.

Figure 2:
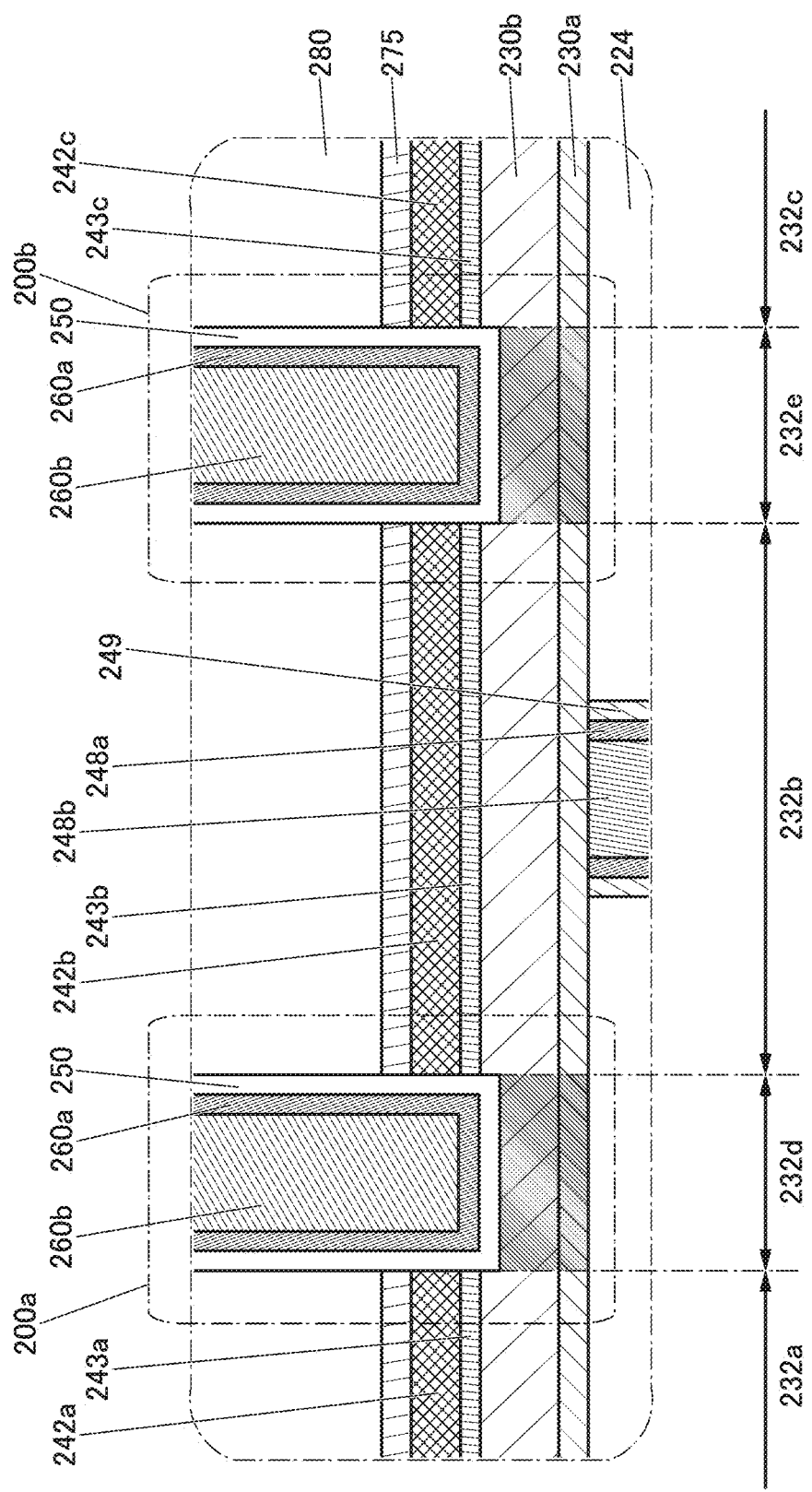
FIG. 2 is a cross-sectional view of a semiconductor device of one embodiment of the present invention.
Figure 4A:
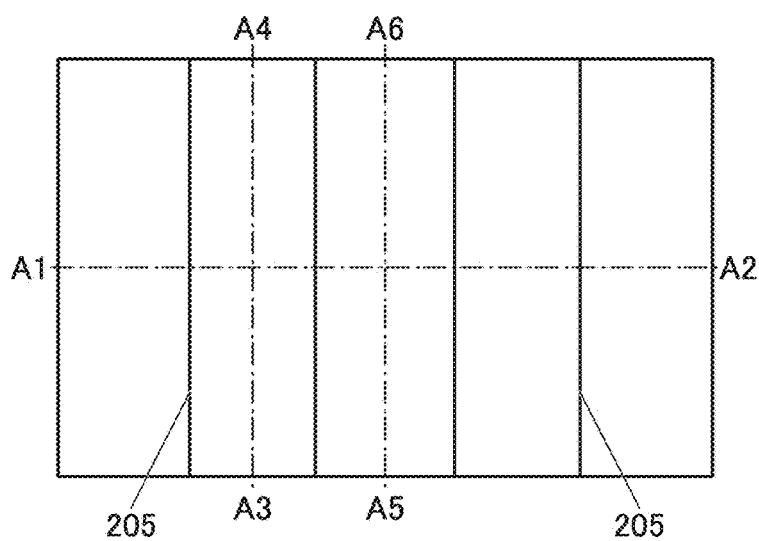
FIG. 4A, FIG. 4B, FIG. 4C, and FIG. 4D are a top view and cross-sectional views illustrating a method of manufacturing a semiconductor device of one embodiment of the present invention.
Figure 4C:
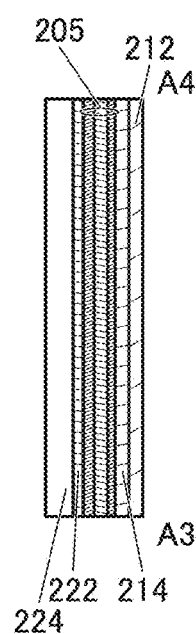
Figure 4B:
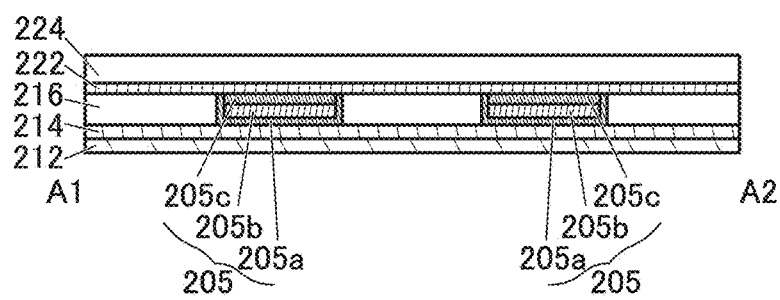
Figure 4D:
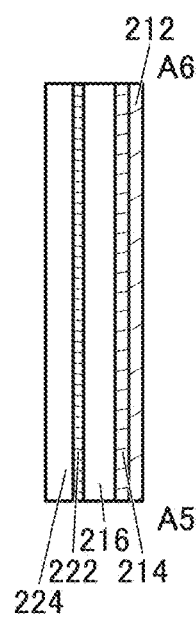
Figure 5A:
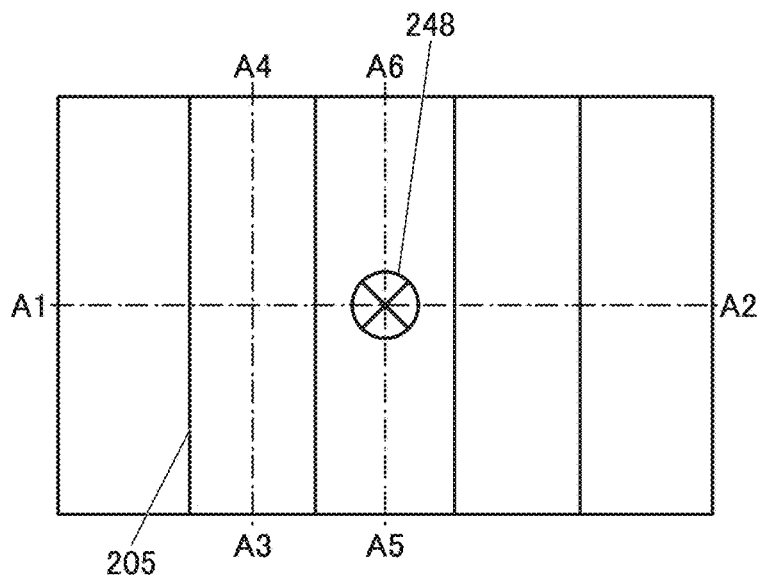
FIG. 5A, FIG. 5B, FIG. 5C, and FIG. 5D are a top view and cross-sectional views illustrating a method of manufacturing a semiconductor device of one embodiment of the present invention.
Figure 5C:
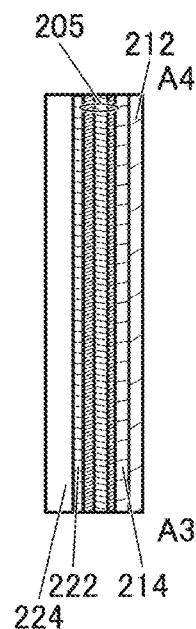
Figure 5B:
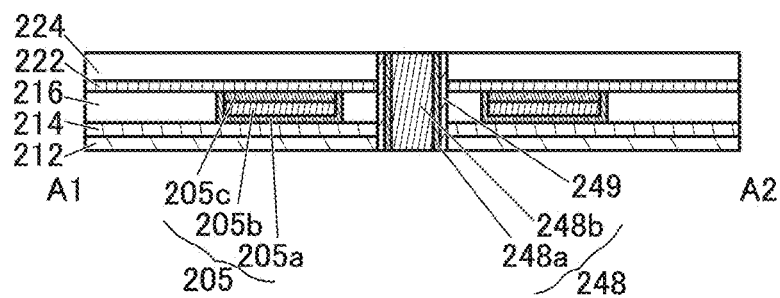
Figure 5D:
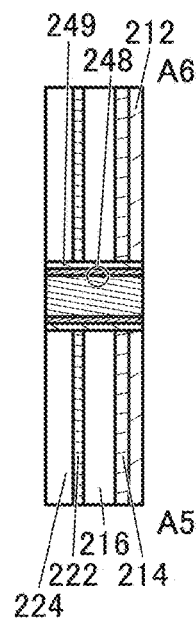
Figure 6A:
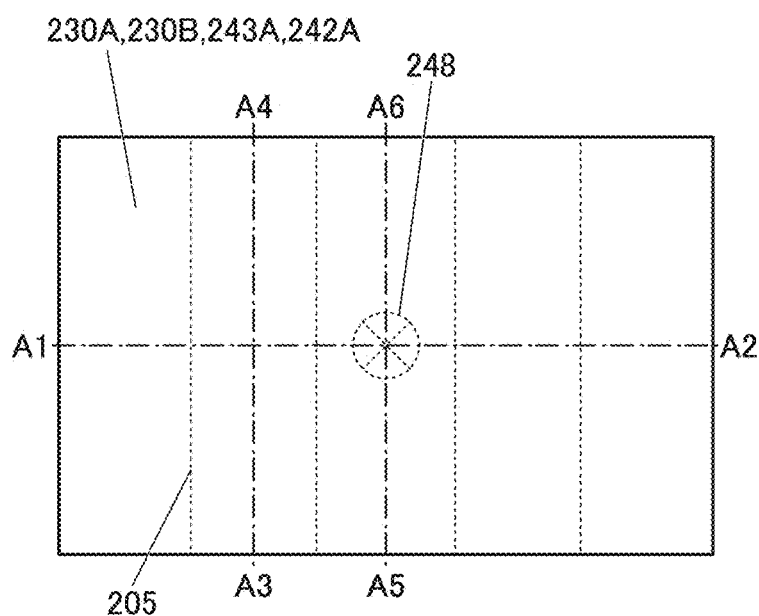
FIG. 6A, FIG. 6B, FIG. 6C, and FIG. 6D are a top view and cross-sectional views illustrating a method of manufacturing a semiconductor device of one embodiment of the present invention.
Figure 6C:
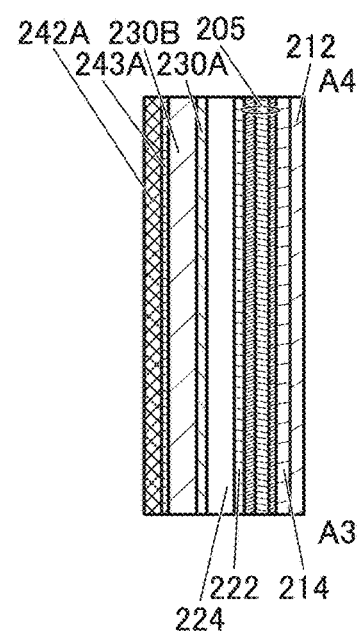
Figure 6B:
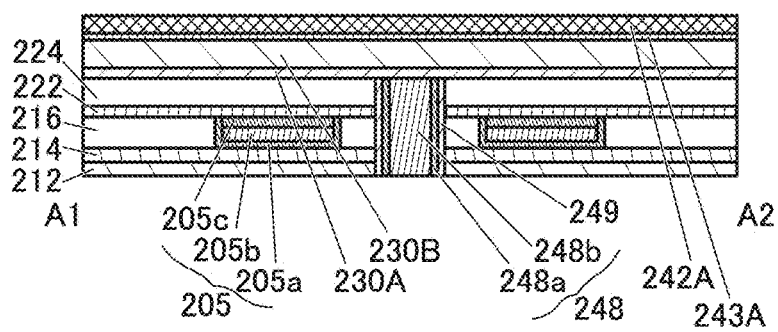
Figure 6D:
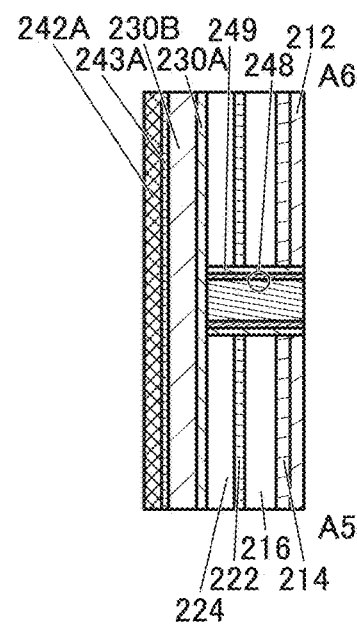
Figure 7A:
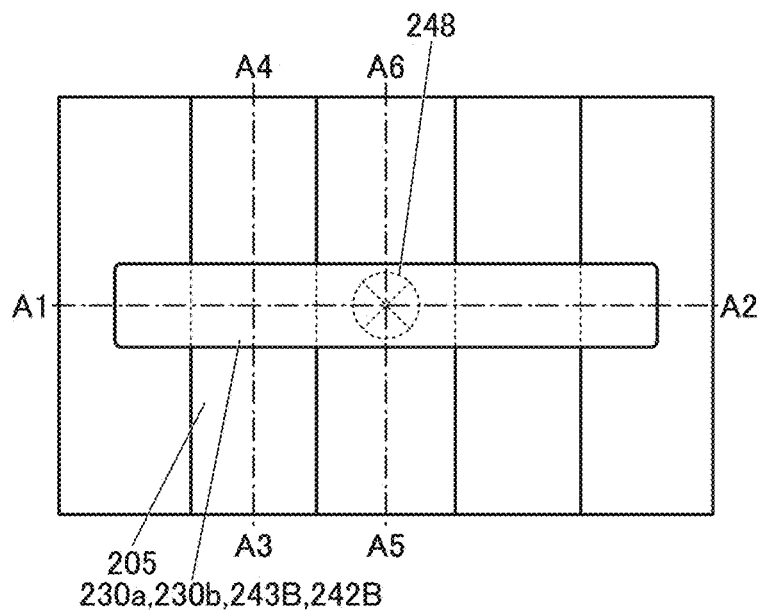
FIG. 7A, FIG. 7B, FIG. 7C, and FIG. 7D are a top view and cross-sectional views illustrating a method of manufacturing a semiconductor device of one embodiment of the present invention.
Figure 7C:
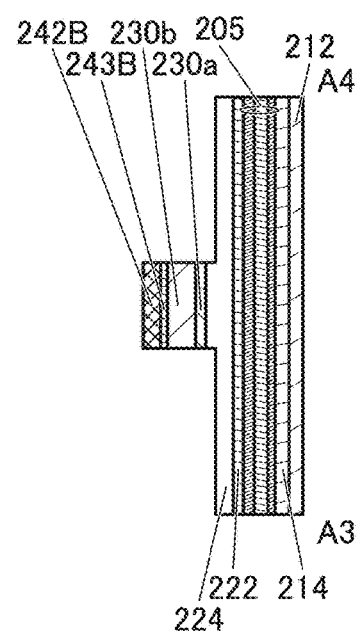
Figure 7B:
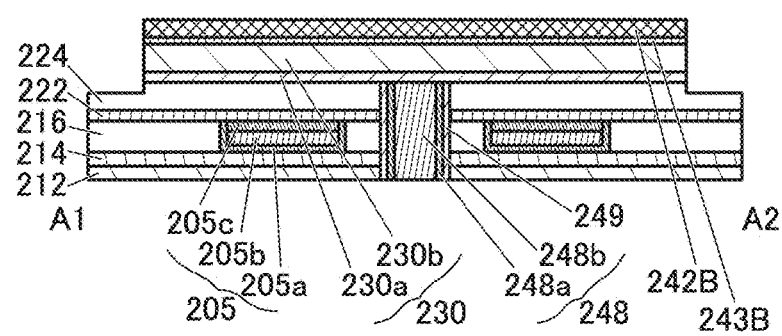
Figure 7D:
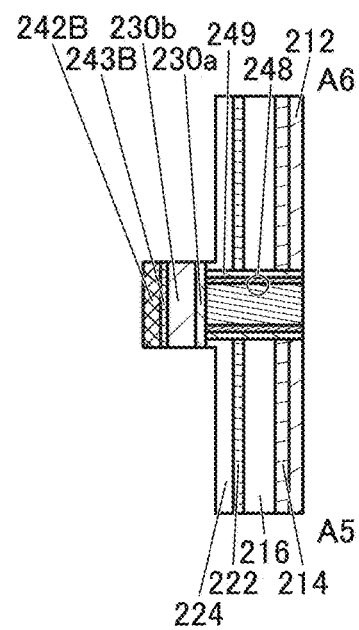
Figure 8A:
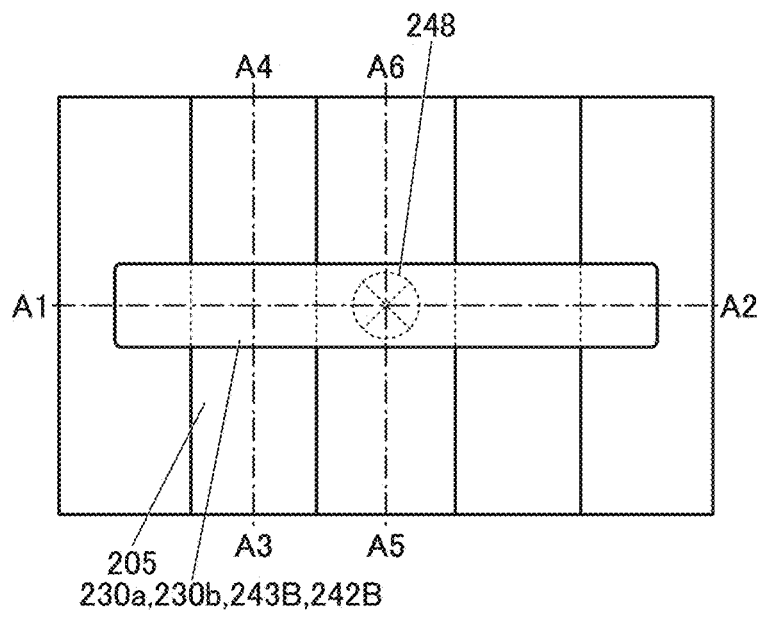
FIG. 8A, FIG. 8B, FIG. 8C, and FIG. 8D are a top view and cross-sectional views illustrating a method of manufacturing a semiconductor device of one embodiment of the present invention.
Figure 8C:
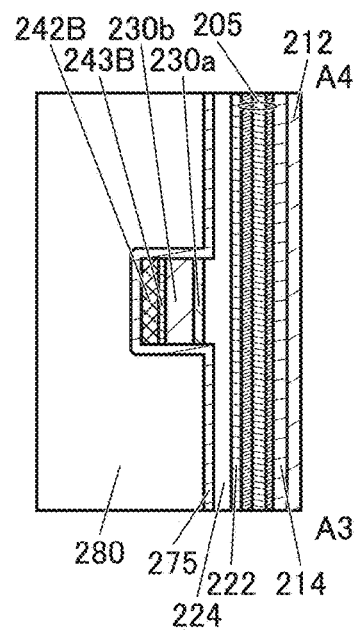
Figure 8B:
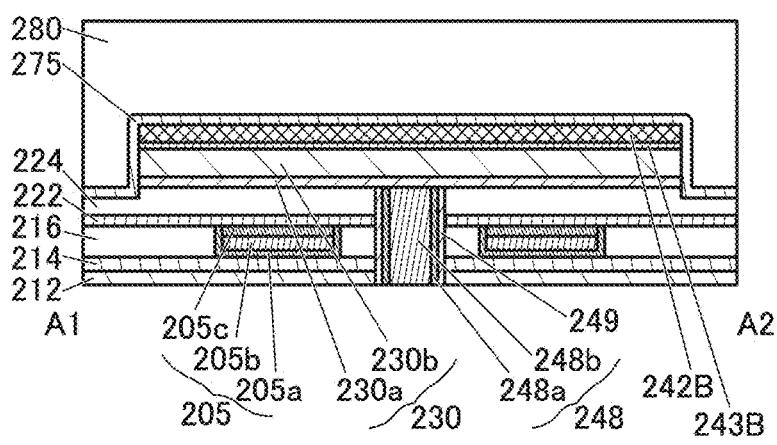
Figure 8D:
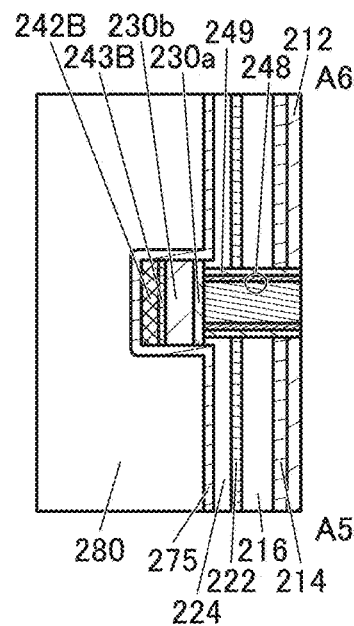
Figure 9A:
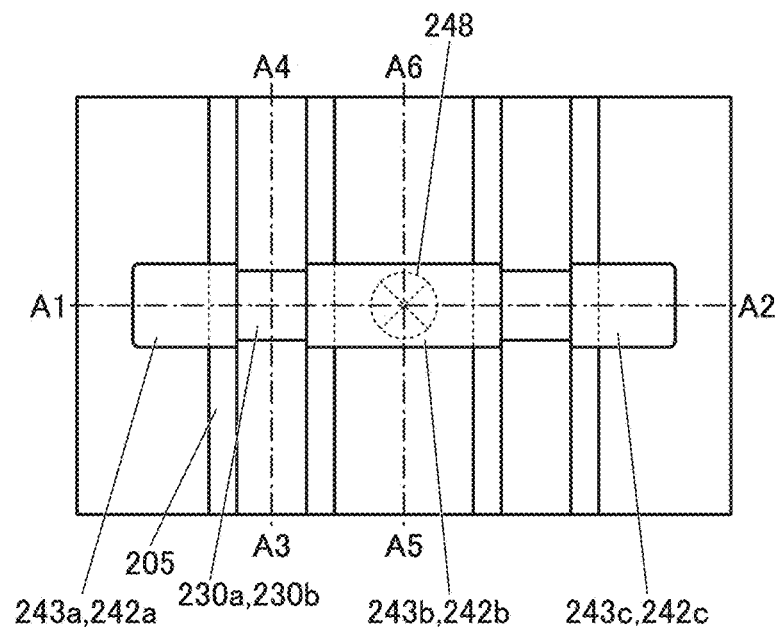
FIG. 9A, FIG. 9B, FIG. 9C, and FIG. 9D are a top view and cross-sectional views illustrating a method of manufacturing a semiconductor device of one embodiment of the present invention.
Figure 9C:
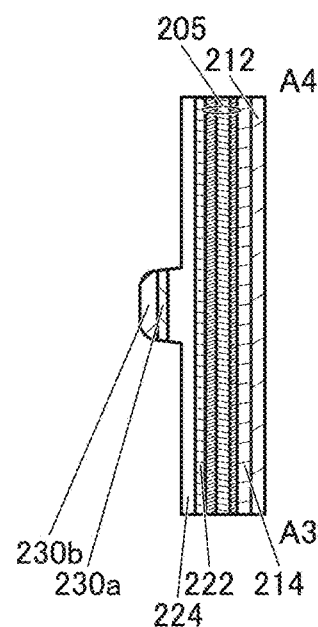
Figure 9B:
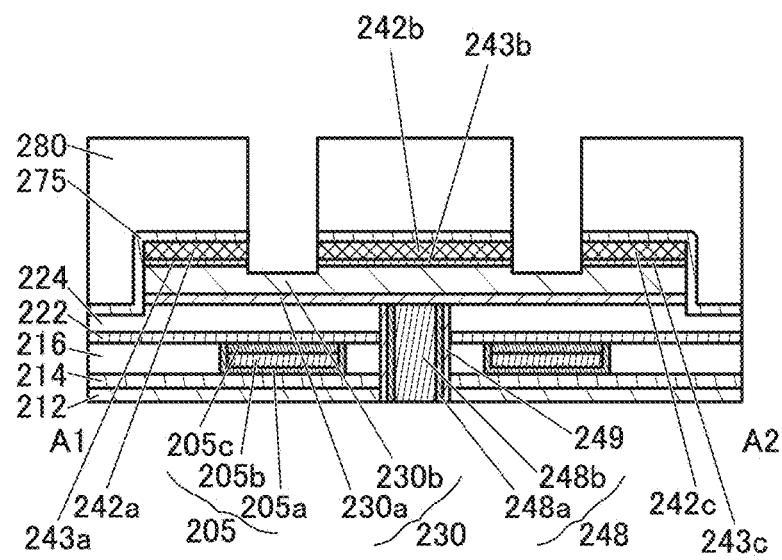
Figure 9D:
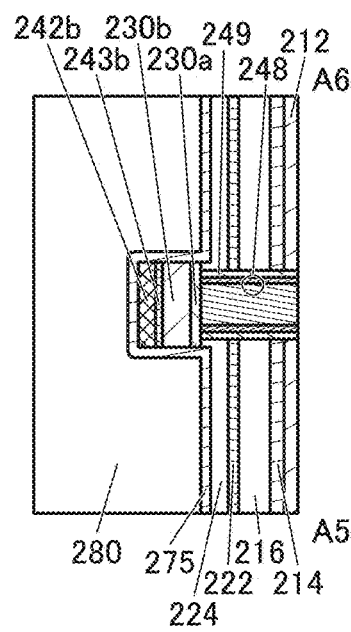

FIG. 2 illustrates an enlarged view of the vicinity of channel formation regions in FIG. 1B. As illustrated in FIG. 2, the oxide 230 includes a region 232d functioning as the channel formation region of the transistor 200a, a region 232a and a region 232b between which the region 232d is interposed and which function as a source region and a drain region of the transistor 200a, a region 232e functioning as the channel formation region of the transistor 200b, and a region 232c which is provided such that the region 232e is interposed between the region 232c and the region 232b and functions as a source region or a drain region of the transistor 200b.

At least parts of the region 232d and the region 232e overlap with the conductor 260. In other words, the region 232d is provided to overlap with the region between the conductor 242a and the conductor 242b and the region 232e is provided to overlap with the region between the conductor 242b and the conductor 242c. The region 232a is provided to overlap with the conductor 242a, the region 232b is provided to overlap with the conductor 242b, and the region 232c is provided to overlap with the conductor 242c.

The region 232d and the region 232e functioning as the channel formation regions have fewer oxygen vacancies or lower impurity concentrations than the region 232a, the region 232b, and the region 232c, and thus are high-resistance regions with low carrier concentrations. Hence, the region 232d and the region 232e can each be regarded as an i-type (intrinsic) or substantially i-type.

Each of the region 232a, the region 232b, and the region 232c functioning as the source region or the drain region has many oxygen vacancies or a high concentration of impurities such as hydrogen, nitrogen, and a metal element, and thus is a region in which the carrier concentration is increased to reduce the resistance. That is, the region 232a, the region 232b, and the region 232c are n-type regions with higher carrier concentration and lower resistance than the region 232d and the region 232e.

The carrier concentration in each of the region 232d and the region 232e functioning as the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, and yet still further preferably lower than $1\times10^{12}$ cm$^{-3}$. The lower limit of the carrier concentration in each of the region 232d and the region 232e functioning as the channel formation region is not particularly limited and can be, for example, $1\times10^{-9}$ cm$^{-3}$.

A region having a carrier concentration lower than or equal to that in the region 232a, the region 232b, and the region 232c and higher than or equal to that in the region 232d and the region 232e may be formed between the region 232d and the region 232a or the region 232b or between the region 232e and the region 232b or the region 232c. Specifically, the region functions as a junction region between the region 232d or the region 232e and the region 232a, the region 232b, or the region 232c. The hydrogen concentration in the junction region is sometimes lower than or equal to that in the region 232a, the region 232b, and the region 232c and higher than or equal to that in the region 232d and the region 232e. In addition, the amount of oxygen vacancies in the junction region is sometimes smaller than or equal to that in the region 232a, the region 232b, or the region 232c and larger than or equal to that in the region 232d and the region 232e.

In the oxide 230, the boundaries between the regions are difficult to clearly observe in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

The region 232b functions as the source region or the drain region of both of the transistor 200a and the transistor 200b and can be regarded as being shared by the transistor 200a and the transistor 200b. Thus, the source and the drain of the transistor 200a and the transistor 200b are connected in series.

In the region 232b, the oxide 230 is in contact with at least part of a top surface of the conductor 248 as illustrated in FIG. 1B and FIG. 1D. Such connection between the region 232b of the oxide 230 and the conductor 248 can reduce electrical resistance between the conductor 248 and the source or the drain of the transistor 200a and the transistor 200b. Since the region 232b is formed to overlap with the conductor 242b, the conductor 242b is positioned to overlap with at least part of the conductor 248.

The conductor 248 is positioned so as to be exposed from a top surface of the insulator 224. For example, the conductor 248 is positioned to be embedded in an opening formed in the insulator 212, the insulator 214, the insulator 216, the insulator 222, and the insulator 224. Preferably, at least part of the top surface of the conductor 248 is exposed from the insulator 224 and the top surface of the conductor 248 is substantially aligned with the top surface of the insulator 224.

The conductor 248 functions as a plug that electrically connects the transistor 200a and the transistor 200b to a wiring, an electrode, a terminal, or a circuit element (such as a switch, a transistor, a capacitor, an inductor, a resistor, or a diode), which is provided below the insulator 212. For example, the conductor 248 is electrically connected to a wiring provided below the insulator 212.

For example, in the case where the transistor 200 is used as a memory cell of a memory device and the memory cell is positioned over a peripheral circuit or the like formed over a substrate, the conductor 248 and a wiring that is provided in contact with the conductor 248 correspond to bit lines and the conductor 260 of the transistor 200 corresponds to a word line. When the conductor 248 is provided below the oxide 230 as illustrated in FIG. 1B and the like, parasitic capacitance generated in the conductor 248 and the conductor 260 can be lower than that when the conductor 248 is provided above the oxide 230. That is, parasitic capacitance generated in the word line and the bit line in the above memory device can be reduced. Furthermore, when the conductor 248 is provided below the oxide 230, the length of the bit line can be shorter than that when the conductor 248 is provided above the oxide 230. Accordingly, the parasitic capacitance generated in the bit line can be reduced.

Thus, in the memory device, such a reduction in the parasitic capacitance in the bit line described above can reduce the design value of electrostatic capacitance that is required for a capacitor in the above memory cell. This can downsize the capacitor, so that the above memory device can be miniaturized or highly integrated.

At least part of a wiring, an electrode, a terminal, or a circuit element (such as a switch, a transistor, a capacitor, an inductor, a resistor, or a diode), which is electrically connected to the conductor 248, preferably overlaps with the oxide 230. This can reduce the area occupied by the transistor 200, the wiring, the electrode, the terminal, or the circuit element described above in a top view, so that the semiconductor device according to this embodiment can be miniaturized or highly integrated.

Although FIG. 1A, FIG. 1B, and FIG. 1D illustrate a structure where the conductor 248 is provided in contact with a bottom surface of the region 232b, the present invention is not limited to this. For example, the conductor 248 may be provided in contact with a bottom surface of the region 232a or the conductor 248 may be provided in contact with a bottom surface of the region 232c.

In the transistor 200, a metal oxide functioning as a semiconductor (hereinafter, also referred to as an oxide semiconductor) is preferably used in the oxide 230 including the channel formation region. The oxide 230 preferably includes the oxide 230a positioned over the insulator 224 and the oxide 230b positioned over the oxide 230a.

The metal oxide functioning as a semiconductor has a band gap of preferably 2 eV or higher, and further preferably 2.5 eV or higher. With use of a metal oxide having such a wide band gap, the off-state current of the transistor can be reduced. With the use of a metal oxide having a wide bandgap, the off-state current of the transistor 200 can be reduced. Such a reduction in the off-state current of the transistor 200 allows stored content to be held for a long time when the transistor 200 is used as a memory cell of a memory device. In other words, the memory device does not require refresh operation or may have an extremely low frequency of the refresh operation, which leads to a sufficient reduction in power consumption of the memory device.

For the oxide 230, for example, a metal oxide such as an In-M-Zn oxide including indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. For example, an In—Ga—Zn oxide is used as the oxide 230, and an oxide obtained by adding tin to an In—Ga—Zn oxide (In—Ga—Zn—Sn oxide) may be used. An In—Ga oxide, an In—Zn oxide, or an indium oxide may be used as the oxide 230.

The above metal oxide can be deposited on a substrate by a sputtering method or the like. Hence, the transistor 200 can be provided to overlap with a peripheral circuit such as a driver circuit formed on a silicon substrate. Thus, when the transistor 200 is used in a memory cell of the memory device, the area occupied by a memory cell array that can be provided in one chip can be increased, resulting in an increase in the storage capacity of the memory device. Furthermore, when a plurality of metal oxide layers are stacked, memory cell arrays can be stacked. As a result, the integration of cells is achieved without an increase in the area occupied by the memory cell array, that is, a stack of memory cell arrays (hereinafter referred to as a 3D cell array) can be configured. A high integration of memory cells is thus possible and a semiconductor device with high storage capacity can be provided.

A semiconductor device using the above metal oxide, especially an In—Ga—Zn oxide, has very high heat resistance because the temperature range in which the semiconductor device can be normally operated is higher than or equal to −40° C. and lower than or equal to 190° C. This heat resistance is higher than the heat resistance of a phase change memory (PCM) (at higher than or equal to −40° C. and lower than or equal to 150° C.), the heat resistance of a resistance random access memory (ReRAM) (higher than or equal to −40° C. and lower than or equal to 125° C.), the heat resistance of a magnetoresistive random access memory (MRAM) (higher than or equal to −40° C. and lower than or equal to 105° C.), or the like.

Here, the atomic ratio of In to the element M in the metal oxide used as the oxide 230b is preferably greater than that in the metal oxide used as the oxide 230a.

When the oxide 230a is positioned under the oxide 230b, impurities and oxygen can be inhibited from diffusing into the oxide 230b from the components formed below the oxide 230a.

The structure of the oxide 230 is not limited to that in which two layers of the oxide 230a and the oxide 230b are stacked. For example, the oxide 230 may have a single-layer structure of the oxide 230b or a stacked-layer structure of three or more layers, or the oxide 230a and the oxide 230b may each have a stacked-layer structure. For example, the oxide 230 may consist of a single layer of the oxide 230b so that the region 232b can be easily formed up to the bottom surface of the oxide 230.

When the oxide 230a and the oxide 230b contain a common element (as the main component) besides oxygen, the density of defect states at an interface between the oxide 230a and the oxide 230b can be low. Since the density of defect states at the interface between the oxide 230a and the oxide 230b can be decreased, the influence of interface scattering on carrier conduction is small, and a high on-state current can be obtained.

The oxide 230b preferably has crystallinity. It is particularly preferable to use a CAAC-OS (c-axis aligned crystalline oxide semiconductor) for the oxide 230b.

The CAAC-OS is a metal oxide having a dense structure with high crystallinity and a small amount of impurities or defects (e.g., oxygen vacancies ($V_O$)). In particular, after the formation of a metal oxide, heat treatment is performed at a temperature at which the metal oxide does not become a polycrystal (e.g., 400° C. to 600° C.), whereby a CAAC-OS having a dense structure with higher crystallinity can be obtained. As the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is unlikely to occur. Thus, a metal oxide including a CAAC-OS is physically stable. Therefore, the metal oxide including a CAAC-OS is resistant to heat and has high reliability.

If impurities and oxygen vacancies exist in a channel formation region of an oxide semiconductor, a transistor including the oxide semiconductor might have variable electrical characteristics and poor reliability. In addition, hydrogen in the vicinity of the oxygen vacancies enters the oxygen vacancies to form a defect (hereinafter, sometimes referred to as $V_O H$), so that an electron serving as a carrier might be generated even when no voltage is applied to a gate electrode of the transistor. Therefore, when the channel formation region in the oxide semiconductor includes oxygen vacancies, the transistor tends to have normally-on characteristics (the channel is generated even when no voltage is applied to the gate electrode and current flows through the transistor). Thus, impurities, oxygen vacancies, and $V_O H$ are preferably reduced as much as possible in the channel formation region in the oxide semiconductor. In other words, the channel formation region in the oxide semiconductor preferably has a reduced carrier concentration to be an i-type (intrinsic) or substantially i-type region when no voltage is applied to the gate electrode of the transistor.

By contrast, when an insulator containing oxygen that is released by heating (hereinafter referred to as excess oxygen in some cases) is provided in the vicinity of the oxide semiconductor and heat treatment is performed, oxygen can be supplied from the insulator to the oxide semiconductor so as to reduce oxygen vacancies and $V_O H$. However, when an excess amount of oxygen is supplied to the source region or the drain region, the on-state current or field-effect mobility of the transistor 200 might be decreased. Furthermore, a variation in the amount of oxygen supplied to the source region or the drain region on the substrate plane leads to variable characteristics of the semiconductor device including the transistor.

Hence, the region 232d and the region 232e functioning as the channel formation regions in the oxide semiconductor are each preferably an i-type or substantially i-type region with a low carrier concentration, whereas the region 232a, the region 232b, and the region 232c functioning as the source or the drain region are each preferably an n-type region with a high carrier concentration. That is, it is preferable that in the oxide semiconductor, oxygen vacancies and $V_O H$ in the region 232d and the region 232e be reduced and supply of too much oxygen to the region 232a, the region 232b, and the region 232c be prevented.

In this embodiment, in the state where the conductor 242a, the conductor 242b, and the conductor 242c are provided over the oxide 230b, microwave treatment is performed in an atmosphere containing oxygen, thereby reducing oxygen vacancies and $V_O H$ in the region 232d and the region 232e. Here, the microwave treatment refers to, for example, treatment using an apparatus including a power source that generates high-density plasma with the use of a microwave.

The microwave treatment in an atmosphere containing oxygen converts oxygen gas into plasma using a microwave or a high-frequency wave such as RF and activates the oxygen plasma. At this time, the region 232d and the region 232e can be irradiated with the microwave or the high-frequency wave such as RF. The effect of the plasma, the microwave, and the like enables $V_OH$ in the region 232d and the region 232e to be cut off, hydrogen H to be removed from the region 232d and the region 232e, and oxygen vacancies $V_O$ to be compensated with oxygen. That is, the reaction "$V_OH \rightarrow H+V_O$" occurs in the region 232d and the region 232e, so that the hydrogen concentration in the region 232d and the region 232e can be reduced. As a result, oxygen vacancies and $V_OH$ in the region 232d and the region 232e can be reduced to lower the carrier concentration.

In the microwave treatment in an atmosphere containing oxygen, the microwave, the high-frequency wave such as RF, the oxygen plasma, or the like is blocked by the conductor 242a, the conductor 242b, and the conductor 242c and does not affect the region 232a, the region 232b, and the region 232c. Furthermore, the effect of the oxygen plasma can be reduced by the insulator 275 and the insulator 280 which are provided to cover the oxide 230b and the conductor 242. Hence, a reduction in $V_OH$ and supply of an excess amount of oxygen do not occur in the region 232a, the region 232b, and the region 232c in the microwave treatment, preventing a decrease in carrier concentration.

In the above manner, oxygen vacancies and $V_OH$ can be selectively removed from the region 232d and the region 232e in the oxide semiconductor, whereby the region 232d and the region 232e can be an i-type or substantially i-type region. Furthermore, supply of too much oxygen to the region 232a, the region 232b, and the region 232c functioning as the source or the drain region can be inhibited and the n-type region can be maintained. As a result, change in the electrical characteristics of the transistor 200 can be inhibited, and thus variation in the electrical characteristics of the transistors 200 in the substrate plane can be inhibited. When the region 232b becomes an n-type region with low resistance, favorable contact can be formed with the conductor 248.

With the structure above, the semiconductor device with a small variation in transistor characteristics can be provided. A semiconductor device having favorable electrical characteristics can be provided. A highly reliable semiconductor device can be provided.

FIG. 1 and the like show the structure in which the side surface of the opening in which the conductor 260 and the like are embedded is substantially perpendicular to the formation surface of the oxide 230b including a groove portion of the oxide 230b; however, this embodiment is not limited thereto. For example, the opening may have a U-shape with a bottom portion having a moderate curve. For example, the side surface of the opening may be tilted with respect to the formation surface of the oxide 230b.

As shown in FIG. 1C, a curved surface may be provided between the side surface of the oxide 230b and the top surface of the oxide 230b in a cross-sectional view in the channel width direction of the transistor 200. That is, an end portion of the side surface and an end portion of the top surface may be curved (such a shape is hereinafter also referred to as a rounded shape).

The radius of curvature of the curved surface is preferably greater than 0 nm and less than the thickness of the oxide 230b in a region overlapping with the conductor 242, or less than half of the length of a region that does not have the curved surface. Specifically, the radius of curvature of the curved surface is greater than 0 nm and less than or equal to 20 nm, preferably greater than or equal to 1 nm and less than or equal to 15 nm, and further preferably greater than or equal to 2 nm and less than or equal to 10 nm. Such a shape can improve the coverage of the oxide 230b with the insulator 250 and the conductor 260.

The oxide 230 preferably has a stacked-layer structure of a plurality of oxide layers with different chemical compositions. Specifically, the atomic ratio of the element M to the metal element of the main component in the metal oxide used for the oxide 230a is preferably greater than the atomic ratio of the element M to the metal element of the main component in the metal oxide used for the oxide 230b. Moreover, the atomic ratio of the element M to In in the metal oxide used for the oxide 230a is preferably greater than the atomic ratio of the element M to In in the metal oxide used for the oxide 230b. Furthermore, the atomic ratio of In to the element M in the metal oxide used for the oxide 230b is preferably greater than the atomic ratio of In to the element M in the metal oxide used for the oxide 230a.

The oxide 230b is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 230b by the source electrode or the drain electrode. This can reduce oxygen extraction from the oxide 230b even when heat treatment is performed; thus, the transistor 200 is stable with respect to high temperatures in a manufacturing process (what is called thermal budget).

Here, the conduction band minimum gradually changes at a junction portion of the oxide 230a and the oxide 230b. In other words, the conduction band minimum at the junction portion of the oxide 230a and the oxide 230b continuously changes or is continuously connected. To obtain this, the density of defect states in a mixed layer formed at the interface between the oxide 230a and the oxide 230b is preferably decreased.

Specifically, when the oxide 230a and the oxide 230b contain the same element as a main component in addition to oxygen, a mixed layer with a low density of defect states can be formed. For example, in the case where the oxide 230b is an In-M-Zn oxide, an In-M-Zn oxide, an M-Zn oxide, an oxide of the element M, an In—Zn oxide, indium oxide, or the like may be used for the oxide 230a.

Specifically, for the oxide 230a, a metal oxide with In:M:Zn=1:3:4 [atomic ratio] or a composition in the neighborhood thereof, or In:M:Zn=1:1:0.5 [atomic ratio] or a composition in the neighborhood thereof is used. For the oxide 230b, a metal oxide with In:M:Zn=1:1:1 [atomic ratio] or a composition in the neighborhood thereof, or In:M:Zn=4:2:3 [atomic ratio] or a composition in the neighborhood thereof is used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

When the oxide 230a and the oxide 230b have the above structure, the density of defect states at the interface between the oxide 230a and the oxide 230b can be made low. Thus, the influence of interface scattering on carrier conduction is small, and the transistor 200 can have a high on-state current and excellent frequency characteristics.

At least one of the insulator 212, the insulator 214, the insulator 275, the insulator 282, and the insulator 283 preferably functions as a barrier insulating film, which inhibits diffusion of impurities such as water and hydrogen from the substrate side or above the transistor 200 into the transistor 200. Thus, for at least one of the insulator 212, the insulator 214, the insulator 275, the insulator 282, and the insulator 283, an insulating material which has a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (through which the impurities are less likely to pass) is preferably used. Alternatively, it is preferable to use an insulating material which has a function of inhibiting diffusion of oxygen (e.g., at least one of an oxygen atom, an oxygen molecule, and the like) (through which the above oxygen is less likely to pass).

Note that in this specification, a barrier insulating film refers to an insulating film having a barrier property. A barrier property in this specification means a function of inhibiting diffusion of a targeted substance (also referred to as having lower permeability). Alternatively, a barrier property in this specification means a function of capturing or fixing (also referred to as gettering) a targeted substance.

Aluminum oxide, magnesium oxide, hafnium oxide, gallium oxide, indium gallium zinc oxide, silicon nitride, or silicon nitride oxide can be used for the insulator 212, the insulator 214, the insulator 275, the insulator 282, and the insulator 283, for example. For example, silicon nitride, which has a higher hydrogen barrier property, is preferably used for the insulator 212 and the insulator 283. For example, aluminum oxide or the like, which has a function of capturing or fixing more hydrogen, is preferably used for the insulator 214, the insulator 275, and the insulator 282. In this case, impurities such as water and hydrogen can be inhibited from diffusing to the transistor 200 side from the substrate side through the insulator 212 and the insulator 214. Impurities such as water or hydrogen can be inhibited from diffusing to the transistor 200 side from an interlayer insulating film and the like which are provided outside the insulator 283. Alternatively, oxygen contained in the insulator 224 or the like can be inhibited from diffusing to the substrate side through the insulator 212 and the insulator 214. Alternatively, oxygen contained in the insulator 280 and the like can be inhibited from diffusing to the components above the transistor 200 through the insulator 282 and the like. In this manner, it is preferable that the transistor 200 be surrounded with the insulator 212, the insulator 214, the insulator 275, the insulator 282, and the insulator 283, which have a function of inhibiting diffusion of oxygen and impurities such as water and hydrogen.

The insulator 212, the insulator 214, the insulator 275, the insulator 282, and the insulator 283 can be formed by a sputtering method, for example. Since a sputtering method does not need to use hydrogen as a deposition gas, the hydrogen concentrations in the insulator 212, the insulator 214, the insulator 275, the insulator 282, and the insulator 283 can be reduced. The deposition method is not limited to a sputtering method; a chemical vapor deposition (CVD) method, a molecular beam epitaxy (MBE) method, a pulsed laser deposition (PLD) method, an atomic layer deposition (ALD) method, or the like can be used as appropriate.

The resistivities of the insulator 212 and the insulator 283 are preferably low in some cases. For example, by setting the resistivities of the insulator 212 and the insulator 283 to approximately $1 \times 10^{13}$ Ωcm, the insulator 212 and the insulator 283 can sometimes reduce charge up of the conductor 205, the conductor 242, or the conductor 260 in treatment using plasma or the like in the manufacturing process of a semiconductor device. The resistivities of the insulator 212 and the insulator 283 are preferably higher than or equal to $1 \times 10^{10}$ Ωcm and lower than or equal to $1 \times 10^{15}$ Ωcm.

The insulator 216 and the insulator 280 preferably have a lower permittivity than the insulator 214. When a material with a low permittivity is used for an interlayer film, parasitic capacitance generated between wirings can be reduced. For the insulator 216 and the insulator 280, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

In the transistor 200a and the transistor 200b, the conductor 205 is positioned to overlap with the oxide 230 and the conductor 260. As illustrated in FIG. 1A, the conductor 205 can be provided to extend in the A3-A4 direction. The conductor 205 is preferably provided to fill the opening formed in the insulator 216. Note that part of the conductor 205 may be provided to be embedded in the insulator 214.

The conductor 205 includes the conductor 205a, the conductor 205b, and the conductor 205c. The conductor 205a is provided in contact with the bottom surface and the side wall of the opening. The conductor 205b is provided to be embedded in a recessed portion formed in the conductor 205a. Here, the level of the top surface of the conductor 205b is lower than the levels of the top surface of the conductor 205a and the top surface of the insulator 216. The conductor 205c is provided in contact with the top surface of the conductor 205b and the side surface of the conductor 205a. Here, the top surface of the conductor 205c is substantially level with the top surface of the conductor 205a and the top surface of the insulator 216. That is, the conductor 205b is surrounded by the conductor 205a and the conductor 205c.

Here, for the conductor 205a and the conductor 205c, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 205a and the conductor 205c are formed using a conductive material having a function of inhibiting diffusion of hydrogen, impurities such as hydrogen contained in the conductor 205b can be prevented from diffusing into the oxide 230 through the insulator 224 and the like. When the conductor 205a and the conductor 205c are formed using a conductive material having a function of inhibiting diffusion of oxygen, the conductivity of the conductor 205b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, a single layer or a stacked layer of the above conductive material is used as the conductor 205a and the conductor 205c. For example, titanium nitride is used for the conductor 205a and the conductor 205c.

Moreover, the conductor 205b is preferably formed using a conductive material containing tungsten, copper, or aluminum as its main component. For example, tungsten is used for the conductor 205b.

The conductor 205 sometimes functions as a second gate electrode. In that case, by changing a potential applied to the conductor 205 not in conjunction with but independently of a potential applied to the conductor 260, the threshold voltage (Vth) of the transistor 200 can be controlled. In particular, by applying a negative potential to the conductor 205, Vth of the transistor 200 can be further increased, and the off-state current can be reduced. Thus, a drain current at the time when a potential applied to the conductor 260 is 0 V can be lower in the case where a negative potential is applied to the conductor 205 than in the case where the negative potential is not applied to the conductor 205.

The electric resistivity of the conductor 205 is designed in consideration of the potential applied to the conductor 205, and the thickness of the conductor 205 is determined in accordance with the electric resistivity. The thickness of the insulator 216 is substantially equal to that of the conductor 205. The conductor 205 and the insulator 216 are preferably as thin as possible in the allowable range of the design of the conductor 205. When the thickness of the insulator 216 is reduced, the absolute amount of impurity such as hydrogen contained in the insulator 216 can be reduced, inhibiting the diffusion of the impurity into the oxide 230.

As shown in FIG. 1A, the conductor 205 is preferably provided to be larger than a region of the oxide 230 that does not overlap with the conductor 242a or the conductor 242b. As illustrated in FIG. 1C, it is particularly preferable that the conductor 205 extend to a region outside end portions of the oxide 230a and the oxide 230b that intersect with the channel width direction. That is, the conductor 205 and the conductor 260 preferably overlap with each other with the insulators therebetween on the outer side of the side surface of the oxide 230 in the channel width direction. With this structure, the channel formation region of the oxide 230 can be electrically surrounded by the electric field of the conductor 260 functioning as a first gate electrode and the electric field of the conductor 205 functioning as the second gate electrode. In this specification, a transistor structure in which a channel formation region is electrically surrounded by electric fields of a first gate and a second gate is referred to as a surrounded channel (S-channel) structure.

In this specification and the like, the S-channel structure refers to a transistor structure in which a channel formation region is electrically surrounded by electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is unlikely to occur can be provided.

Furthermore, as shown in FIG. 1C, the conductor 205 is extended to function as a wiring as well. However, without limitation to this structure, a structure where a conductor functioning as a wiring is provided below the conductor 205 may be employed. In addition, the conductor 205 does not necessarily have to be provided in each transistor. For example, the conductor 205 may be shared by a plurality of transistors.

Although the conductor 205a, the conductor 205b, and the conductor 205c are stacked as the conductor 205, the present invention is not limited to this structure. The conductor 205 may be provided to have a single-layer structure, a two-layer structure, or a stacked-layer structure of four or more layers. For example, when the conductor 205 has a stacked-layer structure of two layers, the top surface of the conductor 205a is aligned with the top surface of the conductor 205b without providing the conductor 205c.

Like the conductor 205, the conductor 248 may include the conductor 248a and the conductor 248b positioned on the inner side than the conductor 248a. As the conductor 248a, a conductor that can be used as the conductor 205a can be used, and a conductor that reduces passage of impurities such as water or hydrogen and oxygen is preferably used. For example, titanium, titanium nitride, tantalum, tantalum nitride, ruthenium, ruthenium oxide, or the like can be used. As the conductor 248a, a conductor with favorable adhesion to the conductor 248b can be used. As the conductor 248b, a conductor that can be used as the conductor 205b can be used, and a conductive material containing tungsten, copper, or aluminum as its main component is preferably used.

Note that the conductor 248 in the top view in FIG. 1A has a circular shape; however, the shape is not limited thereto. For example, the conductor 248 in the top view may have an almost circular shape such as an elliptical shape, a polygonal shape such as a quadrangular shape, or a polygonal shape such as a quadrangular shape with rounded corners.

Although the conductor 248a and the conductor 248b are stacked as the conductor 248, the present invention is not limited to this structure. The conductor 248 may be provided to have a single-layer structure or a stacked-layer structure of three or more layers. For example, like the conductor 205c, a conductor similar to the conductor 205a may be positioned between the top surface of the conductor 248b and the oxide 230.

The insulator 249 is provided in contact with the inner wall of the opening formed in the insulator 212, the insulator 214, the insulator 216, the insulator 222, and the insulator 224 and the conductor 248 is provided in contact with the side surface of the insulator 249. For the insulator 249, an insulator that reduces diffusion of impurities such as hydrogen or water and oxygen is preferably used, and for example, an insulator such as silicon nitride, aluminum oxide, or silicon nitride oxide is used. Thus, impurities such as water or hydrogen contained in the insulator 216 or the like can be inhibited from entering the oxide 230 through the conductor 248. In particular, silicon nitride is suitable because of having a high barrier property against hydrogen. Moreover, oxygen contained in the insulator 216 can be prevented from being absorbed by the conductor 248. Note that the structure is not limited to the above and the insulator 249 may be omitted.

The insulator 222 and the insulator 224 function as gate insulators.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of further inhibiting diffusion of one or both of hydrogen and oxygen as compared to the insulator 224.

For the insulator 222, an insulator containing an oxide of one or both of aluminum and hafnium, which is an insulating material, is preferably used. It is preferable that aluminum oxide, hafnium oxide, an oxide containing aluminum and hafnium (hafnium aluminate), or the like be used as the insulator. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen inside the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used for the insulator 222.

For example, a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) may be used for the insulator 222. With miniaturization and high integration of transistors, a problem such as leakage current might arise because of a thinner gate insulator. When a high-k material is used for the insulator functioning as a gate insulator, a gate potential during operation of the transistor can be reduced while the physical thickness of the gate insulator is maintained.

It is preferable that the insulator 224 in contact with the oxide 230 contain excess oxygen (release oxygen by heating). Silicon oxide, silicon oxynitride, or the like is used as appropriate for the insulator 224, for example. When an insulator containing oxygen is provided in contact with the oxide 230, oxygen vacancies in the oxide 230 can be reduced and the reliability of the transistor 200 can be improved.

For the insulator 224, specifically, an oxide material from which part of oxygen is released by heating, in other words, an insulating material including an excess-oxygen region is preferably used. An oxide from which oxygen is released by heating is an oxide film in which the amount of released oxygen molecules is greater than or equal to $1.0 \times 10^{18}$ molecules/cm$^3$, preferably greater than or equal to $1.0 \times 10^{19}$ molecules/cm$^3$, and further preferably greater than or equal to $2.0 \times 10^{19}$ molecules/cm$^3$ or greater than or equal to $3.0 \times 10^{20}$ molecules/cm$^3$ in TDS (Thermal Desorption Spectroscopy) analysis. Note that the temperature of the film surface in the TDS analysis is preferably within the range of 100° C. to 700° C., or 100° C. to 400° C.

In a manufacturing process of the transistor 200, heat treatment is preferably performed with a surface of the oxide 230 exposed. The heat treatment is performed at higher than or equal to 100° C. and lower than or equal to 600° C., preferably higher than or equal to 350° C. and lower than or equal to 550° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 230 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that oxygen adding treatment performed on the oxide 230 can promote a reaction in which oxygen vacancies in the oxide 230 are repaired with supplied oxygen, i.e., a reaction of "$V_O + O \rightarrow$ null". Furthermore, hydrogen remaining in the oxide 230 reacts with supplied oxygen, so that the hydrogen can be removed as H$_2$O (dehydration). This can inhibit recombination of hydrogen remaining in the oxide 230 with oxygen vacancies and formation of $V_O$H.

Note that the insulator 222 and the insulator 224 may have a stacked-layer structure of two or more layers. In such cases, without limitation to a stacked-layer structure formed of the same material, a stacked-layer structure formed of different materials may be employed. The insulator 224 may be formed into an island shape overlapping with the oxide 230a. In that case, the insulator 275 is in contact with the side surface of the insulator 224 and the top surface of the insulator 222.

The oxide 243a, the oxide 243b, and the oxide 243c are provided over the oxide 230b. The oxide 243a, the oxide 243b, and the oxide 243c are aligned in the A1-A2 direction and provided to be apart from each other with the conductor 260 therebetween.

The oxide 243 (the oxide 243a, the oxide 243b, and the oxide 243c) preferably has a function of inhibiting passage of oxygen. The oxide 243 having a function of inhibiting passage of oxygen is preferably provided between the oxide 230b and the conductor 242 functioning as the source electrode and the drain electrode, in which case the electric resistance between the oxide 230b and the conductor 242 can be reduced. Such a structure improves the electrical characteristics of the transistor 200 and the reliability of the transistor 200. In the case where the electric resistance between the oxide 230b and the conductor 242 can be sufficiently reduced, the oxide 243 is not necessarily provided.

A metal oxide including the element M may be used for the oxide 243. In particular, aluminum, gallium, yttrium, or tin is preferably used as the element M. The concentration of the element M in the oxide 243 is preferably higher than that in the oxide 230b. Furthermore, gallium oxide may be used for the oxide 243. A metal oxide such as an In-M-Zn oxide may be used for the oxide 243. Specifically, the atomic ratio of the element M to In in the metal oxide used for the oxide 243 is preferably greater than the atomic ratio of the element M to In in the metal oxide used for the oxide 230b. The thickness of the oxide 243 is preferably larger than or equal to 0.5 nm and smaller than or equal to 5 nm, further preferably larger than or equal to 1 nm and smaller than or equal to 3 nm, and still further preferably larger than or equal to 1 nm and smaller than or equal to 2 nm. The oxide 243 preferably has crystallinity. In the case where the oxide 243 has crystallinity, release of oxygen from the oxide 230 can be favorably inhibited. When the oxide 243 has a hexagonal crystal structure, for example, release of oxygen from the oxide 230 can sometimes be inhibited.

It is preferable that the conductor 242a be provided in contact with the top surface of the oxide 243a, the conductor 242b be provided in contact with the top surface of the oxide 243b, and the conductor 242c be provided in contact with the top surface of the oxide 243c. The conductor 242a, the conductor 242b, and the conductor 242c are aligned in the A1-A2 direction and provided to be apart from each other with the conductor 260 therebetween. Each of the conductor 242a, the conductor 242b, and the conductor 242c functions as the source electrode or the drain electrode of the transistor 200a or the transistor 200b.

For the conductor 242 (the conductor 242a, the conductor 242b, and the conductor 242c), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are conductive materials that are not easily oxidized or materials that maintain the conductivity even when absorbing oxygen.

Note that hydrogen contained in the oxide 230b or the like is diffused into the conductor 242a, the conductor 242b, and the conductor 242c in some cases. In particular, when a nitride containing tantalum is used for the conductor 242a, the conductor 242b, and the conductor 242c, hydrogen contained in the oxide 230b or the like is likely to be diffused into the conductor 242a, the conductor 242b, and the conductor 242c, and the diffused hydrogen is bonded to nitrogen contained in the conductor 242a, the conductor 242b, and the conductor 242c in some cases. That is, hydrogen contained in the oxide 230b or the like is sometimes absorbed by the conductor 242a, the conductor 242b, or the conductor 242c in some cases.

No curved surface may be formed between the side surface of the conductor 242 and the top surface of the conductor 242. Without the curved surface, the conductor 242 can have a large cross-sectional area in the channel width direction as shown in FIG. 1D. Accordingly, the conductivity of the conductor 242 is increased, so that the on-state current of the transistor 200 can be increased.

The insulator 275 is provided to cover the insulator 224, the oxide 230, the oxide 243, and the conductor 242, and the opening is formed in the region where the insulator 250 and the conductor 260 are provided. The insulator 275 is preferably provided in contact with the top surface of the insulator 224, the side surface of the oxide 230, the side surface of the oxide 243, the side surface of the conductor 242, and the top surface of the conductor 242. The insulator 275 preferably functions as a barrier insulating film that inhibits passage of oxygen. The insulator 275 also preferably functions as a barrier insulating film that inhibits diffusion of impurities such as water and hydrogen into the insulator 224 or the oxide 230 from above. In addition, the insulator 275 preferably has a function of capturing impurities such as hydrogen. As the insulator 275, for example, an insulator such as aluminum oxide or silicon nitride is used.

The insulator 275, which has a function of capturing impurities such as hydrogen, is provided in contact with the insulator 280 or the insulator 224 in a region interposed between the insulator 212 and the insulator 283, whereby impurities such as hydrogen contained in the insulator 280 and the insulator 224 can be captured and the amount of hydrogen in the regions can be kept constant. In that case, aluminum oxide or the like is preferably used for the insulator 275.

The insulator 250 is provided to extend in the A3-A4 direction as illustrated in FIG. 1A, and functions as the gate insulator of each of the transistor 200a and the transistor 200b. The insulator 250 is preferably positioned to be in contact with the top surface and the side surface of the oxide 230b in each of the transistor 200a and the transistor 200b. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride are preferable because they are thermally stable.

As in the insulator 224, the concentration of impurities such as water and hydrogen in the insulator 250 is preferably lowered. The thickness of the insulator 250 is preferably greater than or equal to 1 nm and less than or equal to 20 nm.

Although the insulator 250 is illustrated as a single layer in FIG. 1B and FIG. 1C, a stacked-layer structure of two or more layers may be employed. In the case where the insulator 250 has a stacked-layer structure including two layers, it is preferable that a lower layer of the insulator 250 be formed using an insulator from which oxygen is released by heating and an upper layer of the insulator 250 be formed using an insulator having a function of inhibiting diffusion of oxygen. With such a structure, oxygen contained in the lower layer of the insulator 250 can be inhibited from being diffused into the conductor 260. That is, a reduction in the amount of oxygen supplied to the oxide 230 can be inhibited. In addition, oxidation of the conductor 260 due to oxygen contained in the lower layer of the insulator 250 can be inhibited. For example, the lower layer of the insulator 250 can be formed using the above-described material that can be used for the insulator 250, and the upper layer of the insulator 250 can be formed using a material similar to that for the insulator 222.

In the case where silicon oxide, silicon oxynitride, or the like is used for the lower layer of the insulator 250, the upper layer of the insulator 250 may be formed using an insulating material that is a high-k material having a high relative permittivity. The gate insulator having a stacked-layer structure of the lower layer of the insulator 250 and the upper layer of the insulator 250 can be thermally stable and can have a high relative permittivity. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, for the upper layer of the insulator 250, a metal oxide containing one kind or two or more kinds selected from hafnium, aluminum, gallium, yttrium, zirconium, tungsten, titanium, tantalum, nickel, germanium, magnesium, and the like or a metal oxide that can be used for the oxide 230 can be used. In particular, an insulator containing an oxide of one or both of aluminum and hafnium is preferably used. For example, hafnium oxide is used for the upper layer of the insulator 250.

Furthermore, a metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 into the conductor 260. That is, a reduction in the amount of oxygen supplied to the oxide 230 can be inhibited. Moreover, oxidation of the conductor 260 due to oxygen in the insulator 250 can be inhibited.

Note that the metal oxide may have a function of part of the first gate electrode. For example, a metal oxide that can be used for the oxide 230 can be used as the metal oxide. In that case, when the conductor 260a is deposited by a sputtering method, the metal oxide can have a reduced electric resistance value to be a conductor. Such a conductor can be referred to as an OC (Oxide Conductor) electrode.

With the metal oxide, the on-state current of the transistor 200 can be increased without a reduction in the influence of the electric field from the conductor 260. Since a distance between the conductor 260 and the oxide 230 is kept by the physical thicknesses of the insulator 250 and the metal oxide, leakage current between the conductor 260 and the oxide 230 can be inhibited. Moreover, when the stacked-layer structure of the insulator 250 and the metal oxide is provided, the physical distance between the conductor 260 and the oxide 230 and the intensity of electric field applied to the oxide 230 from the conductor 260 can be easily adjusted as appropriate.

The conductor 260 is provided to extend in the A3-A4 direction as illustrated in FIG. 1A, and functions as the first gate electrode of each of the transistor 200a and the transistor 200b. In each of the transistor 200a and the transistor 200b, the conductor 260 preferably includes the conductor 260a and the conductor 260b positioned over the conductor 260a. For example, the conductor 260a is preferably positioned to cover the bottom surface and the side surface of the conductor 260b. Moreover, as illustrated in FIG. 1B and FIG. 1C, the top surface of the conductor 260 is substantially level with the top surface of the insulator 250. Although the conductor 260 has a two-layer structure of the conductor 260a and the conductor 260b in FIG. 1B and FIG. 1C, the conductor 260 may have a single-layer structure or a stacked-layer structure of three or more layers.

For the conductor 260a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, titanium, titanium nitride, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure; for example, a stacked-layer structure of the conductive material and titanium or titanium nitride may be employed.

In the transistor 200, the conductor 260 is formed in a self-aligned manner to fill the openings formed in the insulator 280 and the like. The formation of the conductor 260 in this manner allows the conductor 260 to be positioned in a region between the conductor 242a and the conductor 242b and a region between the conductor 242b and the conductor 242c.

As illustrated in FIG. 1C, in the channel width direction of the transistor 200, with reference to the bottom surface of the insulator 222, the level of the bottom surface of the conductor 260 in a region where the conductor 260 and the oxide 230b do not overlap with each other is preferably lower than the level of the bottom surface of the oxide 230b.

When the conductor 260 functioning as the gate electrode covers the side surface and the top surface of the channel formation region of the oxide 230b with the insulator 250 therebetween, the electric field of the conductor 260 is likely to act on the entire channel formation region of the oxide 230b. Thus, the on-state current of the transistor 200 can be increased and the frequency characteristics of the transistor 200 can be improved. When the bottom surface of the insulator 222 is a reference, the difference between the level of the bottom surface of the conductor 260 in a region where the oxide 230a and the oxide 230b and the conductor 260 do not overlap with each other and the level of the bottom surface of the oxide 230b is greater than or equal to 0 nm and less than or equal to 100 nm, preferably greater than or equal to 3 nm and less than or equal to 50 nm, and further preferably greater than or equal to 5 nm and less than or equal to 20 nm.

The insulator 280 is provided over the insulator 275, and the opening is formed in the region where the insulator 250 and the conductor 260 are to be provided. In addition, the top surface of the insulator 280 may be planarized.

The insulator 280 functioning as an interlayer film preferably has a low permittivity. When a material with a low permittivity is used for an interlayer film, parasitic capacitance generated between wirings can be reduced. The insulator 280 is preferably provided using a material similar to that for the insulator 216, for example. In particular, silicon oxide and silicon oxynitride, which have thermal stability, are preferable. Materials such as silicon oxide, silicon oxynitride, and porous silicon oxide are particularly preferable because a region containing oxygen released by heating can be easily formed.

Like the insulator 224, the insulator 280 preferably includes an excess-oxygen region or excess oxygen. The concentration of impurities such as water and hydrogen in the insulator 280 is preferably reduced. Oxide including silicon such as silicon oxide, silicon oxynitride, or the like is used as appropriate for the insulator 280, for example. When an insulator containing excess oxygen is provided in contact with the oxide 230, oxygen vacancies in the oxide 230 can be reduced and the reliability of the transistor 200 can be improved.

The insulator 282 is positioned in contact with the top surfaces of the conductor 260 and the insulator 280 and the uppermost portion of the insulator 250. The insulator 282 preferably functions as a barrier insulating film that inhibits impurities such as water and hydrogen from diffusing into the insulator 280 from above and preferably has a function of capturing impurities such as hydrogen. The insulator 282 preferably functions as a barrier insulating film that inhibits passage of oxygen. For the insulator 282, for example, an insulator such as aluminum oxide can be used. The insulator 282, which has a function of capturing impurities such as hydrogen, is provided in contact with the insulator 280 in a region interposed between the insulator 212 and the insulator 283, whereby impurities such as hydrogen contained in the insulator 280 and the like can be captured and the amount of hydrogen in the region can be kept constant.

The insulator 283 functions as a barrier insulating film that inhibits impurities such as water and hydrogen from diffusing into the insulator 280 from above. The insulator 283 is positioned over the insulator 282. The insulator 283 is preferably formed using a nitride containing silicon such as silicon nitride or silicon nitride oxide. For example, silicon nitride deposited using a sputtering method is used for the insulator 283. When the insulator 283 is deposited by a sputtering method, a high-density silicon nitride film where a void or the like is unlikely to be formed can be obtained. To obtain the insulator 283, silicon nitride deposited by a CVD method may be stacked over silicon nitride deposited by a sputtering method.

<Constituent Materials of Semiconductor Device>

Constituent materials that can be used for the semiconductor device will be described below.

<<Substrate>>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate using silicon, germanium, or the like as a material and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a nitride of a metal and a substrate including an oxide of a metal. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<<Insulator>>

Examples of an insulator include an insulating oxide, an insulating nitride, an insulating oxynitride, an insulating nitride oxide, an insulating metal oxide, an insulating metal oxynitride, and an insulating metal nitride oxide.

As miniaturization and high integration of transistors progress, for example, a problem such as leakage current may arise because of a thinner gate insulator. When a high-k material is used for the insulator functioning as a gate insulator, the voltage during operation of the transistor can be lowered while the physical thickness of the gate insulator is maintained. By contrast, when a material with a low relative permittivity is used for the insulator functioning as an interlayer film, parasitic capacitance generated between wirings can be reduced. Thus, a material is preferably selected depending on the function of an insulator.

Examples of the insulator with a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using a metal oxide is surrounded by an insulator having a function of inhibiting passage of oxygen and impurities such as hydrogen, the electrical characteristics of the transistor can be stable. For the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, for the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide, or a metal nitride such as aluminum nitride, silicon nitride oxide, or silicon nitride can be used.

The insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be filled.

<<Conductor>>

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

<<Metal Oxide>>

The oxide 230 is preferably formed using a metal oxide functioning as a semiconductor (an oxide semiconductor). A metal oxide that can be used for the oxide 230 of the present invention will be described below.

The metal oxide preferably contains at least indium or zinc. In particular, indium and zinc are preferably contained. In addition, aluminum, gallium, yttrium, tin, or the like is preferably contained. Furthermore, one or more kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the metal oxide is an In-M-Zn oxide containing indium, the element M, and zinc is considered. The element M is one or more elements selected from aluminum, gallium, yttrium, and tin. Examples of other elements that can be used as the element M include boron, titanium, iron, nickel, germanium, zirconium, molybdenum, lanthanum, cerium, neodymium, hafnium, tantalum, tungsten, magnesium, and cobalt. Note that two or more of the above elements may be used in combination as the element M.

Note that in this specification and the like, a metal oxide containing nitrogen is also collectively referred to as a metal oxide in some cases. A metal oxide containing nitrogen may be referred to as a metal oxynitride.

<Classification of Crystal Structures>

First, the classification of crystal structures of an oxide semiconductor will be described with reference to FIG. 3A. FIG. 3A is a diagram showing the classification of crystal structures of an oxide semiconductor, typically IGZO (a metal oxide containing In, Ga, and Zn).

As shown in FIG. 3A, an oxide semiconductor is roughly classified into "Amorphous", "Crystalline", and "Crystal". "Amorphous" includes completely amorphous. "Crystalline" includes CAAC (c-axis-aligned crystalline), nc (nanocrystalline), and CAC (cloud-aligned composite) (excluding single crystal and poly crystal). Note that "Crystalline" excludes single crystal, poly crystal, and completely amorphous. "Crystal" includes single crystal and poly crystal.

Note that the structures in the thick frame in FIG. 3A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-Ray Diffraction (XRD) spectrum. FIG. 3B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 3B and obtained by GIXD measurement is hereinafter simply referred to as an XRD spectrum. The CAAC-IGZO film in FIG. 3B has a composition in the vicinity of In:Ga:Zn=4:2:3 [atomic ratio]. The CAAC-IGZO film in FIG. 3B has a thickness of 500 nm.

As shown in FIG. 3B, a clear peak indicating crystallinity is detected in the XRD spectrum of the CAAC-IGZO film. Specifically, a peak indicating c-axis alignment is detected at $2\theta$ of around 31° in the XRD spectrum of the CAAC-IGZO film. As shown in FIG. 3B, the peak at $2\theta$ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 3C shows a diffraction pattern of the CAAC-IGZO film. FIG. 3C shows a diffraction pattern obtained by the NBED method in which an electron beam is incident in the direction parallel to the substrate. The CAAC-IGZO film in FIG. 3C has a composition in the vicinity of In:Ga:Zn=4:2:3 [atomic ratio]. In the nanobeam electron diffraction method, electron diffraction is performed with a probe diameter of 1 nm.

As shown in FIG. 3C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 3A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in the oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a channel formation region of the transistor. For example, the carrier concentration in an oxide semiconductor in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, and yet still further preferably lower than $1\times10^{12}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor in the channel formation region and the concentration of silicon or carbon in the vicinity of an interface with the oxide semiconductor in the channel formation region (the concentrations obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor in the channel formation region, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor in the channel formation region, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor in the channel formation region is preferably reduced as much as possible. Specifically, the hydrogen concentration in the oxide semiconductor in the channel formation region, which is obtained by SIMS, is set lower than $1\times10^{20}$ atoms/cm$^3$, preferably lower than $5\times10^{19}$ atoms/cm$^3$, further preferably lower than $1\times10^{19}$ atoms/cm$^3$, still further preferably lower than $5\times10^{18}$ atoms/cm$^3$, and yet still further preferably lower than $1\times10^{18}$ atoms/cm$^3$.

When an oxide semiconductor with sufficiently reduced impurities is used for the channel formation region of the transistor, stable electrical characteristics can be given.

<<Other Semiconductor Materials>>

A semiconductor material that can be used for the oxide 230 is not limited to the above metal oxides. A semiconductor material that has a band gap (a semiconductor material that is not a zero-gap semiconductor) can be used for the oxide 230. For example, a single element semiconductor such as silicon, a compound semiconductor such as gallium arsenide, or a layered material functioning as a semiconductor (also referred to as an atomic layer material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the oxide 230, a transition metal chalcogenide functioning as a semiconductor is preferably used, for example. Specific examples of the transition metal chalcogenide which can be used for the oxide 230 include molybdenum sulfide (typically MoS$_2$), molybdenum selenide (typically MoSe$_2$), molybdenum telluride (typically MoTe$_2$), tungsten sulfide (typically WS$_2$), tungsten selenide (typically WSe$_2$), tungsten telluride (typically WTe$_2$), hafnium sulfide (typically HfS$_2$), hafnium selenide (typically HfSe$_2$), zirconium sulfide (typically ZrS$_2$), and zirconium selenide (typically ZrSe$_2$).

<Manufacturing Method of Semiconductor Device>

Next, a method for manufacturing the semiconductor device that is one embodiment of the present invention and is illustrated in FIG. 1A to FIG. 1D is described with reference to FIG. 4A to FIG. 12A, FIG. 4B to FIG. 12B, FIG. 4C to FIG. 12C, and FIG. 4D to FIG. 12D.

FIG. 4A to FIG. 12A show top views. FIG. 4B to FIG. 12B are cross-sectional views taken along dashed-dotted lines A1-A2 in FIG. 4A to FIG. 12A, respectively, and show cross-sectional views of the transistor 200a and the transistor 200b in the channel length direction. FIG. 4C to FIG. 12C are cross-sectional views taken along dashed-dotted lines A3-A4 in FIG. 4A to FIG. 12A, respectively, and show cross-sectional views of the transistor 200a and the transistor 200b in the channel width direction. FIG. 4D to FIG. 12D are cross-sectional views taken along dashed-dotted lines A5-A6 in FIG. 4A to FIG. 12A, respectively. Note that for simplification of the drawings, some components are not illustrated in the top views in FIG. 4A to FIG. 12A.

Hereinafter, an insulating material for forming an insulator, a conductive material for forming a conductor, and a semiconductor material for forming a semiconductor can be deposited by a sputtering method, a CVD method, an MBE method, a PLD method, an ALD method, or the like as appropriate.

Examples of the sputtering method include an RF sputtering method in which a high-frequency power source is used as a sputtering power source, a DC sputtering method in which a DC power source is used, and a pulsed DC sputtering method in which a voltage is applied while being changed in a pulsed manner. An RF sputtering method is mainly used in the case where an insulating film is deposited, and a DC sputtering method is mainly used in the case where a metal conductive film is deposited. The pulsed DC sputtering method is mainly used in the case where a compound such as an oxide, a nitride, or a carbide is deposited by a reactive sputtering method.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

A high-quality film can be obtained at a relatively low temperature by a plasma enhanced CVD method. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. By contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

As an ALD method, a thermal ALD method, in which a precursor and a reactant react with each other only by a thermal energy, a PEALD (Plasma Enhanced ALD) method, in which a reactant excited by plasma is used, and the like can be used.

An ALD method, which enables one atomic layer to be deposited at a time using self-regulating characteristics of atoms, has advantages such as deposition of an extremely thin film, deposition on a component with a high aspect ratio, deposition of a film with a small number of defects such as pinholes, deposition with excellent coverage, and low-temperature deposition. The use of plasma in a PEALD method is sometimes preferable because deposition at a lower temperature is possible. Note that a precursor used in an ALD method sometimes contains impurities such as carbon. Thus, in some cases, a film provided by an ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object to be processed. Thus, a CVD method and an ALD method are deposition methods that enable favorable step coverage almost regardless of the shape of an object to be processed. In particular, an ALD method has excellent step coverage and excellent thickness uniformity and thus is suitable for covering a surface of an opening portion with a high aspect ratio, for example. On the other hand, an ALD method has a relatively low deposition rate, and thus is preferably used in combination with another deposition method with a high deposition rate, such as a CVD method, in some cases.

A CVD method and an ALD method enable control of the composition of a film to be obtained with the flow rate ratio of the source gases. For example, by a CVD method and an ALD method, a film with a certain composition can be deposited depending on the flow rate ratio of the source gases. Moreover, for example, by a CVD method and an ALD method, a film whose composition is continuously changed can be deposited by changing the flow rate ratio of the source gases during the deposition. In the case where the film is deposited while the flow rate ratio of the source gases is changed, as compared to the case where the film is deposited using a plurality of deposition chambers, the time taken for the deposition can be shortened because the time taken for transfer and pressure adjustment is omitted. Thus, the productivity of the semiconductor device can be increased in some cases.

First, a substrate (not illustrated) is prepared, and the insulator 212 is deposited over the substrate (see FIG. 4A to FIG. 4D). The insulator 212 is preferably deposited by a sputtering method. Since hydrogen is not used as a deposition gas in the sputtering method, the hydrogen concentration in the insulator 212 can be reduced. Without limitation to a sputtering method, the insulator 212 may be deposited by a CVD method, an MBE method, a PLD method, an ALD method, or the like as appropriate.

In this embodiment, for the insulator 212, silicon nitride is deposited by a pulsed DC sputtering method using a silicon target in an atmosphere containing a nitrogen gas. The use of the pulsed DC sputtering method can inhibit generation of particles due to arcing on the target surface, achieving more uniform film thickness. In addition, by using the pulsed voltage, rising and falling in discharge can be made steep as compared with the case where a high-frequency voltage is used. As a result, power can be supplied to an electrode more efficiently to improve the sputtering rate and film quality.

The use of an insulator through which impurities such as water and hydrogen are less likely to pass, such as silicon nitride, can inhibit diffusion of impurities such as water and hydrogen contained in a layer below the insulator 212. When an insulator through which copper is less likely to pass, such as silicon nitride, is used for the insulator 212, even in the case where a metal that is likely to diffuse, such as copper, is used for a conductor in a layer (not illustrated) below the insulator 212, diffusion of the metal into a layer above the insulator 212 through the insulator 212 can be inhibited.

Next, the insulator 214 is deposited over the insulator 212 (see FIG. 4A to FIG. 4D). The insulator 214 is preferably deposited by a sputtering method. Since hydrogen is not used as a deposition gas in the sputtering method, the hydrogen concentration in the insulator 214 can be reduced. Without limitation to a sputtering method, the insulator 214 may be deposited by a CVD method, an MBE method, a PLD method, an ALD method, or the like as appropriate.

In this embodiment, for the insulator 214, aluminum oxide is deposited by a pulsed DC sputtering method using an aluminum target in an atmosphere containing an oxygen gas. The use of the pulsed DC sputtering method can achieve more uniform film thickness and improve the sputtering rate and film quality.

The use of aluminum oxide, which has a high capability of capturing and fixing hydrogen, for the insulator 214 allows capturing or fixing hydrogen contained in the insulator 216 and the like and prevents diffusion of hydrogen into the oxide 230.

Next, the insulator 216 is deposited over the insulator 214. The insulator 216 is preferably deposited by a sputtering method. Since hydrogen is not used as a deposition gas in the sputtering method, the hydrogen concentration in the insulator 216 can be reduced. Without limitation to a sputtering method, the insulator 216 may be deposited by a CVD method, an MBE method, a PLD method, an ALD method, or the like as appropriate.

In this embodiment, for the insulator 216, silicon oxide is deposited by a pulsed DC sputtering method using a silicon target in an atmosphere containing an oxygen gas. The use of the pulsed DC sputtering method can achieve more uniform film thickness and improve the sputtering rate and film quality.

The insulator 212, the insulator 214, and the insulator 216 are preferably successively deposited without exposure to the air. For example, a multi-chamber deposition apparatus is used. As a result, the amounts of hydrogen in the deposited insulator 212, insulator 214, and insulator 216 can be reduced, and furthermore, entry of hydrogen in the films in intervals between deposition steps can be inhibited.

Next, two openings that reach the insulator 214 are formed in the insulator 216 so as to extend in the A3-A4 direction. Examples of the opening include a groove and a slit. A region where the opening is formed is referred to as an opening portion in some cases. Wet etching can be used for the formation of the openings; however, dry etching is preferably used for microfabrication. As the insulator 214, it is preferable to select an insulator that functions as an etching stopper film used in forming the groove by etching the insulator 216. For example, in the case where silicon oxide or silicon oxynitride is used for the insulator 216 in which the groove is to be formed, silicon nitride, aluminum oxide, or hafnium oxide is preferably used for the insulator 214.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

After formation of the openings, a conductive film to be the conductor 205a is deposited. The conductive film to be the conductor 205a desirably includes a conductor having a function of inhibiting passage of oxygen. For example, tantalum nitride, tungsten nitride, or titanium nitride can be used. Alternatively, a stacked-layer film of the conductor having a function of inhibiting passage of oxygen and tantalum, tungsten, titanium, molybdenum, aluminum, copper, or a molybdenum-tungsten alloy can be used. The conductive film to be the conductor 205a can be deposited by a sputtering method, a CVD method, an MBE method, a PLD method, an ALD method, or the like.

In this embodiment, titanium nitride is deposited for the conductive film to be the conductor 205a. When such a metal nitride is used for a layer under the conductor 205b, oxidation of the conductor 205b by the insulator 216 or the like can be inhibited. Furthermore, even when a metal that is likely to diffuse, such as copper, is used for the conductor 205b, the metal can be prevented from diffusing from the conductor 205a to the outside.

Next, a conductive film to be the conductor 205b is deposited. Tantalum, tungsten, titanium, molybdenum, aluminum, copper, a molybdenum-tungsten alloy, or the like can be used for the conductive film to be the conductor 205b. The conductive film can be deposited by a plating method, a sputtering method, a CVD method, an MBE method, a PLD method, an ALD method, or the like. In this embodiment, tungsten is deposited for the conductive film to be the conductor 205b.

Next, by performing CMP treatment, the conductive film to be the conductor 205a and the conductive film to be the conductor 205b are partly removed and the insulator 216 is exposed. As a result, the conductor 205a and the conductor 205b remain only in the opening portion. Note that the insulator 216 is partly removed by the CMP treatment in some cases.

Next, an upper portion of the conductor 205b is removed by etching. This makes the level of the top surface of the conductor 205b lower than the levels of the top surface of the conductor 205a and the top surface of the insulator 216. Dry etching or wet etching can be used for the etching of the conductor 205b, and dry etching is preferably used for microfabrication.

Next, a conductive film to be the conductor 205c is deposited over the insulator 216, the conductor 205a, and the conductor 205b. Like the conductive film to be the conductor 205a, the conductive film to be the conductor 205c desirably includes a conductor having a function of inhibiting passage of oxygen.

In this embodiment, titanium nitride is deposited for the conductive film to be the conductor 205c. When such a metal nitride is used for a layer over the conductor 205b, oxidation of the conductor 205b by the insulator 222 or the like can be inhibited. Furthermore, even when a metal that is likely to diffuse, such as copper, is used for the conductor 205b, the metal can be prevented from diffusing from the conductor 205c to the outside.

Next, by performing CMP treatment, the conductive film to be the conductor 205c is partly removed and the insulator 216 is exposed (see FIG. 4A to FIG. 4D). As a result, the conductor 205a, the conductor 205b, and the conductor 205c remain only in the opening portion. In this way, the conductor 205 with a flat top surface can be formed. Furthermore, the conductor 205b is surrounded by the conductor 205a and the conductor 205c. Thus, impurities such as hydrogen can be prevented from diffusing from the conductor 205b to the outside of the conductor 205a and the conductor 205c, and the conductor 205b can be prevented from being oxidized by entry of oxygen from the outside of the conductor 205a and the conductor 205c. Note that the insulator 216 is partly removed by the CMP treatment in some cases.

Next, the insulator 222 is deposited over the insulator 216 and the conductor 205. An insulator containing an oxide of one or both of aluminum and hafnium is preferably deposited for the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from diffusing into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like. In this embodiment, for the insulator 222, hafnium oxide is deposited by a sputtering method. Since hydrogen is not used as a deposition gas in the sputtering method, the concentration of hydrogen in the insulator 222 can be reduced.

Sequentially, heat treatment is preferably performed. The heat treatment is performed at a temperature higher than or equal to 250° C. and lower than or equal to 650° C., preferably higher than or equal to 300° C. and lower than or equal to 500° C., and further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, and further preferably 0.05 ppb or less. The heat treatment using a highly purified gas can prevent entry of moisture or the like into the insulator 222 and the like as much as possible.

In this embodiment, as the heat treatment, treatment at 400° C. for one hour is performed with a flow rate ratio of a nitrogen gas and an oxygen gas of 4 slm:1 slm after the deposition of the insulator 222. By the heat treatment, impurities such as water and hydrogen contained in the insulator 222 can be removed, for example. In the case where an oxide containing hafnium is used for the insulator 222, the heat treatment can improve the crystallinity of the insulator 222. The heat treatment can also be performed after the deposition of the insulator 224, for example.

Next, the insulator 224 is deposited over the insulator 222. The insulator 224 can be deposited by a sputtering method, a CVD method, an MBE method, a PLD method, an ALD method, or the like. In this embodiment, for the insulator 224, silicon oxide is deposited by a sputtering method. Since hydrogen is not used as a deposition gas in the sputtering method, the hydrogen concentration in the insulator 224 can be reduced. The hydrogen concentration in the insulator 224 is preferably reduced because the insulator 224 is in contact with the oxide 230$a$ in a later step.

Then, an opening is formed in the insulator 224, the insulator 222, the insulator 216, the insulator 214, and the insulator 212. The opening is formed between the two the conductors 205. Wet etching may be used for the formation of the opening; however, dry etching is preferably used for microfabrication. Note that the opening in the top view in FIG. 5A has a circular shape; however, the shape of the opening is not limited thereto. For example, the opening in the top view may have an almost circular shape such as an elliptical shape, a polygonal shape such as a quadrangular shape, or a polygonal shape such as a quadrangular shape with rounded corners.

Subsequently, an insulating film to be the insulator 249 is deposited and the insulating film is subjected to anisotropic etching, so that the insulator 249 is formed. The insulating film to be the insulator 249 can be deposited by a sputtering method, a CVD method, an MBE method, a PLD method, an ALD method, or the like. The insulating film to be the insulator 249 preferably has a function of reducing passage of oxygen. For example, aluminum oxide is preferably deposited by an ALD method. Alternatively, silicon nitride is preferably deposited by a PEALD method. Silicon nitride is preferable because it has a high barrier property against hydrogen.

As anisotropic etching for the insulating film to be the insulator 249, a dry etching method may be performed, for example. When the insulator 249 is provided on the side wall portion of the opening, passage of oxygen from the outside can be reduced and oxidation of the conductor 248 to be formed next can be prevented. Furthermore, impurities such as water and hydrogen can be prevented from entering the conductor 248 from the outside.

After the formation of the opening, a conductive film to be the conductor 248 is deposited. The conductive film to be the conductor 248 can be deposited by a sputtering method, a CVD method, an MBE method, a PLD method, an ALD method, or the like. In this embodiment, the conductor 248 is formed to have a structure similar to that of the conductor 205. Thus, a conductive film to be the conductor 248$a$ can be deposited by a method similar to that of the conductive film to be the conductor 205$a$, and a conductive film to be the conductor 248$b$ can be deposited by a method similar to that of the conductive film to be the conductor 205$b$.

Then, part of the conductive film to be the conductor 248 is removed by CMP treatment to expose the top surface of the insulator 224. As a result, the conductive film to be the conductor 248 remains only in the opening portion. Thus, the conductor 248 (the conductor 248$a$ and the conductor 248$b$) having a flat top surface can be formed (see FIG. 5A to FIG. 5D). Note that the insulator 224 is partly removed by the CMP treatment in some cases.

Here, plasma treatment containing oxygen may be performed under reduced pressure so that an excess-oxygen region can be formed in the insulator 224. For the plasma treatment containing oxygen, an apparatus including a power source for generating high-density plasma using a microwave is preferably used, for example. Alternatively, a power source for applying an RF (Radio Frequency) to the substrate side may be included. The use of high-density plasma enables high-density oxygen radicals to be generated, and RF application to the substrate side allows the oxygen radicals generated by the high-density plasma to be efficiently introduced into the insulator 224. Alternatively, after plasma treatment containing an inert gas is performed using this apparatus, plasma treatment containing oxygen may be performed to compensate for released oxygen. Note that impurities such as water and hydrogen contained in the insulator 224 can be removed by selecting the conditions for the plasma treatment appropriately. In that case, the heat treatment does not need to be performed.

Here, after aluminum oxide is deposited over the insulator 224 by a sputtering method, for example, CMP treatment may be performed until the insulator 224 is exposed. The CMP treatment can planarize and smooth the surface of the insulator 224. When the CMP treatment is performed on the aluminum oxide positioned over the insulator 224, it is easy to detect the endpoint of the CMP treatment. Although part of the insulator 224 is polished by the CMP treatment and the thickness of the insulator 224 is reduced in some cases, the thickness can be adjusted when the insulator 224 is deposited. Planarizing and smoothing the surface of the insulator 224 can prevent deterioration in the coverage with an oxide deposited later and a decrease in the yield of the semiconductor device in some cases. The deposition of aluminum oxide over the insulator 224 by a sputtering method is preferred because oxygen can be added to the insulator 224.

Next, an oxide film 230A and an oxide film 230B are deposited in this order over the insulator 224 and the conductor 248 (see FIG. 6A to FIG. 6D). Note that it is preferable to deposit the oxide film 230A and the oxide film 230B successively without exposure to the air. By the deposition without exposure to the air, impurities or moisture from the atmospheric environment can be prevented from being attached onto the oxide film 230A and the oxide film 230B, so that the vicinity of the interface between the oxide film 230A and the oxide film 230B can be kept clean.

The oxide film 230A and the oxide film 230B can be deposited by a sputtering method, a CVD method, an MBE method, a PLD method, an ALD method, or the like.

For example, in the case where the oxide film 230A and the oxide film 230B are deposited by a sputtering method, oxygen or a mixed gas of oxygen and a rare gas is used as a sputtering gas. Increasing the proportion of oxygen contained in the sputtering gas can increase the amount of excess oxygen in the deposited oxide films. In the case where the oxide films are deposited by a sputtering method, the above In-M-Zn oxide target or the like can be used.

In particular, when the oxide film 230A is deposited, part of oxygen contained in the sputtering gas is supplied to the insulator 224 in some cases. Thus, the proportion of oxygen contained in the sputtering gas is higher than or equal to 70%, preferably higher than or equal to 80%, and further preferably 100%.

In the case where the oxide film 230B is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained. Note that one embodiment of the present invention is not limited thereto. In the case where the oxide film 230B is formed by a sputtering method and the proportion of oxygen contained in the sputtering gas for deposition is higher than or equal to 1% and lower than or equal to 30%, preferably higher than or equal to 5% and lower than or equal to 20%, an oxygen-deficient oxide semiconductor is formed. In a transistor using an oxygen-deficient oxide semiconductor for its channel formation region, relatively high field-effect mobility can be obtained. Furthermore, when the deposition is performed while the substrate is being heated, the crystallinity of the oxide film can be improved.

In this embodiment, the oxide film 230A is deposited by a sputtering method using an oxide target with In:Ga:Zn=1:3:4 [atomic ratio]. In addition, the oxide film 230B is deposited by a sputtering method using an oxide target with In:Ga:Zn=4:2:4.1 [atomic ratio]. Note that each of the oxide films is preferably formed to have characteristics required for the oxide 230a and the oxide 230b by selecting the deposition conditions and the atomic ratios as appropriate.

Next, an oxide film 243A is deposited over the oxide film 230B (see FIG. 6A to FIG. 6D). The oxide film 243A can be deposited by a sputtering method, a CVD method, an MBE method, a PLD method, an ALD method, or the like. The atomic ratio of Ga to In in the oxide film 243A is preferably greater than the atomic ratio of Ga to In in the oxide film 230B. In this embodiment, the oxide film 243A is deposited by a sputtering method using an oxide target with In:Ga:Zn=1:3:4 [atomic ratio].

Note that the insulator 222, the insulator 224, the oxide film 230A, the oxide film 230B, and the oxide film 243A are preferably deposited by a sputtering method without exposure to the air. For example, a multi-chamber deposition apparatus is used. As a result, the amounts of hydrogen in the deposited insulator 222, insulator 224, oxide film 230A, oxide film 230B, and oxide film 243A can be reduced, and furthermore, entry of hydrogen in the films in intervals between deposition steps can be inhibited.

Next, heat treatment is preferably performed. The heat treatment is performed in a temperature range where the oxide film 230A, the oxide film 230B, and the oxide film 243A do not become polycrystals, i.e., at a temperature higher than or equal to 250° C. and lower than or equal to 650° C., preferably higher than or equal to 400° C. and lower than or equal to 600° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, and further preferably 0.05 ppb or less. The heat treatment using a highly purified gas can prevent entry of moisture or the like into the oxide film 230A, the oxide film 230B, the oxide film 243A, and the like as much as possible.

In this embodiment, the heat treatment is performed in such a manner that treatment is performed at 550° C. in a nitrogen atmosphere for one hour and then another treatment is successively performed at 550° C. in an oxygen atmosphere for one hour. By the heat treatment, impurities such as water and hydrogen in the oxide film 230A, the oxide film 230B, and the oxide film 243A can be removed, for example. Furthermore, the heat treatment improves the crystallinity of the oxide film 230B, thereby offering a dense structure with higher density. Thus, diffusion of oxygen or impurities in the oxide film 230B can be reduced.

Next, a conductive film 242A is deposited over the oxide film 243A (see FIG. 6A to FIG. 6D). The conductive film 242A can be deposited by a sputtering method, a CVD method, an MBE method, a PLD method, an ALD method, or the like. For example, for the conductive film 242A, titanium nitride is deposited by a sputtering method. Note that heat treatment may be performed before the deposition of the conductive film 242A. This heat treatment may be performed under reduced pressure, and the conductive film 242A may be successively deposited without exposure to the air. The treatment can remove moisture and hydrogen adsorbed onto the surface of the oxide film 243A and the like, and further can reduce the moisture concentration and the hydrogen concentration in the oxide film 230A, the oxide film 230B, and the oxide film 243A. The heat treatment is preferably performed at a temperature higher than or equal to 100° C. and lower than or equal to 400° C. In this embodiment, the heat treatment is performed at 200° C.

Next, the oxide film 230A, the oxide film 230B, the oxide film 243A, and the conductive film 242A are processed into island shapes by a lithography method to form the oxide 230a, the oxide 230b, an oxide layer 243B, and a conductive layer 242B (see FIG. 7A to FIG. 7D). A dry etching method or a wet etching method can be used for the processing. Processing by a dry etching method is suitable for microfabrication. The oxide film 230A, the oxide film 230B, the oxide film 243A, and the conductive film 242A may be processed under different conditions. Note that in this step, the thickness of the insulator 224 in a region not overlapping with the oxide 230a is reduced in some cases. In this step, the insulator 224 may be processed into an island shape so as to overlap with the oxide 230a.

Note that in the lithography method, first, a resist is exposed to light through a mask. Next, a region exposed to light is removed or left using a developing solution, so that a resist mask is formed. Then, etching process through the resist mask is conducted, whereby a conductor, a semiconductor, an insulator, or the like can be processed into a desired shape. The resist mask is formed through, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by dry etching process such as ashing, wet etching process, wet etching process after dry etching process, or dry etching process after wet etching process.

In addition, a hard mask formed of an insulator or a conductor may be used under the resist mask. In the case of using a hard mask, a hard mask with a desired shape can be formed in the following manner: an insulating film or a conductive film that is the material of the hard mask is formed over the conductive film 242A, a resist mask is formed thereover, and then the hard mask material is etched. The etching of the conductive film 242A and the like may be performed after removing the resist mask or with the resist mask remaining. In the latter case, the resist mask sometimes disappears during the etching. The hard mask may be removed by etching after the etching of the conductive film 242A and the like. Meanwhile, the hard mask is not necessarily removed when the hard mask material does not affect later steps or can be utilized in later steps. For example, in the case where the hard mask is formed using the insulating film, the hard mask may remain to be used as a barrier insulating film.

Here, the oxide 230a, the oxide 230b, the oxide layer 243B, and the conductive layer 242B are formed to at least partly overlap with the conductor 248 and the two conductors 205. It is preferable that the side surfaces of the oxide 230a, the oxide 230b, the oxide layer 243B, and the conductive layer 242B be substantially perpendicular to the top surface of the insulator 222. When the side surfaces of the oxide 230a, the oxide 230b, the oxide layer 243B, and the conductive layer 242B are substantially perpendicular to the top surface of the insulator 222, a plurality of transistors 200 can be provided in a smaller area and at a higher density. Alternatively, a structure may be employed in which an angle formed by the side surfaces of the oxide 230a, the oxide 230b, the oxide layer 243B, and the conductive layer 242B and the top surface of the insulator 222 is a small angle. In that case, the angle formed by the side surfaces of the oxide 230a, the oxide 230b, the oxide layer 243B, and the conductive layer 242B and the top surface of the insulator 222 is preferably greater than or equal to 60° and less than 70°. With such a shape, in later steps, the coverage with the insulator 275 and the like can be improved, so that defects such as a void can be reduced.

A by-product generated in the etching process is sometimes formed in a layered manner on the side surfaces of the oxide 230a, the oxide 230b, the oxide layer 243B, and the conductive layer 242B. In that case, the layered by-product is formed between the insulator 275 and the oxide 230a, the oxide 230b, the oxide 243, and the conductor 242. A layered by-product is also formed over the insulator 224 in some cases. When the insulator 275 is deposited in the state where the layered by-product is formed over the insulator 224, the layered by-product blocks supply of oxygen to the insulator 224. Hence, the layered by-product formed in contact with the top surface of the insulator 224 is preferably removed.

Next, the insulator 275 is deposited over the insulator 224, the oxide 230a, the oxide 230b, the oxide layer 243B, and the conductive layer 242B (see FIG. 8A to FIG. 8D). The insulator 275 can be deposited by a sputtering method, a CVD method, an MBE method, a PLD method, an ALD method, or the like. As the insulator 275, an insulating film having a function of inhibiting passage of oxygen is preferably used. For example, for the insulator 275, aluminum oxide is deposited by an ALD method or a sputtering method. For the insulator 275, silicon nitride may be deposited by a sputtering method.

When the insulator 275 is deposited by a sputtering method, oxygen can be supplied to the insulator 224.

Next, an insulating film to be the insulator 280 is deposited over the insulator 275. The insulating film can be deposited by a sputtering method, a CVD method, an MBE method, a PLD method, an ALD method, or the like. A silicon oxide film is deposited by a sputtering method as the insulating film, for example. When the insulating film to be the insulator 280 is deposited by a sputtering method in an atmosphere containing oxygen, the insulator 280 containing excess oxygen can be formed. Since hydrogen is not used as a deposition gas in the sputtering method, the concentration of hydrogen in the insulator 280 can be reduced. Note that heat treatment may be performed before the insulating film is deposited. The heat treatment may be performed under reduced pressure, and the insulating film may be successively deposited without exposure to the air. The treatment can remove moisture and hydrogen adsorbed onto the surface of the insulator 275 and the like, and further can reduce the moisture concentration and the hydrogen concentration in the oxide 230a, the oxide 230b, the oxide layer 243B, and the insulator 224. For the heat treatment, the above heat treatment conditions can be used.

Next, the insulating film to be the insulator 280 is subjected to CMP treatment, so that the insulator 280 with a flat top surface is formed (see FIG. 8A to FIG. 8D). Note that, for example, silicon nitride may be deposited over the insulator 280 by a sputtering method and CMP treatment may be performed on the silicon nitride until the insulator 280 is reached.

Next, part of the insulator 280, part of the insulator 275, part of the conductive layer 242B, part of the oxide layer 243B, and part of the oxide 230b are removed to form the two openings reaching the oxide 230b. Each of the two openings is preferably formed to overlap with the conductor 205. By formation of the openings, the conductor 242a, the conductor 242b, the conductor 242c, the oxide 243a, the oxide 243b, and the oxide 243c are formed (see FIG. 9A to FIG. 9D). Here, the conductor 242b is preferably formed to overlap with the conductor 248. Regions of the oxide 230b which do not overlap with the conductor 242a, the conductor 242b, or the conductor 242c are exposed.

An upper portion of the oxide 230b is removed when the opening is formed. When part of the oxide 230b is removed, a groove portion is formed in the oxide 230b. The groove portion may be formed in the same step as the formation of the opening or in a step different from the formation of the opening in accordance with the depth of the groove portion.

The part of the insulator 280, the part of the insulator 275, the part of the conductive layer 242B, the part of the oxide layer 243B, and the part of the oxide 230b can be processed by a dry etching method or a wet etching method. Processing by a dry etching method is suitable for microfabrication. The processing may be performed under different conditions. For example, the part of the insulator 280 may be processed by a dry etching method, the part of the insulator 275 may be processed by a wet etching method, and the part of the oxide layer 243B, the part of the conductive layer 242B, and the part of the oxide 230b may be processed by a dry etching method. In this case, the two openings are first formed in the insulator 280, and then openings are formed in the insulator 275, the oxide layer 243B, and the conductive layer 242B to overlap with the two openings. Processing of the part of the oxide layer 243B and the part of the conductive layer 242B and processing of the part of the oxide 230b may be performed under different conditions.

Here, it is preferable to remove impurities that are attached onto the surfaces of the oxide 230a, the oxide 230b, and the like or diffused into the oxide 230a, the oxide 230b, and the like. It is also preferable to remove a damaged region that is formed on the surface of the oxide 230b by the above dry etching. The impurities come from components contained in the insulator 280, the insulator 275, and the conductive layer 242B; components contained in a member of an apparatus used to form the opening; and components contained in a gas or a liquid used for etching, for instance. Examples of the impurities include aluminum, silicon, tantalum, fluorine, and chlorine.

In particular, impurities such as aluminum and silicon block the oxide 230b from becoming a CAAC-OS. It is thus preferable to reduce or remove impurity elements such as aluminum and silicon, which block the oxide from becoming a CAAC-OS. For example, the concentration of aluminum atoms in the oxide 230b and in the vicinity thereof is lower than or equal to 5.0 atomic %, preferably lower than or equal to 2.0 atomic %, further preferably lower than or equal to 1.5 atomic %, still further preferably lower than or equal to 1.0 atomic %, and yet further preferably lower than 0.3 atomic %.

Note that in a metal oxide, a region that is hindered from becoming a CAAC-OS by impurities such as aluminum and silicon and becomes an amorphous-like oxide semiconductor (a-like OS) is referred to as a non-CAAC region in some cases. In the non-CAAC region, the density of the crystal structure is reduced to increase $V_OH$; thus, the transistor is likely to be normally on. Hence, the non-CAAC region in the oxide 230b is preferably reduced or removed.

By contrast, the oxide 230b preferably has a layered CAAC structure. In particular, the CAAC structure preferably reaches a lower edge portion of a drain in the oxide 230b. Here, in the transistor 200, the conductor 242a, the conductor 242b, or the conductor 242c and its vicinity function as a drain. In other words, the oxide 230b in the vicinity of the lower edge portion of the conductor 242a, the conductor 242b, or the conductor 242c preferably has a CAAC structure. In this manner, the damaged region of the oxide 230b is removed and the CAAC structure is formed in the edge portion of the drain, which significantly affects the drain withstand voltage, so that variation of the electrical characteristics of the transistor 200 can be further suppressed. The reliability of the transistor 200 can be improved.

In order to remove the above impurities and the like, cleaning treatment is performed. Examples of the cleaning method include wet cleaning using a cleaning solution, plasma treatment using plasma, and cleaning by heat treatment, and any of these cleanings may be performed in appropriate combination. The cleaning treatment sometimes makes the groove portion deeper.

As the wet cleaning, cleaning treatment may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Further alternatively, such cleaning methods may be performed in combination as appropriate.

Note that in this specification and the like, in some cases, an aqueous solution in which commercial hydrofluoric acid is diluted with pure water is referred to as diluted hydrofluoric acid, and an aqueous solution in which commercial ammonia water is diluted with pure water is referred to as diluted ammonia water. The concentration, temperature, and the like of the aqueous solution may be adjusted as appropriate in accordance with an impurity to be removed, the structure of a semiconductor device to be cleaned, or the like. The concentration of ammonia in the diluted ammonia water is higher than or equal to 0.01% and lower than or equal to 5%, preferably higher than or equal to 0.1% and lower than or equal to 0.5%. The concentration of hydrogen fluoride in the diluted hydrofluoric acid is higher than or equal to 0.01 ppm and lower than or equal to 100 ppm, preferably higher than or equal to 0.1 ppm and lower than or equal to 10 ppm.

A frequency greater than or equal to 200 kHz, preferably greater than or equal to 900 kHz is preferably used for the ultrasonic cleaning. Damage to the oxide 230b and the like can be reduced with this frequency.

The cleaning treatment may be performed a plurality of times, and the cleaning solution may be changed in every cleaning treatment. For example, the first cleaning treatment may use diluted hydrofluoric acid or diluted ammonia water and the second cleaning treatment may use pure water or carbonated water.

As the cleaning treatment in this embodiment, wet cleaning using diluted hydrofluoric acid is performed, and then, wet cleaning using pure water or carbonated water is performed. The cleaning treatment can remove impurities that are attached onto the surfaces of the oxide 230a, the oxide 230b, and the like or diffused into the oxide 230a, the oxide 230b, and the like. The crystallinity of the oxide 230b can be increased.

By the processing such as dry etching or the cleaning treatment, the thickness of the insulator 224 in a region that overlaps with the opening and does not overlap with the oxide 230b might become smaller than the thickness of the insulator 224 in a region that overlaps with the oxide 230b.

After the etching or the cleaning treatment, heat treatment may be performed. The heat treatment can be performed at higher than or equal to 100° C. and lower than or equal to 450° C., preferably higher than or equal to 350° C. and lower than or equal to 400° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 230a and the oxide 230b to reduce the amount of oxygen vacancies $V_O$. This heat treatment can improve the crystallinity of the oxide 230b. The heat treatment may be performed under reduced pressure. Alternatively, the heat treatment may be performed in a nitrogen atmosphere without exposure to the air successively after heat treatment is performed in an oxygen atmosphere.

Next, an insulating film 250A is deposited (see FIG. 10A to FIG. 10D). Heat treatment may be performed before the deposition of the insulating film 250A. It is preferable that the heat treatment be performed under reduced pressure and the insulating film 250A be successively deposited without exposure to the air. The heat treatment is preferably performed in an atmosphere containing oxygen. Such treatment can remove moisture and hydrogen adsorbed onto the surface of the oxide 230b and the like, and further can reduce the moisture concentration and the hydrogen concentration in the oxide 230a and the oxide 230b. The heat treatment is preferably performed at a temperature higher than or equal to 100° C. and lower than or equal to 400° C.

The insulating film 250A can be deposited by a sputtering method, a CVD method, an MBE method, a PLD method, an ALD method, or the like. The insulating film 250A is preferably deposited by a deposition method using a gas in which hydrogen atoms are reduced or removed. This can reduce the hydrogen concentration in the insulating film 250A. The hydrogen concentration in the insulating film 250A is preferably reduced because the insulating film 250A becomes the insulator 250 that is in contact with the oxide 230b in a later step.

Figure 10A:
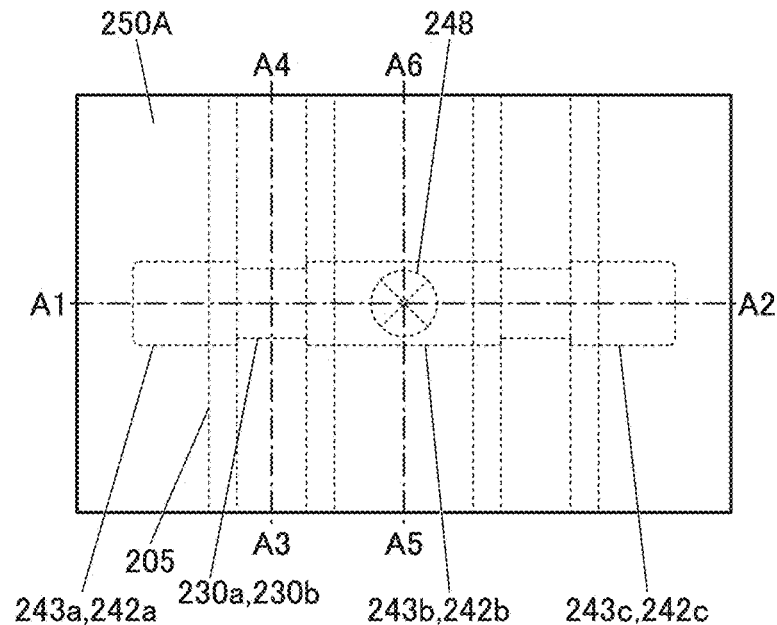
FIG. 10A, FIG. 10B, FIG. 10C, and FIG. 10D are a top view and cross-sectional views illustrating a method of manufacturing a semiconductor device of one embodiment of the present invention.
Figure 10C:
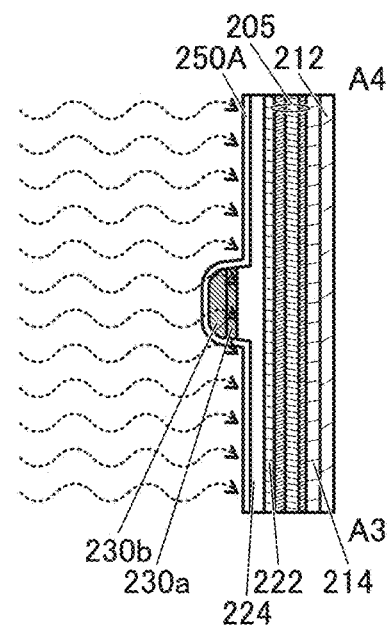
Figure 10B:
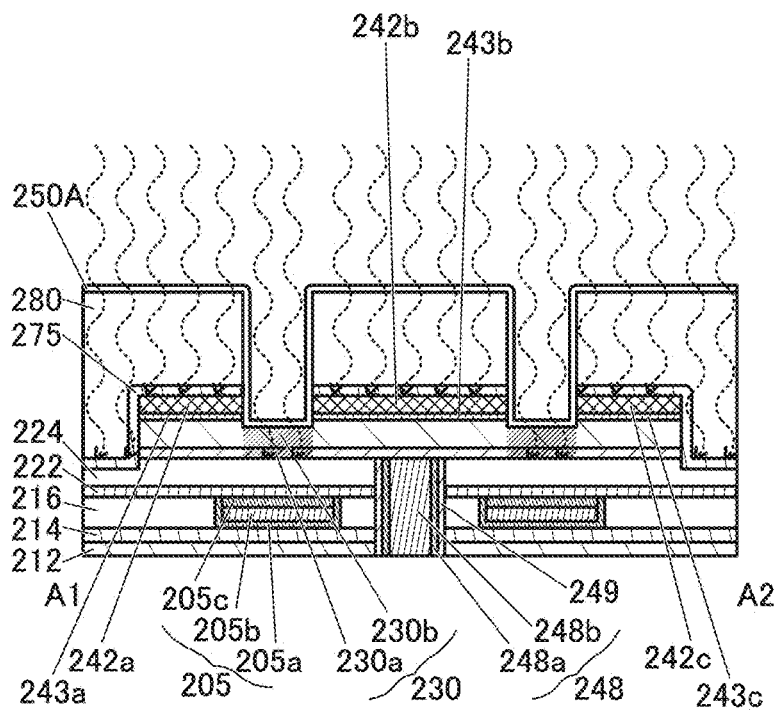

The insulating film 250A is preferably deposited by an ALD method. The thickness of the insulator 250, which functions as a gate insulating film of the miniaturized transistor 200, needs to be extremely small (e.g., approximately 5 nm to 30 nm) and have a small variation. By contrast, an ALD method is a deposition method in which a precursor and a reactant (an oxidizer) are alternately introduced, and the film thickness can be adjusted with the number of repetition times of the sequence of the gas introduction; thus, accurate control of the film thickness is possible. Thus, the accuracy of the thickness of the gate insulating film required by the miniaturized transistor 200 can be achieved. Furthermore, as illustrated in FIG. 10B and FIG. 10C, the insulating film 250A needs to be deposited on the bottom surface and the side surface of the opening formed in the insulator 280 and the like so as to have good coverage. One atomic layer can be deposited at a time on the bottom surface and the side surface of the opening, whereby the insulating film 250A can be deposited in the opening with good coverage.

For example, in the case where the insulating film 250A is deposited by a PECVD method, the deposition gas containing hydrogen is decomposed in plasma to generate a large amount of hydrogen radicals. Oxygen in the oxide 230b is extracted by reduction reaction of hydrogen radicals to form $V_OH$, so that the hydrogen concentration in the oxide 230b increases. By contrast, when the insulating film 250A is deposited by an ALD method, the generation of hydrogen radicals can be inhibited at the introduction of a precursor and the introduction of a reactant. Thus, the use of the ALD method for depositing the insulating film 250A can prevent an increase in the hydrogen concentration in the oxide 230b. For example, as the insulating film 250A, a silicon oxide film of silicon oxide or the like is deposited by an ALD method.

Figure 10D:
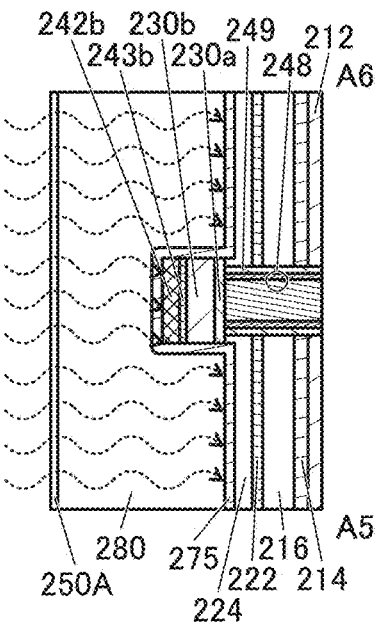
Figure 11A:
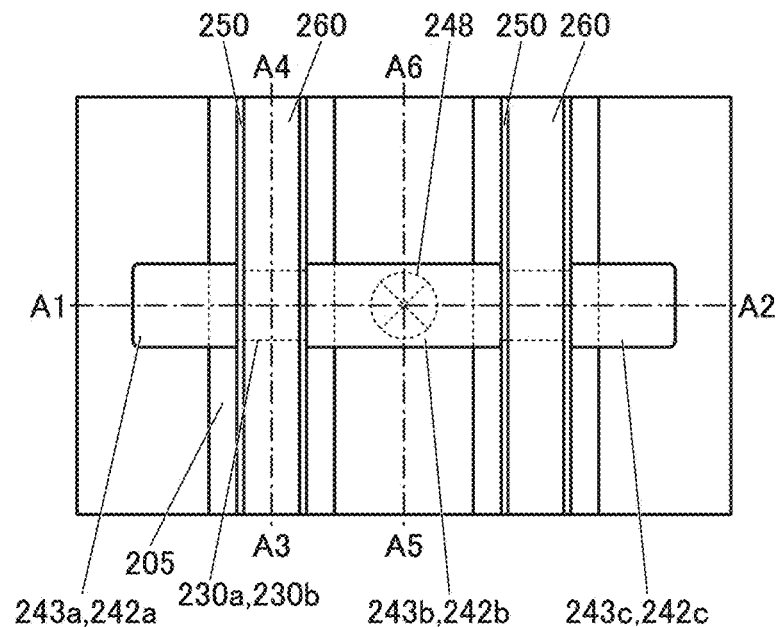
FIG. 11A, FIG. 11B, FIG. 11C, and FIG. 11D are a top view and cross-sectional views illustrating a method of manufacturing a semiconductor device of one embodiment of the present invention.
Figure 11C:
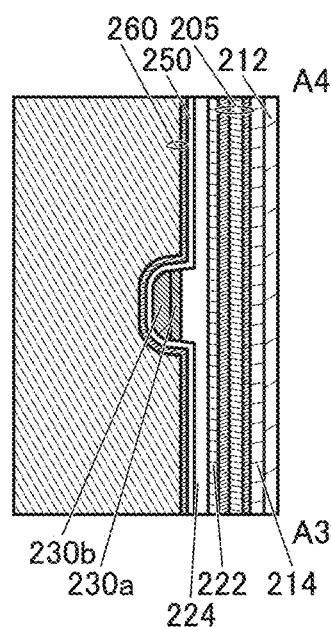
Figure 11B:
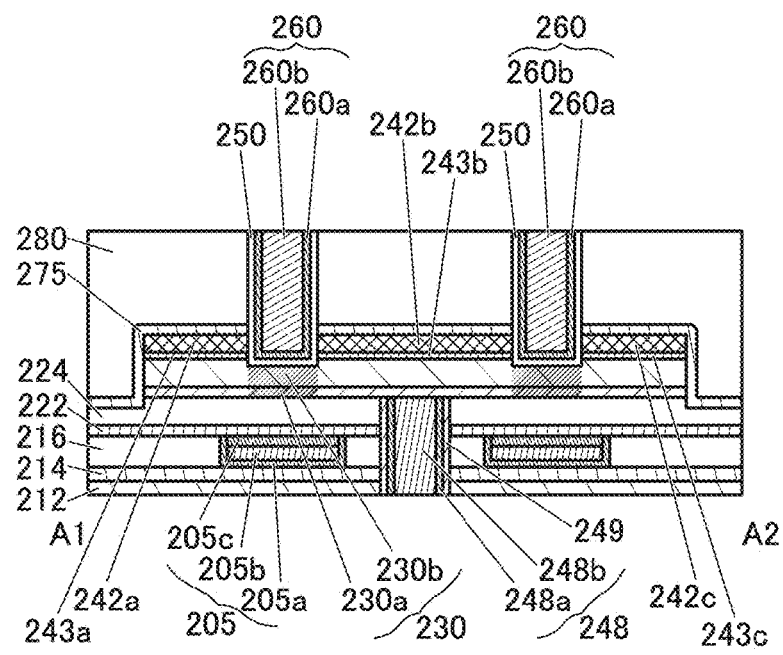
Figure 11D:
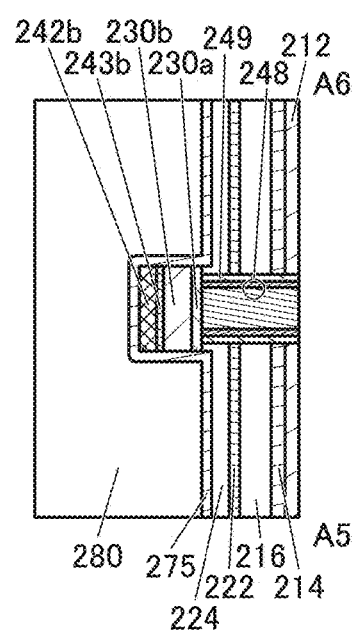
Figure 12A:
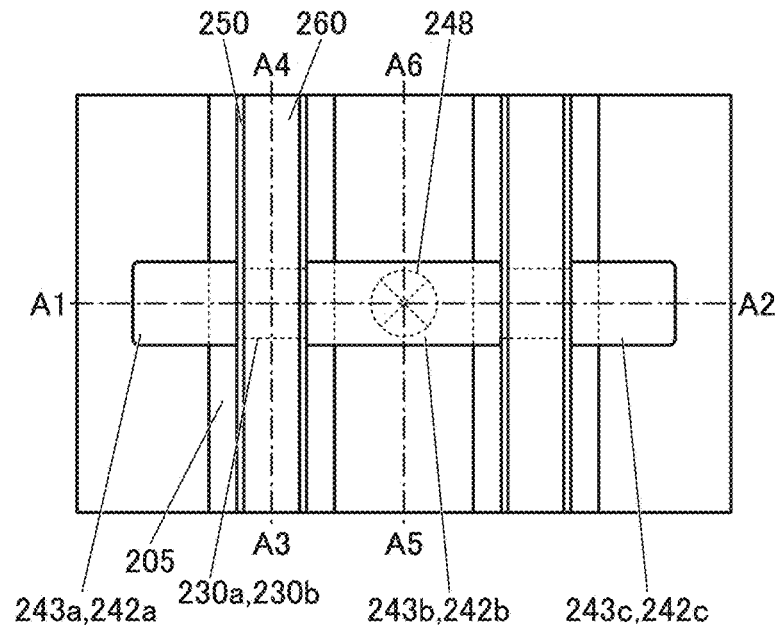
FIG. 12A, FIG. 12B, FIG. 12C, and FIG. 12D are a top view and cross-sectional views illustrating a method of manufacturing a semiconductor device of one embodiment of the present invention.
Figure 12C:
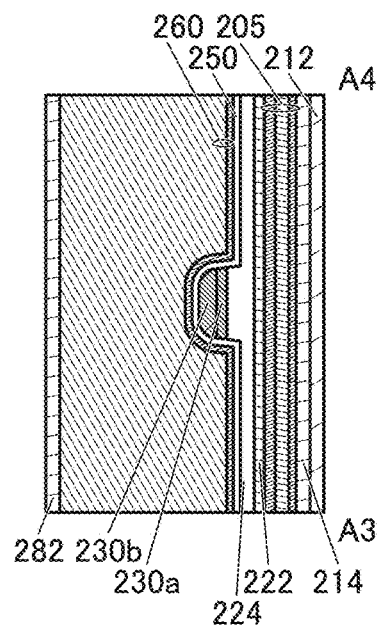
Figure 12B:
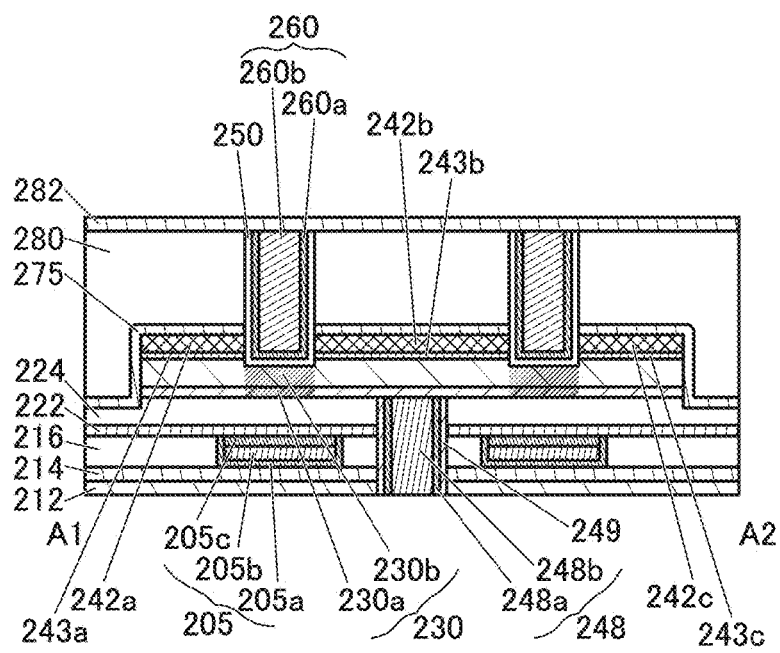
Figure 12D:
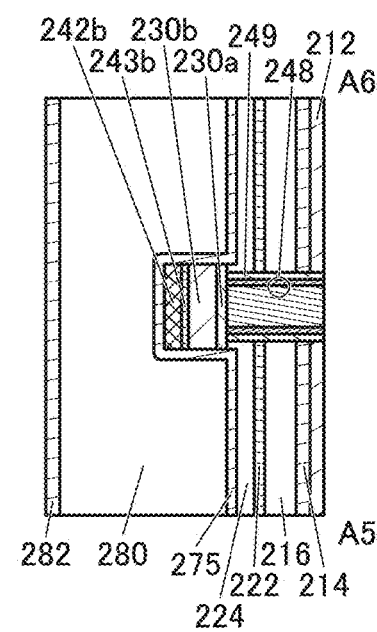

Although the insulating film 250A is illustrated as a single layer in FIG. 10B, FIG. 10C, and FIG. 10D, a stacked-layer structure of two or more layers may be employed. In the case where the insulating film 250A has a stacked-layer structure including two layers, it is preferable that a lower layer of the insulating film 250A be formed using an insulator from which oxygen is released by heating and an upper layer of the insulating film 250A be formed using an insulator having a function of inhibiting diffusion of oxygen. With such a structure, oxygen contained in the lower layer of the insulator 250 can be inhibited from being diffused into the conductor 260. That is, a reduction in the amount of oxygen supplied to the oxide 230 can be inhibited. In addition, oxidation of the conductor 260 due to oxygen contained in the lower layer of the insulator 250 can be inhibited. For example, the lower layer of the insulating film 250A can be formed using the above-described material that can be used for the insulator 250, and the upper layer of the insulating film 250A can be formed using a material similar to that for the insulator 222.

Specifically, for the upper layer of the insulating film 250A, a metal oxide containing one kind or two or more kinds selected from hafnium, aluminum, gallium, yttrium, zirconium, tungsten, titanium, tantalum, nickel, germanium, magnesium, and the like, or a metal oxide that can be used for the oxide 230 can be used. In particular, an insulator containing an oxide of one or both of aluminum and hafnium is preferably used.

In this embodiment, the insulating film 250A has a stacked-layer structure including two layers; silicon oxide is deposited by a PEALD method for the lower layer and hafnium oxide is deposited by a thermal ALD method for the upper layer.

In the case where the insulating film 250A has a stacked-layer structure including two layers, the insulating film to be the lower layer of the insulating film 250A and the insulating film to be the upper layer of the insulating film 250A are preferably deposited successively without exposure to the air. Deposition without exposure to the air can prevent moisture or impurities such as hydrogen from the atmosphere from attaching onto the insulating film to be the lower layer of the insulating film 250A and the insulating film to be the upper layer of the insulating film 250A. Accordingly, the vicinity of the interface between the insulating film to be the lower layer of the insulating film 250A and the insulating film to be the upper layer of the insulating film 250A can be kept clean.

Next, microwave treatment is performed in an atmosphere containing oxygen (see FIG. 10A to FIG. 10D). Here, dotted lines shown in FIG. 10B, FIG. 10C, and FIG. 10D indicate microwaves, high-frequency waves such as RF, oxygen plasma, oxygen radicals, or the like. For the microwave treatment, a microwave treatment apparatus including a power source for generating high-density plasma using a microwave is preferably used, for example. The microwave treatment apparatus may include a power source for applying RF to the substrate side. The use of high-density plasma enables high-density oxygen radicals to be generated. Furthermore, application of RF to the substrate side allows oxygen ions generated by the high-density plasma to be efficiently introduced into the oxide 230b. The microwave treatment is preferably performed under reduced pressure, and the pressure is set to 60 Pa or higher, preferably 133 Pa or higher, further preferably 200 Pa or higher, and still further preferably 400 Pa or higher. Furthermore, the oxygen flow rate ratio ($O_2/O_2+Ar$) is lower than or equal to 50%, preferably higher than or equal to 10% and lower than or equal to 30%. The treatment temperature is lower than or equal to 750° C., preferably lower than or equal to 500° C., and is approximately 400° C., for example. Heat treatment may be successively performed without exposure to the air after the oxygen plasma treatment.

As illustrated in FIG. 10B, FIG. 10C, and FIG. 10D, the microwave treatment in an atmosphere containing oxygen converts oxygen gas into plasma using a microwave or a high-frequency wave such as RF, and applies the oxygen plasma to a region of the oxide 230b that is between the conductor 242a and the conductor 242b and a region of the oxide 230b that is between the conductor 242b and the conductor 242c. At this time, irradiation with the microwave or the high-frequency wave such as RF can be performed. In other words, the microwave, the high-frequency wave such as RF, the oxygen plasma, and the like can be applied to the region 232d and the region 232e illustrated in FIG. 2. The effect of the plasma, the microwave, and the like enables $V_OH$ in the region 232d and the region 232e to be cut off, and hydrogen H to be removed from the region 232d and the region 232e. That is, the reaction "$V_OH \rightarrow H+V_O$" occurs in the region 232d and the region 232e, so that the hydrogen concentration in the region 232d and the region 232e can be reduced. As a result, oxygen vacancies and $V_OH$ in the region 232d and the region 232e can be reduced to lower the carrier concentration. In addition, oxygen radicals generated by the oxygen plasma or oxygen contained in the insulator 250 can be supplied to oxygen vacancies formed in the region 232d and the region 232e, thereby further reducing oxygen vacancies and lowering the carrier concentration in the region 232d and the region 232e.

The conductor 242a, the conductor 242b, and the conductor 242c are provided over the region 232a, the region 232b, and the region 232c. As illustrated in FIG. 10B, FIG. 10C, and FIG. 10D, the effect of the microwave, the high-frequency wave such as RF, the oxygen plasma, or the like is blocked by the conductor 242a, the conductor 242b, and the conductor 242c, and thus does not reach the region 232a, the region 232b, and the region 232c. Hence, a reduction in $V_OH$ and supply of an excess amount of oxygen due to the microwave treatment do not occur in the region 232a, the region 232b, and the region 232c, preventing a decrease in carrier concentration.

In the above manner, oxygen vacancies and $V_OH$ can be selectively removed from the region 232d and the region 232e in the oxide semiconductor, whereby the region 232d and the region 232e can be an i-type or substantially i-type region. Furthermore, supply of an excess amount of oxygen to the region 232a, the region 232b, and the region 232c functioning as the source region and the drain region can be inhibited and the n-type regions can be maintained. As a result, change in the electrical characteristics of the transistor 200 can be inhibited, and thus variation in the electrical characteristics of the transistors 200 in the substrate plane can be inhibited. Since the conductor 248 is provided to overlap with the conductor 242b and thus the top surface of the conductor 248 is in contact with the region 232b in a self-aligned manner, the transistor 200a and the transistor 200b can have a good contact with the conductor 248.

Thus, a semiconductor device with a small variation in transistor characteristics can be provided. A semiconductor device having favorable electrical characteristics can be provided. A highly reliable semiconductor device can be provided.

Although the microwave treatment is performed after the insulating film 250A is deposited in the step illustrated in FIG. 10, the present invention is not limited thereto. For example, the microwave treatment may be performed before the insulating film 250A is deposited or the microwave treatment may be performed both before and after the insulating film 250A is deposited.

For example, in the case where the insulating film 250A has the above-described two-layer structure, microwave treatment is performed, silicon oxide is deposited by a PEALD method for the lower layer, and hafnium oxide is deposited by a thermal ALD method for the upper layer. Here, the microwave treatment, the PEALD deposition of silicon oxide, and the thermal ALD deposition of hafnium oxide are preferably performed successively without exposure to the air. For example, a multi-chamber deposition apparatus is used. Treatment with a reactant (oxidizer) excited by plasma in a PEALD apparatus may be substituted for the microwave treatment. Here, an oxygen gas may be used as the reactant (oxidizer).

After the microwave treatment, heat treatment may be performed with the reduced pressure being maintained. Such treatment enables hydrogen in the insulating film 250A, the oxide 230b, and the oxide 230a to be removed efficiently. Part of hydrogen is gettered by the conductor 242 (the conductor 242a and the conductor 242b) in some cases. Alternatively, it is possible to repeat the step of performing microwave treatment and the step of performing heat treatment with the reduced pressure being maintained after the microwave treatment. The repetition of the heat treatment enables hydrogen in the insulating film 250A, the oxide 230b, and the oxide 230a to be removed more efficiently. Note that the temperature of the heat treatment is preferably higher than or equal to 300° C. and lower than or equal to 500° C.

Furthermore, the microwave treatment improves the film quality of the insulating film 250A, thereby inhibiting diffusion of hydrogen, water, impurities, and the like. Accordingly, hydrogen, water, impurities, and the like can be inhibited from diffusing into the oxide 230b, the oxide 230a, and the like through the insulator 250 in a later step such as deposition of a conductive film to be the conductor 260 or later treatment such as heat treatment.

Next, a conductive film to be the conductor 260a and a conductive film to be the conductor 260b are deposited in this order. The conductive film to be the conductor 260a and the conductive film to be the conductor 260b can be deposited by a sputtering method, a CVD method, an MBE method, a PLD method, an ALD method, or the like. In this embodiment, the conductive film to be the conductor 260a is deposited by an ALD method, and the conductive film to be the conductor 260b is deposited by a CVD method.

Then, the insulating film 250A, the conductive film to be the conductor 260a, and the conductive film to be the conductor 260b are polished by CMP treatment until the insulator 280 is exposed, whereby the insulator 250 and the conductor 260 (the conductor 260a and the conductor 260b) corresponding to each of the transistor 200a and the transistor 200b are formed (see FIG. 11A to FIG. 11D). Accordingly, the insulator 250 in each of the transistor 200a and the transistor 200b is positioned to cover the inner wall (the side wall and the bottom surface) of the two openings reaching the oxide 230b and the groove portion of the oxide 230b. The conductor 260 in each of the transistor 200a and the transistor 200b is positioned to fill the two openings and the groove portion with the insulator 250 therebetween.

Then, heat treatment may be performed under conditions similar to those of the above heat treatment. In this embodiment, treatment is performed at 400° C. in a nitrogen atmosphere for one hour. The heat treatment can reduce the moisture concentration and the hydrogen concentration in the insulator 250 and the insulator 280. After the heat treatment, the deposition of the insulator 282 may be performed successively without exposure to the air.

Next, the insulator 282 is formed over the insulator 250, the conductor 260, and the insulator 280 (see FIG. 12A to FIG. 12D). The insulator 282 can be deposited by a sputtering method, a CVD method, an MBE method, a PLD method, an ALD method, or the like. The insulator 282 is preferably deposited by a sputtering method. Since hydrogen is not used as a deposition gas in the sputtering method, the hydrogen concentration in the insulator 282 can be reduced. The insulator 282 is deposited by a sputtering method in an oxygen-containing atmosphere, whereby oxygen can be added to the insulator 280 during the deposition. Thus, excess oxygen can be contained in the insulator 280. At this time, the insulator 282 is preferably deposited while the substrate is being heated.

In this embodiment, for the insulator 282, aluminum oxide is deposited by a pulsed DC sputtering method using an aluminum target in an atmosphere containing an oxygen gas. The use of the pulsed DC sputtering method can achieve more uniform film thickness and improve the sputtering rate and film quality.

Next, the insulator 283 is formed over the insulator 282 (see FIG. 1A to FIG. 1D). The insulator 283 can be deposited by a sputtering method, a CVD method, an MBE method, a PLD method, an ALD method, or the like. The insulator 283 is preferably deposited by a sputtering method. Since hydrogen is not used as a deposition gas in the sputtering method, the hydrogen concentration in the insulator 283 can be reduced. The insulator 283 may be a multilayer. For example, silicon nitride may be deposited by a sputtering method and silicon nitride may be formed by a CVD method over the silicon nitride. Surrounding the transistor 200 by the insulator 283 and the insulator 212 having high barrier properties can prevent entry of moisture and hydrogen from the outside.

Next, heat treatment may be performed. In this embodiment, treatment is performed at 400° C. in a nitrogen atmosphere for one hour. By the heat treatment, oxygen added at the time of the deposition of the insulator 282 can be diffused into the insulator 280 and the insulator 250 and then can be supplied selectively to the channel formation region of the oxide 230, as illustrated in FIG. 2. Note that the heat treatment is not necessarily performed after the formation of the insulator 283 and may be performed after the deposition of the insulator 282, for example.

Through the above process, the semiconductor device including the transistor 200 shown in FIG. 1A to FIG. 1D can be manufactured. As shown in FIG. 4A to FIG. 12A, FIG. 4B to FIG. 12B, FIG. 4C to FIG. 12C, and FIG. 4D to FIG. 12D, the transistor 200 can be manufactured with the use of the method for manufacturing the semiconductor device described in this embodiment.

<Microwave Treatment Apparatus>

A microwave treatment apparatus that can be used for the above method for manufacturing the semiconductor device is described below.

Figure 14:
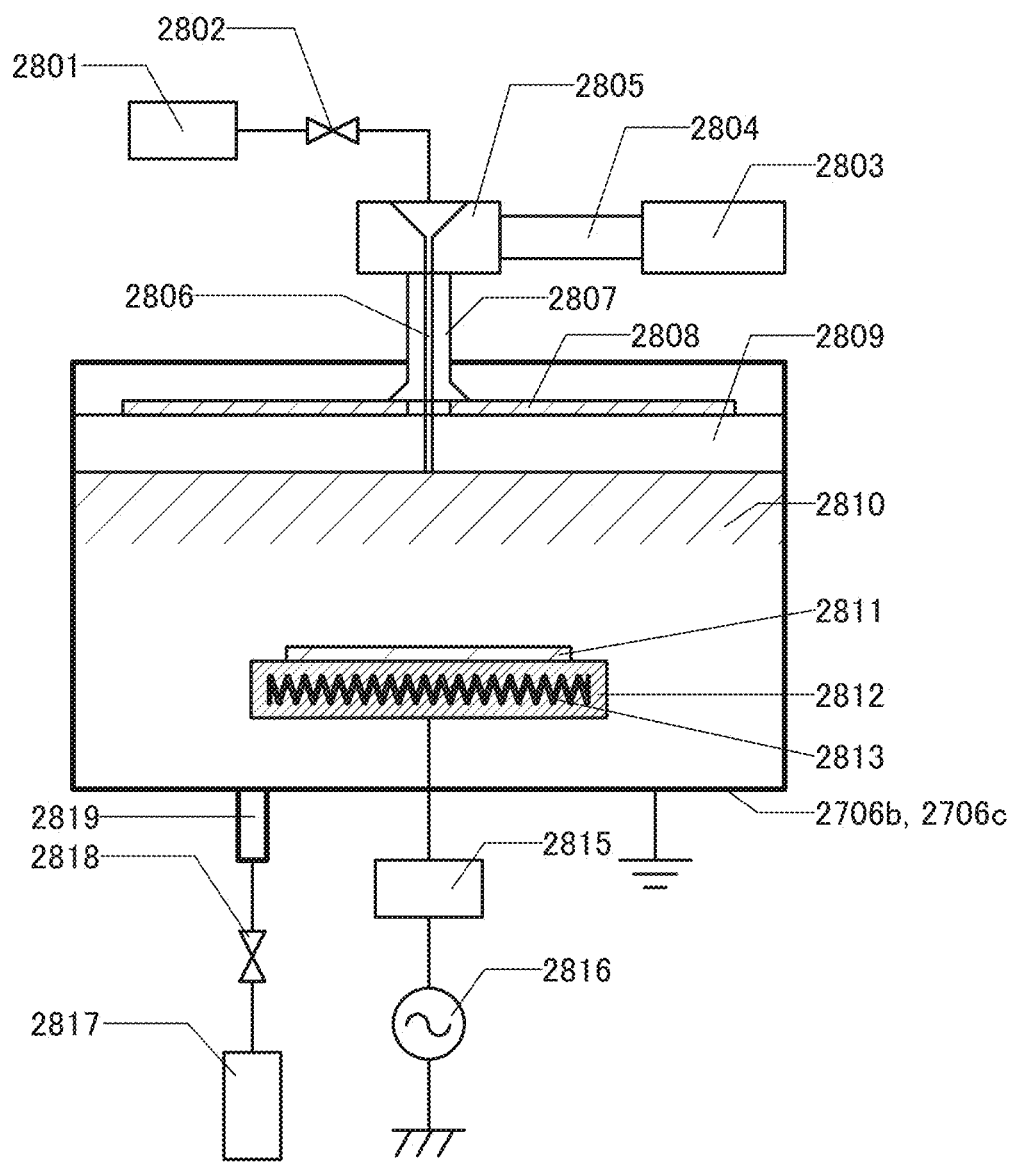
FIG. 14 is a cross-sectional view illustrating a microwave treatment apparatus of one embodiment of the present invention.
Figure 15:
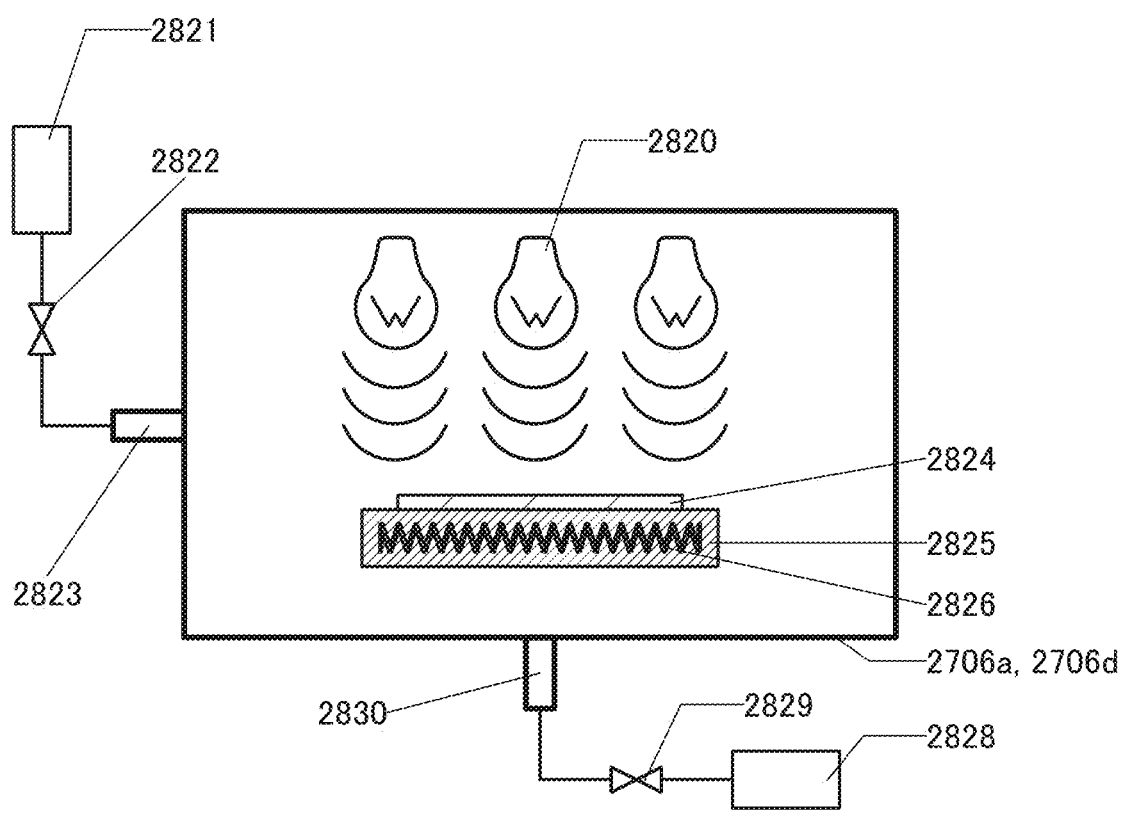
FIG. 15 is a cross-sectional view illustrating a microwave treatment apparatus of one embodiment of the present invention.

First, a structure of a manufacturing apparatus that can reduce entry of impurities in manufacturing a semiconductor device or the like is described with reference to FIG. 13, FIG. 14, and FIG. 15.

Figure 13:
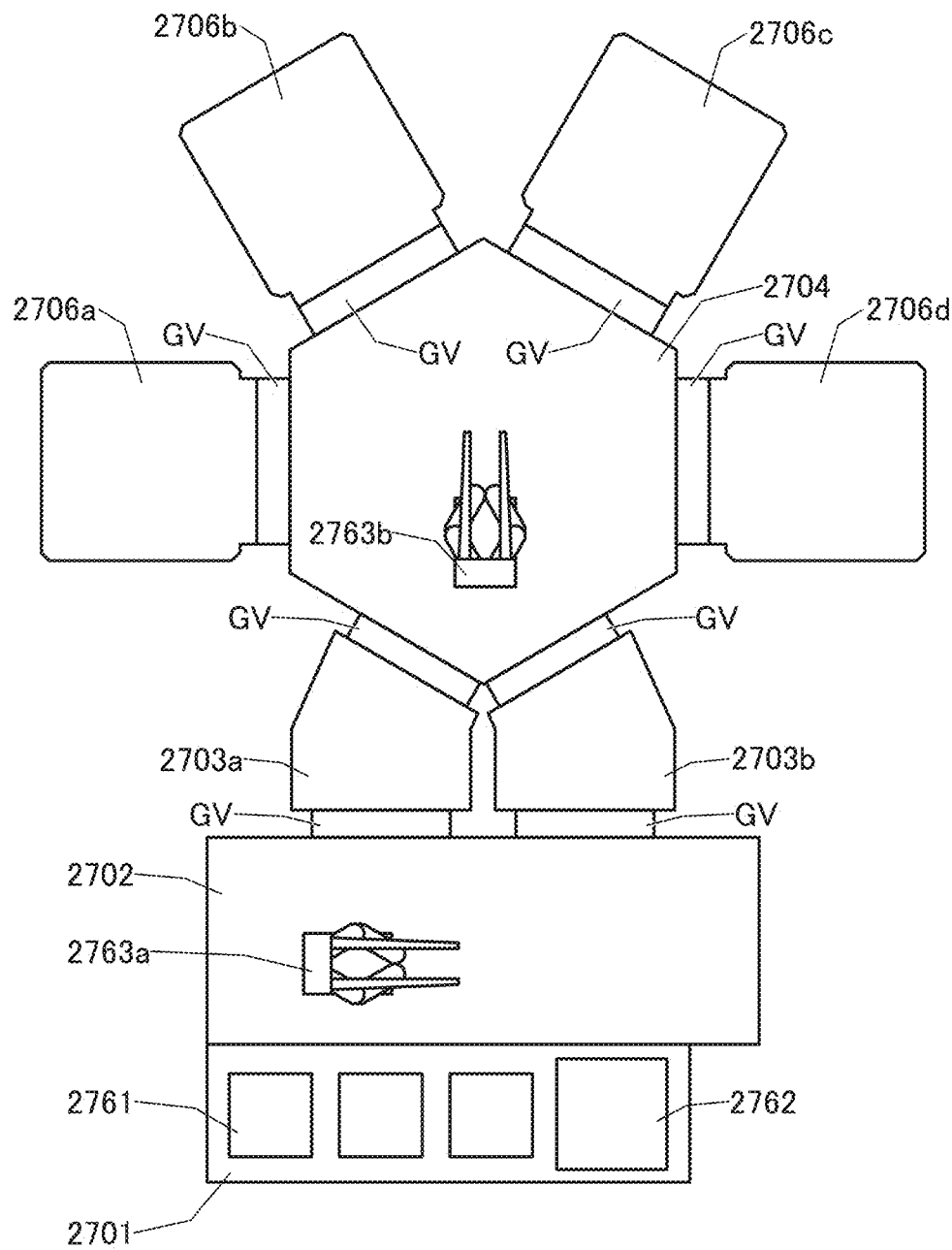
FIG. 13 is a top view illustrating a microwave treatment apparatus of one embodiment of the present invention.

FIG. 13 schematically illustrates a top view of a single wafer multi-chamber manufacturing apparatus 2700. The manufacturing apparatus 2700 includes an atmosphere-side substrate supply chamber 2701 including a cassette port 2761 for storing substrates and an alignment port 2762 for performing alignment of substrates; an atmosphere-side substrate transfer chamber 2702 through which a substrate is transferred from the atmosphere-side substrate supply chamber 2701; a load lock chamber 2703a where a substrate is carried in and the pressure inside the chamber is switched from atmospheric pressure to reduced pressure or from reduced pressure to atmospheric pressure; an unload lock chamber 2703b where a substrate is carried out and the pressure inside the chamber is switched from reduced pressure to atmospheric pressure or from atmospheric pressure to reduced pressure; a transfer chamber 2704 through which a substrate is transferred in a vacuum; a chamber 2706a; a chamber 2706b; a chamber 2706c; and a chamber 2706d.

Furthermore, the atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the chamber 2706a, the chamber 2706b, the chamber 2706c, and the chamber 2706d.

Note that gate valves GV are provided in connecting portions between the chambers so that each chamber excluding the atmosphere-side substrate supply chamber 2701 and the atmosphere-side substrate transfer chamber 2702 can be independently kept in a vacuum state. Furthermore, the atmosphere-side substrate transfer chamber 2702 is provided with a transfer robot 2763a, and the transfer chamber 2704 is provided with a transfer robot 2763b. With the transfer robot 2763a and the transfer robot 2763b, a substrate can be transferred inside the manufacturing apparatus 2700.

The back pressure (total pressure) in the transfer chamber 2704 and each of the chambers is, for example, lower than or equal to $1\times10^{-4}$ Pa, preferably lower than or equal to $3\times10^{-5}$ Pa, and further preferably lower than or equal to $1\times10^{-5}$ Pa. Furthermore, the partial pressure of a gas molecule (atom) having a mass-to-charge ratio (m/z) of 18 in the transfer chamber 2704 and each of the chambers is, for example, lower than or equal to $3\times10^{-5}$ Pa, preferably lower than or equal to $1\times10^{-5}$ Pa, and further preferably lower than or equal to $3\times10^{-6}$ Pa. Furthermore, the partial pressure of a gas molecule (atom) having m/z of 28 in the transfer chamber 2704 and each of the chambers is, for example, lower than or equal to $3\times10^{-5}$ Pa, preferably lower than or equal to $1\times10^{-5}$ Pa, and further preferably lower than or equal to $3\times10^{-6}$ Pa. Furthermore, the partial pressure of a gas molecule (atom) having m/z of 44 in the transfer chamber 2704 and each of the chambers is, for example, lower than or equal to $3\times10^{-5}$ Pa, preferably lower than or equal to $1\times10^{-5}$ Pa, and further preferably lower than or equal to $3\times10^{-6}$ Pa.

Note that the total pressure and the partial pressure in the transfer chamber 2704 and each of the chambers can be measured using a mass analyzer. For example, Qulee CGM-051, a quadrupole mass analyzer (also referred to as Q-mass) produced by ULVAC, Inc. can be used.

Furthermore, the transfer chamber 2704 and the chambers each desirably have a structure in which the amount of external leakage or internal leakage is small. For example, the leakage rate in the transfer chamber 2704 and each of the chambers is less than or equal to $3\times10^{-6}$ Pa·m³/s, preferably less than or equal to $1\times10^{-6}$ Pa·m³/s. Furthermore, for example, the leakage rate of a gas molecule (atom) having m/z of 18 is less than or equal to $1\times10^{-7}$ Pa·m³/s, preferably less than or equal to $3\times10^{-8}$ Pa·m³/s. Furthermore, for example, the leakage rate of a gas molecule (atom) having m/z of 28 is less than or equal to $1\times10^{-5}$ Pa·m³/s, preferably less than or equal to $1\times10^{-6}$ Pa·m³/s. Furthermore, for example, the leakage rate of a gas molecule (atom) having m/z of 44 is less than or equal to $3\times10^{-6}$ Pa·m³/s, preferably less than or equal to $1\times10^{-6}$ Pa·m³/s.

Note that a leakage rate can be derived from the total pressure and partial pressure measured using the above-described mass analyzer. The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or released gas from an internal member. Measures need to be taken from both aspects of external leakage and internal leakage in order that the leakage rate can be set to less than or equal to the above-described value.

For example, open/close portions of the transfer chamber 2704 and each of the chambers are preferably sealed with a metal gasket. For the metal gasket, metal covered with iron fluoride, aluminum oxide, or chromium oxide is preferably used. The metal gasket achieves higher adhesion than an O-ring and can reduce the external leakage. Furthermore, with the use of the metal covered with iron fluoride, aluminum oxide, chromium oxide, or the like, which is in the passive state, the release of gas containing impurities released from the metal gasket is inhibited, so that the internal leakage can be reduced.

Furthermore, for a member of the manufacturing apparatus 2700, aluminum, chromium, titanium, zirconium, nickel, or vanadium, which releases a small amount of gas containing impurities, is used. Furthermore, an alloy containing iron, chromium, nickel, and the like covered with the above-described material may be used. The alloy containing iron, chromium, nickel, and the like is rigid, resistant to heat, and suitable for processing. Here, when surface unevenness of the member is reduced by polishing or the like to reduce the surface area, the release of gas can be reduced.

Alternatively, the above-described member of the manufacturing apparatus 2700 may be covered with iron fluoride, aluminum oxide, chromium oxide, or the like.

The member of the manufacturing apparatus 2700 is preferably formed using only metal when possible, and in the case where a viewing window formed of quartz or the like is provided, for example, the surface is preferably thinly covered with iron fluoride, aluminum oxide, chromium oxide, or the like to inhibit release of gas.

An adsorbed substance present in the transfer chamber 2704 and each of the chambers does not affect the pressure in the transfer chamber 2704 and each of the chambers because it is adsorbed onto an inner wall or the like; however, it causes a release of gas when the transfer chamber 2704 and each of the chambers are evacuated. Thus, although there is no correlation between the leakage rate and the exhaust rate, it is important that the adsorbed substance present in the transfer chamber 2704 and each of the chambers be desorbed as much as possible and exhaust be performed in advance with the use of a pump with high exhaust capability. Note that the transfer chamber 2704 and each of the chambers may be subjected to baking to promote desorption of the adsorbed substance. By the baking, the desorption rate of the adsorbed substance can be increased about tenfold. The baking is performed at higher than or equal to 100° C. and lower than or equal to 450° C. At this time, when the adsorbed substance is removed while an inert gas is introduced into the transfer chamber 2704 and each of the chambers, the desorption rate of water or the like, which is difficult to desorb simply by exhaust, can be further increased. Note that when the inert gas to be introduced is heated to substantially the same temperature as the baking temperature, the desorption rate of the adsorbed substance can be further increased. Here, a rare gas is preferably used as the inert gas.

Alternatively, treatment for evacuating the transfer chamber 2704 and each of the chambers is preferably performed a certain period of time after a heated inert gas such as a rare gas, heated oxygen, or the like is introduced to increase the pressure in the transfer chamber 2704 and each of the chambers. The introduction of the heated gas can desorb the adsorbed substance in the transfer chamber 2704 and each of the chambers, and impurities present in the transfer chamber 2704 and each of the chambers can be reduced. Note that this treatment is effective when repeated more than or equal to 2 times and less than or equal to 30 times, preferably more than or equal to 5 times and less than or equal to 15 times. Specifically, an inert gas, oxygen, or the like at a temperature higher than or equal to 40° C. and lower than or equal to 400° C., preferably higher than or equal to 50° C. and lower than or equal to 200° C. is introduced, so that the pressure in the transfer chamber 2704 and each of the chambers can be kept to be higher than or equal to 0.1 Pa and lower than or equal to 10 kPa, preferably higher than or equal to 1 Pa and lower than or equal to 1 kPa, and further preferably higher than or equal to 5 Pa and lower than or equal to 100 Pa in the time range of 1 minute to 300 minutes, and preferably 5 minutes to 120 minutes. After that, the transfer chamber 2704 and each of the chambers are evacuated in the time range of 5 minutes to 300 minutes, preferably 10 minutes to 120 minutes.

Next, the chamber 2706b and the chamber 2706c are described with reference to a schematic cross-sectional view illustrated in FIG. 14.

The chamber 2706b and the chamber 2706c are chambers in which microwave treatment can be performed on an object, for example. Note that the chamber 2706b is different from the chamber 2706c only in the atmosphere in performing the microwave treatment. The other structures are common and thus collectively described below.

The chamber 2706b and the chamber 2706c each include a slot antenna plate 2808, a dielectric plate 2809, a substrate holder 2812, and an exhaust port 2819. Furthermore, a gas supply source 2801, a valve 2802, a high-frequency generator 2803, a waveguide 2804, a mode converter 2805, a gas pipe 2806, a waveguide 2807, a matching box 2815, a high-frequency power source 2816, a vacuum pump 2817, and a valve 2818 are provided outside the chamber 2706b and the chamber 2706c, for example.

The high-frequency generator 2803 is connected to the mode converter 2805 through the waveguide 2804. The mode converter 2805 is connected to the slot antenna plate 2808 through the waveguide 2807. The slot antenna plate 2808 is positioned in contact with the dielectric plate 2809. Furthermore, the gas supply source 2801 is connected to the mode converter 2805 through the valve 2802. Then, gas is transferred to the chamber 2706b and the chamber 2706c through the gas pipe 2806 that runs through the mode converter 2805, the waveguide 2807, and the dielectric plate 2809. Furthermore, the vacuum pump 2817 has a function of exhausting gas or the like from the chamber 2706b and the chamber 2706c through the valve 2818 and the exhaust port 2819. Furthermore, the high-frequency power source 2816 is connected to the substrate holder 2812 through the matching box 2815.

The substrate holder 2812 has a function of holding a substrate 2811. For example, the substrate holder 2812 has a function as an electrostatic chuck or a mechanical chuck for holding the substrate 2811. Furthermore, the substrate holder 2812 has a function as an electrode to which electric power is supplied from the high-frequency power source 2816. Furthermore, the substrate holder 2812 includes a heating mechanism 2813 therein and has a function of heating the substrate 2811.

As the vacuum pump 2817, a dry pump, a mechanical booster pump, an ion pump, a titanium sublimation pump, a cryopump, or a turbomolecular pump can be used, for example. Furthermore, in addition to the vacuum pump 2817, a cryotrap may be used. The use of the cryopump and the cryotrap is particularly preferable because water can be efficiently exhausted.

Furthermore, for example, the heating mechanism 2813 is a heating mechanism that uses a resistance heater or the like for heating. Alternatively, a heating mechanism that uses heat conduction or heat radiation from a medium such as a heated gas for heating may be used. For example, RTA (Rapid Thermal Annealing) such as GRTA (Gas Rapid Thermal Annealing) or LRTA (Lamp Rapid Thermal Annealing) can be used. In GRTA, heat treatment is performed using a high-temperature gas. An inert gas is used as the gas.

Furthermore, the gas supply source 2801 may be connected to a purifier through a mass flow controller. As the gas, a gas whose dew point is −80° C. or lower, preferably −100° C. or lower is preferably used. For example, an oxygen gas, a nitrogen gas, or a rare gas (an argon gas or the like) is used.

As the dielectric plate 2809, silicon oxide (quartz), aluminum oxide (alumina), or yttrium oxide (yttria) is used, for example. Furthermore, another protective layer may be further formed on a surface of the dielectric plate 2809. For the protective layer, magnesium oxide, titanium oxide, chromium oxide, zirconium oxide, hafnium oxide, tantalum oxide, silicon oxide, aluminum oxide, yttrium oxide, or the like is used. The dielectric plate 2809 is exposed to an especially high density region of high-density plasma 2810 described later; thus, provision of the protective layer can reduce the damage. Consequently, an increase in the number of particles or the like during the treatment can be inhibited.

The high-frequency generator 2803 has a function of generating a microwave of, for example, more than or equal to 0.3 GHz and less than or equal to 3.0 GHz, more than or equal to 0.7 GHz and less than or equal to 1.1 GHz, or more than or equal to 2.2 GHz and less than or equal to 2.8 GHz. The microwave generated by the high-frequency generator 2803 is propagated to the mode converter 2805 through the waveguide 2804. The mode converter 2805 converts the microwave propagated in the TE mode into a microwave in the TEM mode. Then, the microwave is propagated to the slot antenna plate 2808 through the waveguide 2807. The slot antenna plate 2808 is provided with a plurality of slot holes, and the microwave passes through the slot holes and the dielectric plate 2809. Then, an electric field is generated below the dielectric plate 2809, and the high-density plasma 2810 can be generated. In the high-density plasma 2810, ions and radicals based on the gas species supplied from the gas supply source 2801 are present. For example, oxygen radicals are present.

At this time, the quality of a film or the like over the substrate 2811 can be modified by the ions and radicals generated in the high-density plasma 2810. Note that it is preferable in some cases to apply a bias to the substrate 2811 side using the high-frequency power source 2816. As the high-frequency power source 2816, an RF (Radio Frequency) power source with a frequency of 13.56 MHz, 27.12 MHz, or the like is used, for example. The application of a bias to the substrate side allows ions in the high-density plasma 2810 to efficiently reach a deep portion of an opening portion of the film or the like over the substrate 2811.

For example, in the chamber 2706*b* or the chamber 2706*c*, oxygen radical treatment using the high-density plasma 2810 can be performed by introducing oxygen from the gas supply source 2801.

Next, the chamber 2706*a* and the chamber 2706*d* are described with reference to a schematic cross-sectional view illustrated in FIG. 15.

The chamber 2706*a* and the chamber 2706*d* are chambers in which an object can be irradiated with an electromagnetic wave, for example. Note that the chamber 2706*a* is different from the chamber 2706*d* only in the kind of the electromagnetic wave. The other structures have many common portions and thus are collectively described below.

The chamber 2706*a* and the chamber 2706*d* each include one or a plurality of lamps 2820, a substrate holder 2825, a gas inlet 2823, and an exhaust port 2830. Furthermore, a gas supply source 2821, a valve 2822, a vacuum pump 2828, and a valve 2829 are provided outside the chamber 2706*a* and the chamber 2706*d*, for example.

The gas supply source 2821 is connected to the gas inlet 2823 through the valve 2822. The vacuum pump 2828 is connected to the exhaust port 2830 through the valve 2829. The lamp 2820 is provided to face the substrate holder 2825. The substrate holder 2825 has a function of holding a substrate 2824. Furthermore, the substrate holder 2825 includes a heating mechanism 2826 therein and has a function of heating the substrate 2824.

As the lamp 2820, a light source having a function of emitting an electromagnetic wave such as visible light or ultraviolet light is used, for example. For example, a light source having a function of emitting an electromagnetic wave which has a peak in a wavelength region of longer than or equal to 10 nm and shorter than or equal to 2500 nm, longer than or equal to 500 nm and shorter than or equal to 2000 nm, or longer than or equal to 40 nm and shorter than or equal to 340 nm is used.

As the lamp 2820, a light source such as a halogen lamp, a metal halide lamp, a xenon arc lamp, a carbon arc lamp, a high-pressure sodium lamp, or a high-pressure mercury lamp is used, for example.

For example, part or the whole of electromagnetic wave emitted from the lamp 2820 is absorbed by the substrate 2824, so that the quality of a film or the like over the substrate 2824 can be modified. For example, generation or reduction of defects or removal of impurities can be performed. Note that generation or reduction of defects, removal of impurities, or the like can be efficiently performed while the substrate 2824 is heated.

Alternatively, for example, the electromagnetic wave emitted from the lamp 2820 may generate heat in the substrate holder 2825 to heat the substrate 2824. In this case, the substrate holder 2825 does not need to include the heating mechanism 2826 therein.

For the vacuum pump 2828, refer to the description of the vacuum pump 2817. Furthermore, for the heating mechanism 2826, refer to the description of the heating mechanism 2813. Furthermore, for the gas supply source 2821, refer to the description of the gas supply source 2801.

With the use of the above-described manufacturing apparatus, the quality of a film or the like can be modified while the entry of impurities into an object is inhibited.

<Modification Example of Semiconductor Device>

Examples of the semiconductor device of one embodiment of the present invention will be described below with reference to FIG. 16A to FIG. 16D.

Figure 16A:
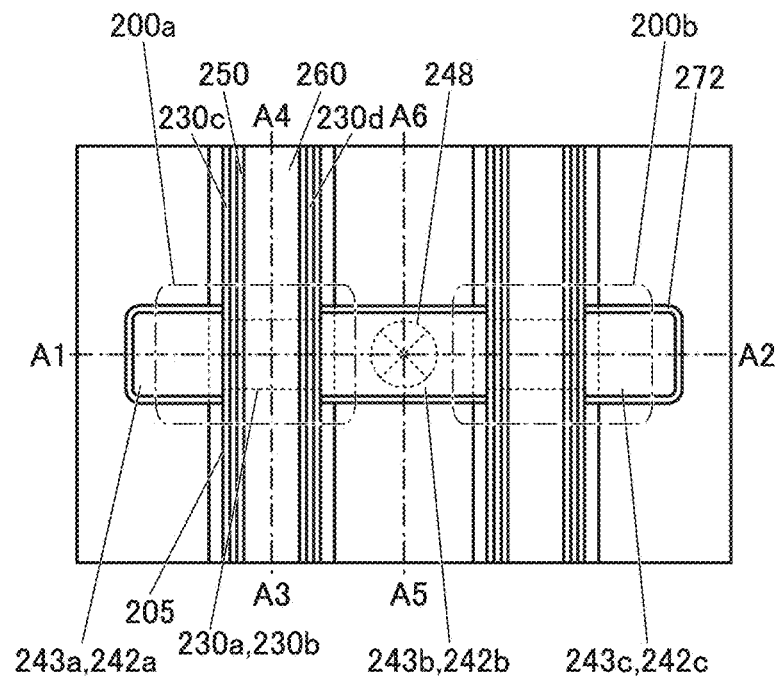
FIG. 16A, FIG. 16B, FIG. 16C, and FIG. 16D are a top view and cross-sectional views of a semiconductor device of one embodiment of the present invention.
Figure 16C:
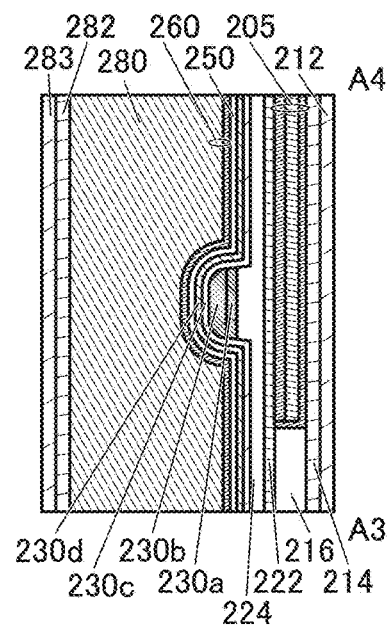
Figure 16B:
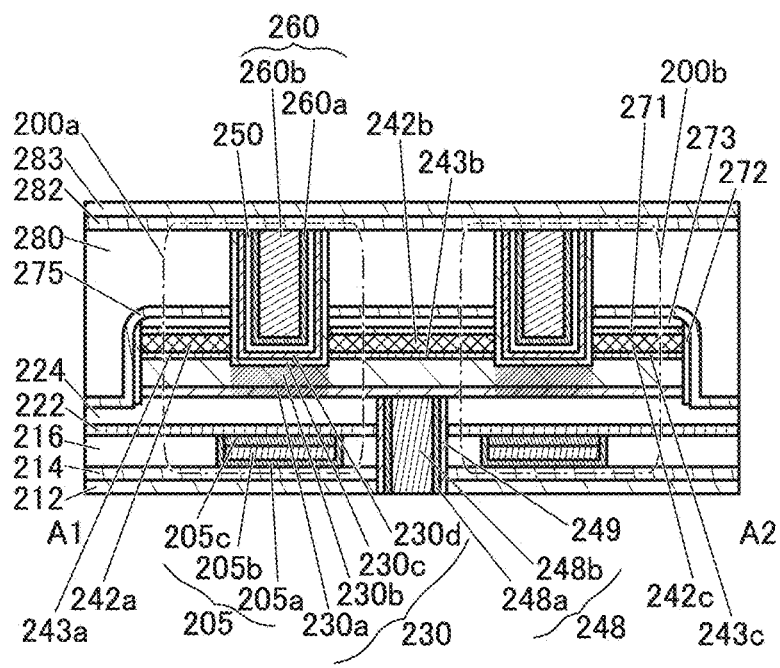
Figure 16D:
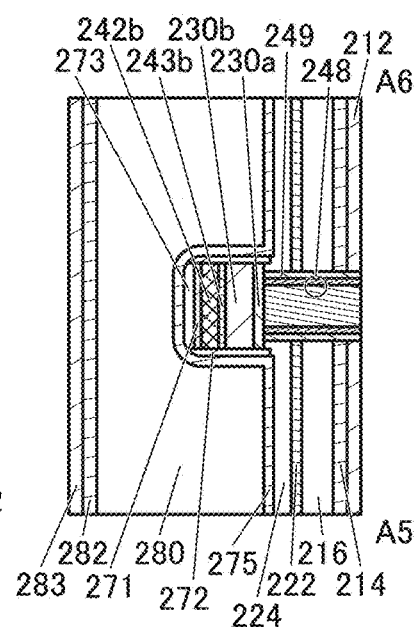

FIG. 16A is a top view of the semiconductor device. Moreover, FIG. 16B is a cross-sectional view corresponding to a portion indicated by dashed-dotted line A1-A2 in FIG. 16A. Furthermore, FIG. 16C is a cross-sectional view corresponding to a portion indicated by dashed-dotted line A3-A4 in FIG. 16A. Furthermore, FIG. 16D is a cross-sectional view corresponding to a portion indicated by dashed-dotted line A5-A6 in FIG. 16A. Note that for clarity of the drawing, some components are not shown in the top view of FIG. 16A.

In the semiconductor device shown in FIG. 16A to FIG. 16D, components having the same functions as the components included in the semiconductor device described in <Structure example of semiconductor device> are denoted by the same reference numerals. Note that the materials described in detail in <Structure example of semiconductor device> can also be used as constituent materials of the semiconductor devices in this section.

The semiconductor device illustrated in FIG. 16A to FIG. 16D is a modification example of the semiconductor device illustrated in FIG. 1A to FIG. 1D. The semiconductor device in FIG. 16A to FIG. 16D is different from the semiconductor device in FIG. 1A to FIG. 1D in including an oxide 230*c* and an oxide 230*d*. An insulator 271, an insulator 272, and an insulator 273 are included, which is also a difference.

The semiconductor device illustrated in FIG. 16A to FIG. 16D includes the oxide 230*c* over the oxide 230*b* and the oxide 230*d* over the oxide 230*c* in each of the transistor 200*a* and the transistor 200*b*. The oxide 230*c* and the oxide 230*d* are provided in the opening formed in the insulator 280 and the insulator 275. The oxide 230*c* is in contact with the top surface of the insulator 224, the side surface of the oxide 230a, the top surface and side surface of the oxide 230b, the side surface of the oxide 243, the side surface of the conductor 242, the side surface of the insulator 271, the side surface of the insulator 273, the side surface of the insulator 275, and the side surface of the e insulator 280. The uppermost portion of the oxide 230c and the uppermost portion of the oxide 230d are in contact with the insulator 282.

The oxide 230d is positioned over the oxide 230c, whereby impurities can be inhibited from diffusing into the oxide 230b or the oxide 230c from components formed over the oxide 230d. When the oxide 230d is positioned over the oxide 230c, oxygen can be inhibited from diffusing upward from the oxide 230b or the oxide 230c.

In a cross-sectional view of the transistor in the channel length direction, it is preferable that a groove portion be provided in the oxide 230b and the oxide 230c be embedded in the groove portion. At this time, the oxide 230c is provided to cover the inner wall (the side wall and the bottom surface) of the groove portion. It is preferable that the thickness of the oxide 230c be approximately the same as the depth of the groove portion. With such a structure, even when the opening in which the conductor 260 and the like are embedded is formed and a damaged region is formed on the surface of the oxide 230b at the bottom portion of the opening, the damaged region can be removed. Accordingly, defects in the electrical characteristics of the transistor 200 due to the damaged region can be reduced.

The atomic ratio of In to the element M in the metal oxide used for the oxide 230c is preferably greater than the atomic ratio of In to the metal element M in the metal oxide used for the oxide 230a or the oxide 230d.

In order to make the oxide 230c serve as a main carrier path, the atomic ratio of indium to a metal element that is a main component in the oxide 230c is preferably greater than the atomic ratio of indium to a metal element that is a main component in the oxide 230b. Furthermore, the atomic ratio of In to the element M in the oxide 230c is preferably greater than the atomic ratio of In to the element M in the oxide 230b. When a metal oxide having a high content of indium is used for a channel formation region, the on-state current of the transistor can be increased. Accordingly, when the atomic ratio of indium to a metal element that is a main component in the oxide 230c is greater than the atomic ratio of indium to a metal element that is a main component in the oxide 230b, the oxide 230c can serve as a main carrier path. The conduction band minimum of the oxide 230c is preferably remoter from the vacuum level than the conduction band minimum of each of the oxide 230a and the oxide 230b is. In other words, the electron affinity of the oxide 230c is preferably larger than the electron affinity of each of the oxide 230a and the oxide 230b. At this time, the oxide 230c serves as a main carrier path.

Specifically, for the oxide 230c, a metal oxide with a composition of In:M:Zn=4:2:3 [atomic ratio] or in the neighborhood thereof, In:M:Zn=5:1:3 [atomic ratio] or in the neighborhood thereof, or In:M:Zn=10:1:3 [atomic ratio] or in the neighborhood thereof, or indium oxide may be used.

In addition, a CAAC-OS is preferably used for the oxide 230c; the c-axis of a crystal included in the oxide 230c is preferably aligned in a direction substantially perpendicular to the formation surface or top surface of the oxide 230c. The CAAC-OS has a property of making oxygen move easily in the direction perpendicular to the c-axis. Thus, oxygen contained in the oxide 230c can be efficiently supplied to the oxide 230b.

The oxide 230d preferably contains at least one of the metal elements contained in the metal oxide used for the oxide 230c, and further preferably contains all of these metal elements. For example, it is preferable that an In-M-Zn oxide, an In—Zn oxide, or an indium oxide be used for the oxide 230c, and an In-M-Zn oxide, a M-Zn oxide, or an oxide of the element M be used for the oxide 230d. Accordingly, the density of defect states at the interface between the oxide 230c and the oxide 230d can be decreased.

The conduction band minimum of the oxide 230d is preferably closer to the vacuum level than the conduction band minimum of the oxide 230c. In other words, the electron affinity of the oxide 230d is preferably smaller than the electron affinity of the oxide 230c. In that case, a metal oxide that can be used for the oxide 230a or the oxide 230b is preferably used for the oxide 230d. At this time, the oxide 230c serves as a main carrier path.

Specifically, for the oxide 230c, a metal oxide with a composition of In:M:Zn=4:2:3 [atomic ratio] or in the neighborhood thereof, In:M:Zn=5:1:3 [atomic ratio] or in the neighborhood thereof, or In:M:Zn=10:1:3 [atomic ratio] or in the neighborhood thereof, or indium oxide may be used. For the oxide 230d, a metal oxide with a composition of In:M:Zn=1:3:4 [atomic ratio] or in the neighborhood thereof, M:Zn=2:1 [atomic ratio] or in the neighborhood thereof, M:Zn=2:5 [atomic ratio] or in the neighborhood thereof, or an oxide of the element M may be used. Note that a composition in the neighborhood includes the range of ±30% of an intended atomic ratio. Gallium is preferably used as the element M.

The oxide 230d is preferably formed using a metal oxide that inhibits diffusion or passage of oxygen more readily than the oxide 230c. Providing the oxide 230d between the insulator 250 and the oxide 230c enables oxygen to be supplied efficiently to the oxide 230b through the oxide 230c.

When the atomic ratio of In to the metal element that is a main component in the metal oxide used for the oxide 230d is smaller than the atomic ratio of In to the metal element that is a main component in the metal oxide used for the oxide 230c, diffusion of In to the insulator 250 side can be inhibited. For example, the atomic ratio of In to the element M in the oxide 230d is smaller than the atomic ratio of In to the element M in the oxide 230c. Since the insulator 250 functions as a gate insulator, the transistor exhibits poor characteristics when In enters the insulator 250 and the like. Thus, the oxide 230d provided between the oxide 230c and the insulator 250 allows the semiconductor device to have high reliability.

Note that the oxide 230c may be provided for each of the transistors 200. That is, the oxide 230c of the transistor 200 is not necessarily in contact with the oxide 230c of the transistor 200 adjacent in the channel width direction. Furthermore, the oxide 230c of the transistor 200 may be apart from the oxide 230c of the transistor 200 adjacent in the channel width direction. In other words, a structure in which the oxide 230c is not located between the transistor 200 and the transistor 200 adjacent in the channel width direction may be employed.

When the above structure is employed for the semiconductor device where a plurality of transistors 200 are arranged in the channel width direction, the oxide 230c can be independently provided for each transistor 200. Accordingly, generation of a parasitic transistor between the transistor 200 and another transistor 200 adjacent to the transistor 200 in the channel width direction can be prevented, and generation of the leakage path can be prevented. Thus, a semiconductor device that has favorable electrical characteristics and can be miniaturized or highly integrated can be provided.

The semiconductor device illustrated in FIG. 16A to FIG. 16D includes the insulator 271 over the conductor 242, the insulator 273 over the insulator 271, and the insulator 272 in contact with the side surface of the oxide 230b, the side surface of the oxide 243, and the side surface of the conductor 242.

The insulator 271 preferably functions as at least a barrier insulating film against oxygen. Thus, the insulator 271 preferably has a function of inhibiting oxygen diffusion. For example, the insulator 271 preferably has a function of further inhibiting diffusion of oxygen as compared to the insulator 280. For example, a nitride containing silicon such as silicon nitride may be used for the insulator 271.

Like the insulator 224, the insulator 273 preferably includes an excess-oxygen region or excess oxygen. The concentration of impurities such as water and hydrogen in the insulator 273 is preferably reduced. Oxide including silicon such as silicon oxide, silicon oxynitride, or the like is used as appropriate for the insulator 273, for example. When an insulator containing excess oxygen is provided in contact with the insulator 250, oxygen diffused into the oxide 230 through the insulator 250 reduces the oxygen vacancies in the oxide 230 and the reliability of the transistor 200 can be improved.

The insulator 272 preferably functions as at least a barrier insulating film against oxygen. Thus, the insulator 272 preferably has a function of inhibiting oxygen diffusion. For example, the insulator 272 preferably has a function of further inhibiting diffusion of oxygen as compared to the insulator 280. For example, a nitride containing silicon such as silicon nitride is used for the insulator 272.

When the above insulator 271 and the insulator 272 are provided, the conductor 242 can be surrounded with the insulators having a barrier property against oxygen. That is, diffusion to the conductor 242 of oxygen supplied at the deposition of the insulator 275 or oxygen contained in the insulator 273 can be inhibited. This can inhibit the increase in the resistivity of the conductor 242 due to direct oxidation with oxygen supplied at the deposition of the insulator 275 or oxygen contained in the insulator 273 and the reduction of on-state current.

FIG. 1B and the like show a structure in which the insulator 272 is in contact with the side surfaces of the oxide 230a, the oxide 230b, the oxide 243, the conductor 242, the insulator 271, and the insulator 273; the insulator 272 is in contact with at least the side surfaces of the insulator 271 and the conductor 242. For example, in some cases, the insulator 272 is in contact with the side surfaces of the oxide 230a, the oxide 230b, the oxide 243, the conductor 242, and the insulator 271, and not in contact with the insulator 273. In that case, the side surface of the insulator 273 is in contact with the insulator 275.

One embodiment of the present invention can provide a semiconductor device that can be miniaturized or highly integrated. Another embodiment of the present invention can provide a semiconductor device with high storage capacity. Another embodiment of the present invention can provide a semiconductor device in which variation of transistor characteristics is small. Another embodiment of the present invention can provide a semiconductor device with favorable reliability. Another embodiment of the present invention can provide a semiconductor device having favorable electrical characteristics. Another embodiment of the present invention can provide a semiconductor device with a high on-state current. Another embodiment of the present invention can provide a semiconductor device that can be miniaturized or highly integrated. Another embodiment of the present invention can provide a semiconductor device with low power consumption. Another embodiment of the present invention can provide a novel semiconductor device.

The structure, method, and the like described in this embodiment can be used in an appropriate combination with other structures, methods, and the like described in this embodiment or the other embodiments.

Embodiment 2

In this embodiment, one mode of a semiconductor device that can be used as a memory device is described with reference to FIG. 17 to FIG. 22.

[Memory Device 1]

Figures 17A, 17B:
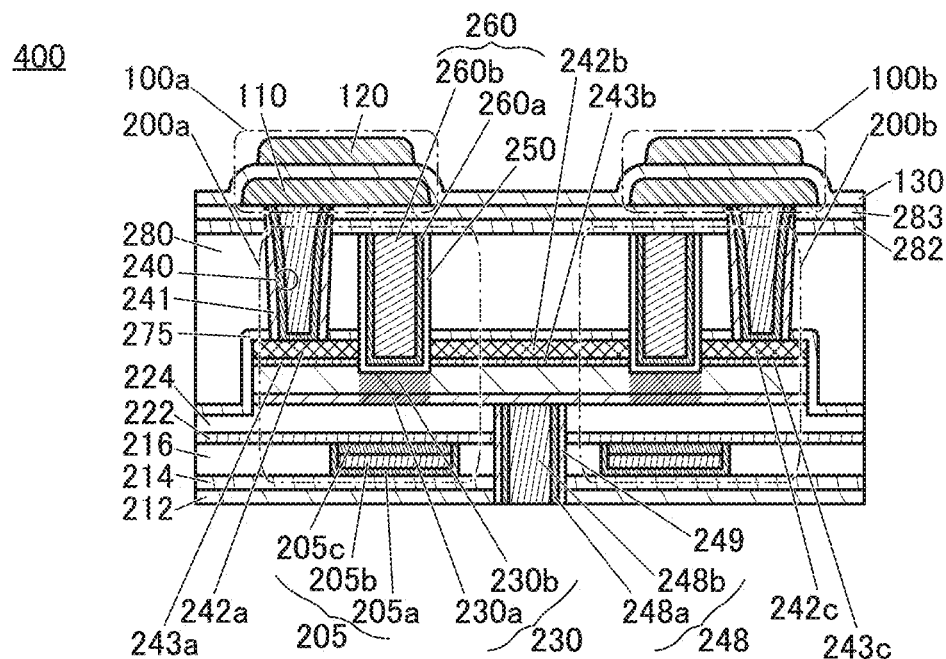
FIG. 17A and FIG. 17B are cross-sectional views of a semiconductor device of one embodiment of the present invention.

FIG. 17A shows an example of a semiconductor device (a memory device) of one embodiment of the present invention. In the semiconductor device illustrated in FIG. 17A, a capacitor 100a is positioned over the transistor 200a and a capacitor 100b is positioned over the transistor 200b. Hereinafter, the capacitor 100a and the capacitor 100b are collectively referred to as a capacitor 100, in some cases.

The transistor 200a and the transistor 200b described in the above embodiment can be used as the transistor 200a and the transistor 200b. Specifically, the semiconductor device illustrated in FIG. 17A has a structure in which the capacitor 100a and the capacitor 100b are provided over the semiconductor device illustrated in FIG. 1. Note that the above descriptions for the transistor 200a and the transistor 200b described in the above embodiment can be referred to for the structures of the transistor 200a and the transistor 200b.

One of the source and the drain of the transistor 200a is electrically connected to a first electrode of the capacitor 100a; the other of the source and the drain of the transistor 200a is electrically connected to one of the source and the drain of the transistor 200b; and the other of the source and the drain of the transistor 200b is electrically connected to a first electrode of the capacitor 100b. The thus connected transistor 200a and capacitor 100a, and transistor 200b and capacitor 100b, can function as memory cells of the memory device. Thus, the semiconductor device including the transistor 200a, the transistor 200b, the capacitor 100a, and the capacitor 100b as illustrated in FIG. 17A is referred to as a memory unit 400 in some cases.

In the memory unit 400, the conductor 248 is provided below the oxide 230, whereby parasitic capacitance in the conductor 248 and the bit line provided in contact with the conductor 248 can be reduced. This reduces the electrostatic capacitance required for the capacitor 100, which diminishes the size of the capacitor 100. For example, the capacitor 100a overlaps with the transistor 200a, and the capacitor 100b overlaps with the transistor 200b. A downsizing of the capacitor 100 in this manner allows the memory unit 400 to be miniaturized or highly integrated. The miniaturized or highly integrated memory unit 400 leads to a semiconductor device with high storage capacity.

Since the conductor 248 is provided below the oxide 230 in the memory unit 400, the capacitor 100a and the capacitor 100b can be prevented from interfering with an extracting plug of the memory unit 400. For this reason, the electrostatic capacitance of the capacitor 100a and the capacitor 100b can be increased without any increase in the area occupied by the memory unit 400.

The capacitor 100 is provided over the insulator 283. The capacitor 100 includes a conductor 110 functioning as a first electrode, a conductor 120 functioning as a second electrode, and an insulator 130 functioning as a dielectric.

For the conductor 110 and the conductor 120, a conductor that can be used for the conductor 205 or the like can be used. Although the conductor 110 and the conductor 120 having a single-layer structure are shown in FIG. 17, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

For the insulator 130, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like is used, and a stacked layer or a single layer can be provided.

For example, for the insulator 130, a stacked-layer structure using a material with high dielectric strength such as silicon oxynitride and a high permittivity (high-k) material is preferably used. In the capacitor 100 having such a structure, a sufficient capacitance can be ensured owing to the high permittivity (high-k) insulator, and the dielectric strength can be increased owing to the insulator with high dielectric strength, so that the electrostatic breakdown of the capacitor 100 can be inhibited.

As the insulator of a high permittivity (high-k) material (a material having a high relative permittivity), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

Examples of a material with high dielectric strength (a material having a low relative permittivity) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

The conductor 240 functioning as a plug to electrically connect the transistor 200a to the capacitor 100a and as a plug to electrically connect the transistor 200b to the capacitor 100b is provided.

As illustrated in FIG. 17A, the conductor 240 provided between the transistor 200a and the capacitor 100a has a bottom surface in contact with the conductor 242a and a top surface in contact with the conductor 110 of the capacitor 100a. In addition, the conductor 240 provided between the transistor 200b and the capacitor 100b has a bottom surface in contact with the conductor 242c and a top surface in contact with the conductor 110 of the capacitor 100b. Furthermore, the insulator 241 is preferably provided in contact with a side surface of the conductor 240 functioning as a plug.

The insulator 241 is provided in contact with the inner wall of an opening in the insulator 275, the insulator 280, the insulator 282, and the insulator 283; a first conductor of the conductor 240 is provided in contact with the side surface of the insulator 241; and a second conductor of the conductor 240 is provided on the inner side thereof. Note that although the first conductor of the conductor 240 and the second conductor of the conductor 240 are stacked in FIG. 17, the structure is not limited thereto. For example, the conductor 240 may be provided as a single layer or to have a stacked-layer structure of three or more layers.

For the conductor 240, a conductive material containing tungsten, copper, or aluminum as its main component is preferably used. In addition, the conductor 240 may have a stacked-layer structure. In the case where the conductor 240 has a stacked-layer structure, a conductive material having a function of inhibiting passage of impurities such as water and hydrogen is preferably used for a conductor in contact with the insulator 283, the insulator 282, the insulator 280, and the insulator 275. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Thus, impurities such as water and hydrogen contained in a layer above the insulator 283 can be inhibited from entering the oxide 230 through the conductor 240.

For the insulator 241, for example, an insulator such as silicon nitride, aluminum oxide, or silicon nitride oxide may be used. Since the insulator 241 are provided in contact with the insulator 283, the insulator 282, and the insulator 275, impurities such as water and hydrogen contained in the insulator 280 or the like can be inhibited from entering the oxide 230 through the conductor 240. In particular, silicon nitride is suitable because of having a high barrier property against hydrogen. Furthermore, oxygen contained in the insulator 280 can be prevented from being absorbed by the conductor 240.

As illustrated in FIG. 17B, the memory unit 400 and the memory unit 401 having a structure similar to that of the memory unit 400 may be arranged in the channel length direction.

In the semiconductor device illustrated in FIG. 17B, the insulator 210 is provided below the insulator 212, and a conductor 288 is provided below the insulator 210. The top surface of the conductor 288 is in contact with the bottom surface of the conductor 248 of the memory unit 400 and the memory unit 401. For the insulator 212, an insulator that can be used for the insulator 280 can be used. For the conductor 288, a conductor that can be used for the conductor 205 can be used.

The conductor 288 functions as a wiring. In other words, the memory unit 400 and the memory unit 401 are electrically connected to the conductor 288, which functions as a wiring, through the conductor 248.

Here, the conductor 288 functioning as a bit line and the conductor 260 functioning as a word line are preferably arranged to be perpendicular to each other. The transistor 200 and the capacitor 100 are formed in a region where the conductor 288 and the conductor 260 intersect with each other, and memory cells each including the transistor 200 and the capacitor 100 are arranged in a matrix.

In this manner, the memory units are arranged in a matrix in the same layer, whereby a cell array (also referred to as a memory unit layer) can be formed. With this structure of the cell array, the space between the adjacent cells can be reduced; thus, the projected area of the cell array can be reduced and high integration can be achieved.

[Memory Device 2]

Figure 18:
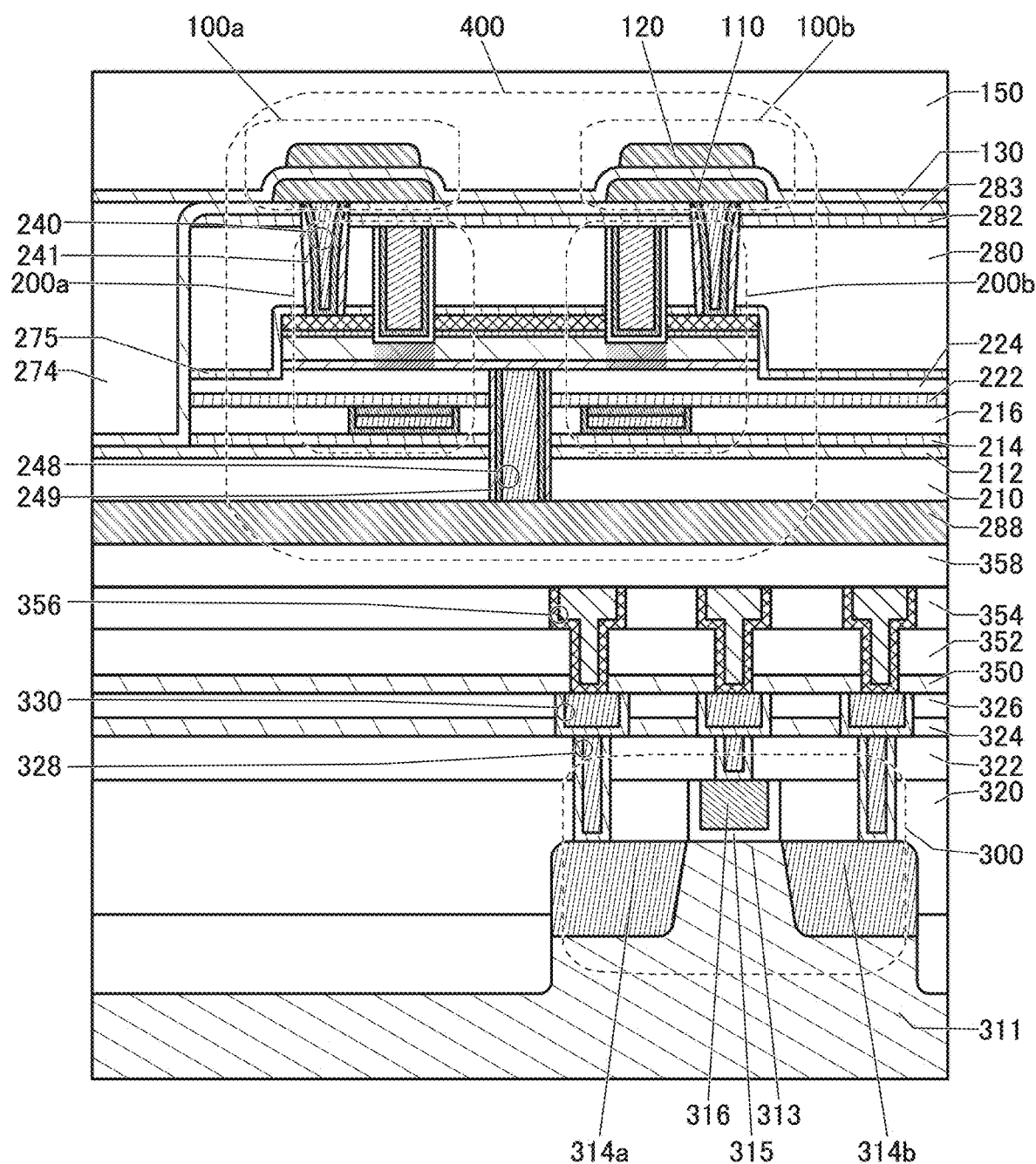
FIG. 18 is a cross-sectional view of a structure of a memory device of one embodiment of the present invention.

Next, FIG. 18 shows an example of the semiconductor device (memory device) of one embodiment of the present invention. In the semiconductor device of one embodiment of the present invention, the memory unit 400 illustrated in FIG. 17A is provided above a transistor 300. Specifically, the transistor 200a and the transistor 200b are provided above the transistor 300, and the capacitor 100a and the capacitor 100b are provided above the transistor 200a and the transistor 200b. Note that as the capacitor 100 and the transistor 200, the capacitor 100 and the transistor 200 described above can be used and can be referred to for the details of the structures.

The transistor 200 is a transistor in which a channel is formed in a semiconductor layer containing an oxide semiconductor. The off-state current of the transistor 200 is low; thus, by using the transistor 200 in a memory device, stored data can be retained for a long time. In other words, such a memory device does not require refresh operation or has extremely low frequency of the refresh operation, which leads to a sufficient reduction in power consumption of the memory device.

As described in the above embodiment, a metal oxide such as an In-M-Zn oxide can be deposited on a substrate by a sputtering method or the like. Hence, the memory unit 400 including the transistor 200, the capacitor 100, and the like can be provided over a driver circuit composed of the transistor 300 formed on a silicon substrate, for example. This reduces the area occupied by the peripheral circuit in one chip and increases the area occupied by the memory cell array, resulting in an increase in the storage capacity of a semiconductor device.

With the memory device shown in FIG. 18, a memory cell array can be formed by a matrix arrangement.

<Transistor 300>

The transistor 300 is provided on a substrate 311 and includes a conductor 316 functioning as a gate, an insulator 315 functioning as a gate insulator, a semiconductor region 313 formed of part of the substrate 311, and a low-resistance region 314a and a low-resistance region 314b functioning as a source region and a drain region. The transistor 300 may be a p-channel transistor or an n-channel transistor.

In the transistor 300 shown in FIG. 18, the semiconductor region 313 (part of the substrate 311) in which a channel is formed has a protruding shape. In addition, the conductor 316 is provided to cover the side surface and the top surface of the semiconductor region 313 with the insulator 315 therebetween. Note that a material adjusting the work function may be used for the conductor 316. Such a transistor 300 is also referred to as a FIN-type transistor because it utilizes a protruding portion of a semiconductor substrate. Note that an insulator functioning as a mask for forming the protruding portion may be included in contact with an upper portion of the protruding portion. Furthermore, although the case where the protruding portion is formed by processing part of the semiconductor substrate is described here, a semiconductor film having a protruding shape may be formed by processing an SOI substrate.

The transistor 300 shown in FIG. 18 is an example and the structure is not limited thereto; an appropriate transistor is used in accordance with a circuit structure or a driving method.

<Wiring Layer>

Wiring layers provided with an interlayer film, a wiring, a plug, and the like may be provided between the components. In addition, a plurality of wiring layers can be provided in accordance with design. Here, a plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

For example, an insulator 320, an insulator 322, an insulator 324, and an insulator 326 are sequentially stacked over the transistor 300 as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as a plug or a wiring.

The insulators functioning as interlayer films may also function as planarization films that cover uneven shapes therebelow. For example, the top surface of the insulator 322 may be planarized by planarization treatment using a chemical mechanical polishing (CMP) method or the like to increase planarity.

A wiring layer may be provided over the insulator 326 and the conductor 330. For example, in FIG. 18, an insulator 350, an insulator 352, and an insulator 354 are stacked sequentially. Furthermore, a conductor 356 is formed in the insulator 350, the insulator 352, and the insulator 354. The conductor 356 functions as a plug or a wiring.

An insulator 358 is provided over the insulator 354 and the conductor 356, and the conductor 288 functioning as a wiring is provided over the insulator 358. The insulator 210 is provided over the conductor 288. Over the insulator 210, the insulator 212, the insulator 214, the insulator 216, the insulator 222, the insulator 224, the insulator 280, the insulator 282, and the insulator 283 described in the above embodiment are provided. In these insulators, the transistor 200a and the transistor 200b are formed.

The conductor 248 and the insulator 249 are embedded in the insulator 210, the insulator 212, the insulator 214, the insulator 216, the insulator 222, and the insulator 224. The conductor 248 is provided in contact with the top surface of the conductor 288.

As described above, the conductor 240 functioning as a plug is provided in contact with the top surface of the conductor 242. The insulator 241 is provided in contact with a side surface of the conductor 240 functioning as a plug. Over the insulator 283 and the conductor 240, the conductor 110 is provided in contact with the conductor 240. The insulator 274 is provided over the insulator 283 in a region that does not overlap with the insulator 280.

The capacitor 100a and the capacitor 100b described above are formed over the insulator 283. An insulator 150 is provided over the conductor 120 and the insulator 130 which are included in the capacitor 100.

As an insulator that can be used for an interlayer film, an insulating oxide, an insulating nitride, an insulating oxynitride, an insulating nitride oxide, an insulating metal oxide, an insulating metal oxynitride, an insulating metal nitride oxide, or the like is given.

For example, when a material having a low relative permittivity is used for the insulator functioning as an interlayer film, parasitic capacitance generated between wirings can be reduced. Thus, a material is preferably selected depending on the function of an insulator.

For example, the insulator 150, the insulator 274, the insulator 210, the insulator 358, the insulator 352, the insulator 354, and the like preferably include an insulator having a low relative permittivity. For example, the insulator preferably includes silicon nitride oxide, silicon nitride, silicon oxide to which fluorine is added, silicon oxide to which carbon is added, silicon oxide to which carbon and nitrogen are added, porous silicon oxide, a resin, or the like.

Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

When a transistor using an oxide semiconductor is surrounded by an insulator having a function of inhibiting passage of oxygen and impurities such as hydrogen, the electrical characteristics of the transistor can be stable. Thus, the insulator having a function of inhibiting passage of oxygen and impurities such as hydrogen can be used for the insulator 283, the insulator 282, the insulator 214, the insulator 212, the insulator 350, and the like.

As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

As the conductor that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electrical conductivity, typified by polycrystalline silicon containing an impurity element such as phosphorus, or silicide such as nickel silicide may be used.

For example, for the conductor 328, the conductor 330, the conductor 356, the conductor 288, the conductor 110, the conductor 120, and the like, a single-layer structure or a stacked-layer structure using a conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is preferable to use tungsten. Alternatively, it is preferable to form the plugs and the wirings with a low-resistance conductive material such as aluminum or copper. The use of a low-resistance conductive material can reduce wiring resistance.

<Wiring or Plug in Layer Provided with Oxide Semiconductor>

In the case where an oxide semiconductor is used in the transistor 200, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, the insulator 241 is preferably provided between the insulator 280 containing excess oxygen and the conductor 240 in FIG. 18. Since the insulator 241 is provided in contact with the insulator 275, the insulator 282, and the insulator 283, the insulator 224 and the transistor 200 can be sealed with the insulators having a barrier property.

That is, the insulator 241 can inhibit excess oxygen contained in the insulator 280 from being absorbed by the conductor 240. In addition, diffusion of hydrogen, which is an impurity, into the transistor 200 through the conductor 240 can be inhibited when the insulator 241 is provided.

The insulator 241 is preferably formed using an insulating material having a function of inhibiting diffusion of impurities such as water and hydrogen and oxygen. For example, silicon nitride, silicon nitride oxide, aluminum oxide, hafnium oxide, or the like is preferably used. In particular, silicon nitride is preferably used because silicon nitride has a high barrier property against hydrogen. Other than that, a metal oxide such as magnesium oxide, gallium oxide, germanium oxide, yttrium oxide, zirconium oxide, lanthanum oxide, neodymium oxide, or tantalum oxide can be used, for example.

As illustrated in FIG. 18, the insulator 280 and the like may be patterned and the insulator 212 and the insulator 283 may be in contact with each other. In other words, the transistor 200 may be sealed with the insulator 212, the insulator 214, the insulator 282, and the insulator 283. Such a structure can inhibit entry of hydrogen contained in the insulator 274, the insulator 150, or the like into the insulator 280 or the like.

Here, the conductor 240 penetrates the insulator 283 and the insulator 282; however, as described above, the insulator 241 is provided in contact with the conductor 240. This can reduce the amount of hydrogen entering the inside of the insulator 212, the insulator 214, the insulator 282, and the insulator 283 through the conductor 240. In this manner, the transistor 200 is sealed with the insulator 212, the insulator 214, the insulator 282, the insulator 283, and the insulator 241, so that impurities such as hydrogen contained in the insulator 274 or the like can be inhibited from entering from the outside.

<Dicing Line>

A dicing line (sometimes referred to as a scribe line, a dividing line, or a cutting line) which is provided when a large-sized substrate is divided into semiconductor elements so that a plurality of semiconductor devices are each formed in a chip form is described below. Examples of a dividing method include the case where a groove (a dicing line) for dividing the semiconductor elements is formed on the substrate, and then the substrate is cut along the dicing line to divide (split) it into a plurality of semiconductor devices.

For example, as shown in FIG. 18, a region in which the insulator 283 and the insulator 212 are in contact with each other is preferably designed to overlap with the dicing line. In other words, an opening is provided in the insulator 282, the insulator 280, the insulator 275, the insulator 224, the insulator 222, the insulator 216, and the insulator 214 in the vicinity of a region to be the dicing line that is provided on an outer edge of the plurality of memory units 400.

Thus, in the opening provided in the insulator 282, the insulator 280, the insulator 275, the insulator 224, the insulator 222, the insulator 216, and the insulator 214, the insulator 212 is in contact with the insulator 283. For example, the insulator 212 and the insulator 283 may be formed using the same material and the same method. When the insulator 212 and the insulator 283 are formed using the same material and the same method, the adhesion therebetween can be increased. For example, silicon nitride is preferably used.

With such a structure, the transistors 200 can be surrounded by the insulator 212, the insulator 214, the insulator 282, and the insulator 283. Since at least one of the insulator 212, the insulator 214, the insulator 282, and the insulator 283 has a function of inhibiting diffusion of oxygen, hydrogen, and water, even when the substrate is divided into circuit regions each of which is provided with the semiconductor elements described in this embodiment to be processed into a plurality of chips, entry and diffusion of impurities such as hydrogen or water from the direction of the side surface of the divided substrate to the transistor 200 can be inhibited.

With the structure, excess oxygen in the insulator 280 and the insulator 224 can be prevented from diffusing to the outside. Accordingly, excess oxygen in the insulator 280 and the insulator 224 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, the transistor 200 can have a small variation in the electrical characteristics and higher reliability.

Figure 19:
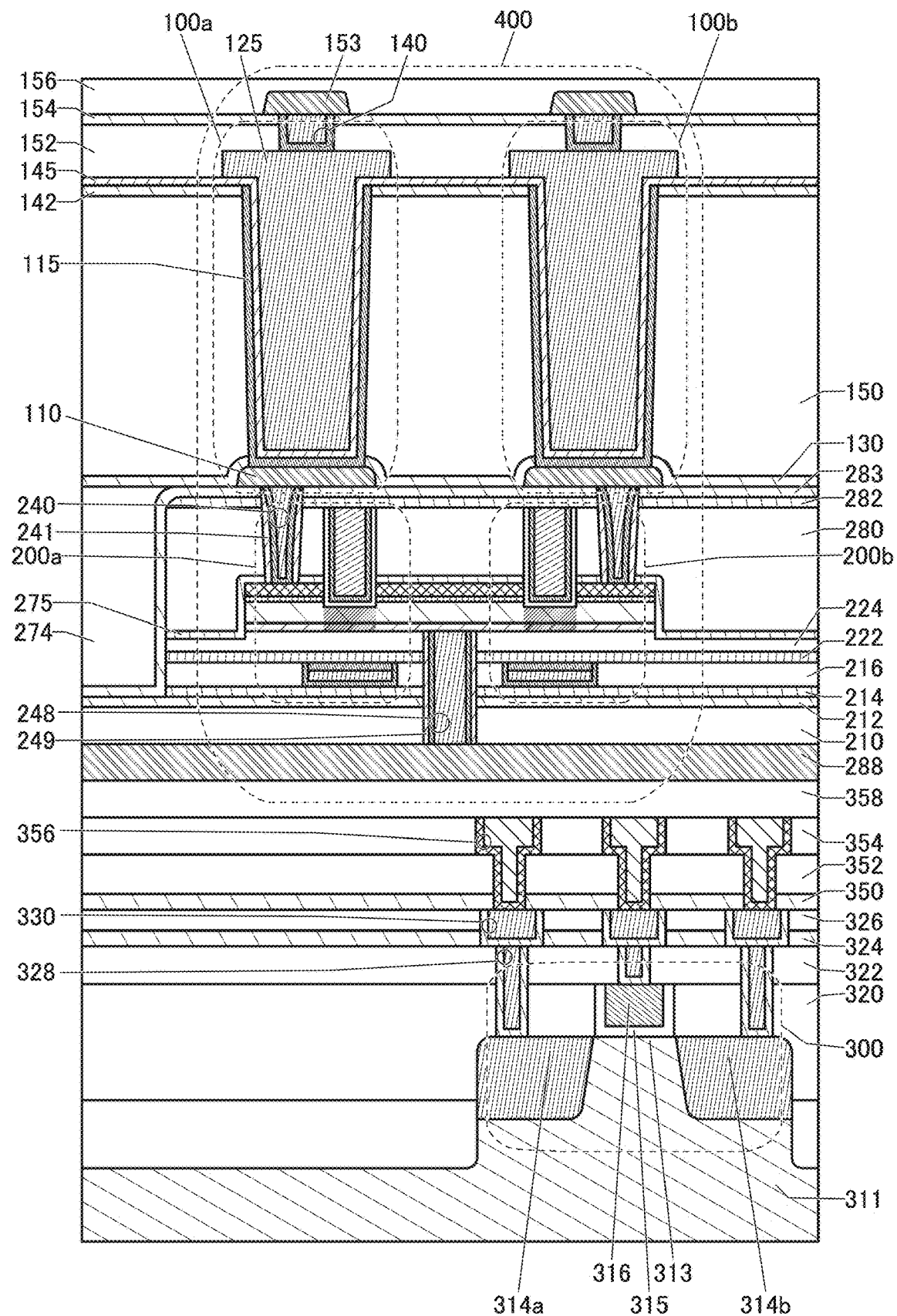
FIG. 19 is a cross-sectional view of a structure of a memory device of one embodiment of the present invention.

Note that although the capacitor 100a and the capacitor 100b of the memory device illustrated in FIG. 17 and FIG. 18 have a planar shape, the memory device described in this embodiment is not limited thereto. For example, the capacitor 100a and the capacitor 100b may have a cylindrical shape, as illustrated in FIG. 19. Note that the structure below and including the insulator 150 of a memory device illustrated in FIG. 19 is similar to that of the semiconductor device shown in FIG. 18.

The capacitor 100a and the capacitor 100b illustrated in FIG. 19 each include the insulator 150 over the insulator 130, an insulator 142 over the insulator 150, a conductor 115 positioned in an opening formed in the insulator 150 and the insulator 142, an insulator 145 over the conductor 115 and the insulator 142, a conductor 125 over the insulator 145, and an insulator 152 over the conductor 125 and the insulator 145. Here, at least parts of the conductor 115, the insulator 145, and the conductor 125 are positioned in the two openings formed in the insulator 150 and the insulator 142. An insulator 154 is positioned over the insulator 152, and a conductor 153 and an insulator 156 are positioned over the insulator 154. A conductor 140 is provided in an opening formed in the insulator 152 and the insulator 154.

The conductor 115 functions as a lower electrode of the capacitor 100, the conductor 125 functions as an upper electrode of the capacitor 100, and the insulator 145 functions as a dielectric of the capacitor 100. The capacitor 100 has a structure in which the upper electrode and the lower electrode face each other with the dielectric positioned therebetween on the side surface as well as the bottom surface of the opening in the insulator 150 and the insulator 142; thus, the capacitance per unit area can be increased. Thus, the deeper the opening is, the larger the capacitance of the capacitor 100 can be. Increasing the capacitance per unit area of the capacitor 100 in this manner can promote miniaturization or higher integration of the semiconductor device.

An insulator that can be used for the insulator 280 can be used for the insulator 152. The insulator 142 preferably functions as an etching stopper at the time of forming the opening in the insulator 150 and is formed using an insulator that can be used for the insulator 214.

The shape of the opening formed in the insulator 150 and the insulator 142 when seen from above may be a quadrangular shape, a polygonal shape other than a quadrangular shape, a polygonal shape with rounded corners, or a circular shape including an elliptical shape. Here, the area where the opening and the transistor 200 overlap with each other is preferably large in the top view. Such a structure can reduce the area occupied by the semiconductor device including the capacitor 100 and the transistor 200.

The conductor 115 is positioned in contact with the opening formed in the insulator 142 and the insulator 150. The top surface of the conductor 115 is preferably substantially level with the top surface of the insulator 142. Furthermore, the bottom surface of the conductor 115 is in contact with the conductor 110 through an opening in the insulator 130. The conductor 115 is preferably deposited by an ALD method, a CVD method, or the like; for example, a conductor that can be used for the conductor 205 is used.

The insulator 145 is positioned to cover the conductor 115 and the insulator 142. The insulator 145 is preferably deposited by an ALD method or a CVD method, for example. The insulator 145 can be provided to have stacked layers or a single layer using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 145, an insulating film in which zirconium oxide, aluminum oxide, and zirconium oxide are stacked in this order can be used, for example.

For the insulator 145, a material with s high dielectric strength, such as silicon oxynitride, or a high permittivity (high-k) material is preferably used. Alternatively, a stacked-layer structure using a material with a high dielectric strength and a high permittivity (high-k) material may be employed.

As an insulator of a high permittivity (high-k) material (a material having a high relative permittivity), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, and the like can be given. The use of such a high-k material can ensure sufficient capacitance of the capacitor 100 even when the insulator 145 has a large thickness. When the insulator 145 has a large thickness, leakage current generated between the conductor 115 and the conductor 125 can be inhibited.

Examples of a material with a high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride ($SiN_x$) deposited by an ALD method, silicon oxide ($SiO_x$) deposited by a PEALD method, and silicon nitride ($SiN_x$) deposited by an ALD method are stacked in this order. The use of such an insulator with a high dielectric strength can increase the dielectric strength and inhibit electrostatic breakdown of the capacitor 100.

The conductor 125 is positioned to fill the opening formed in the insulator 142 and the insulator 150. The conductor 125 is electrically connected to the conductor 153 functioning as a wiring through the conductor 140. The conductor 125 is preferably deposited by an ALD method, a CVD method, or the like; for example, a conductor that can be used for the conductor 205 is used.

The conductor 153 is provided over an insulator 154 and is covered with an insulator 156. The conductor 153 is formed using a conductor that can be used for the conductor 110, and the insulator 156 is formed using an insulator that can be used for the insulator 152. Here, the conductor 153 is in contact with the top surface of the conductor 140.

[Memory Device 3]

Figure 20A:
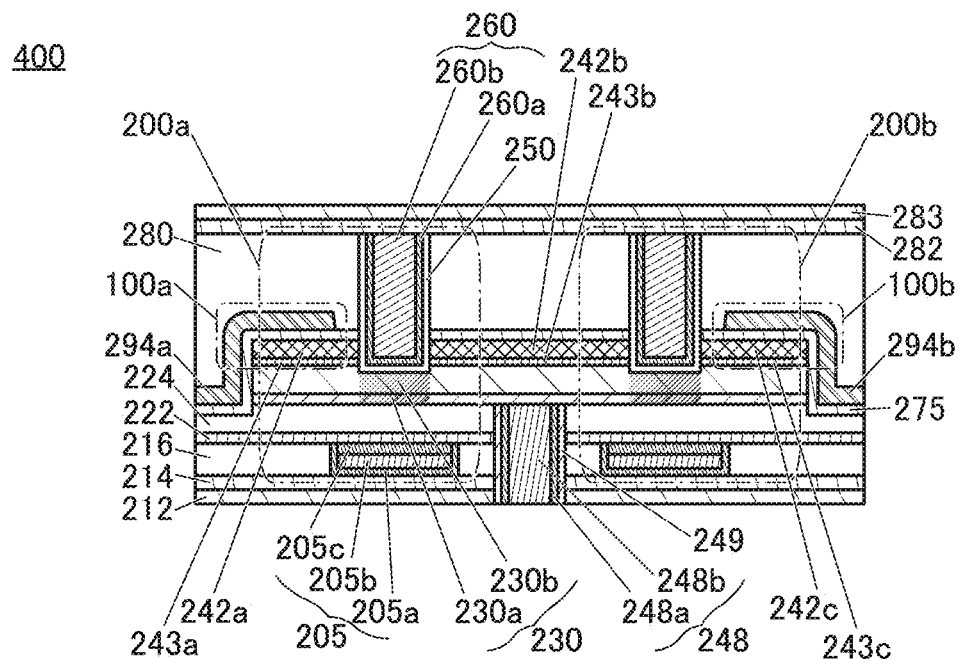
FIG. 20A and FIG. 20B are cross-sectional views of a semiconductor device of one embodiment of the present invention.
Figure 20B:
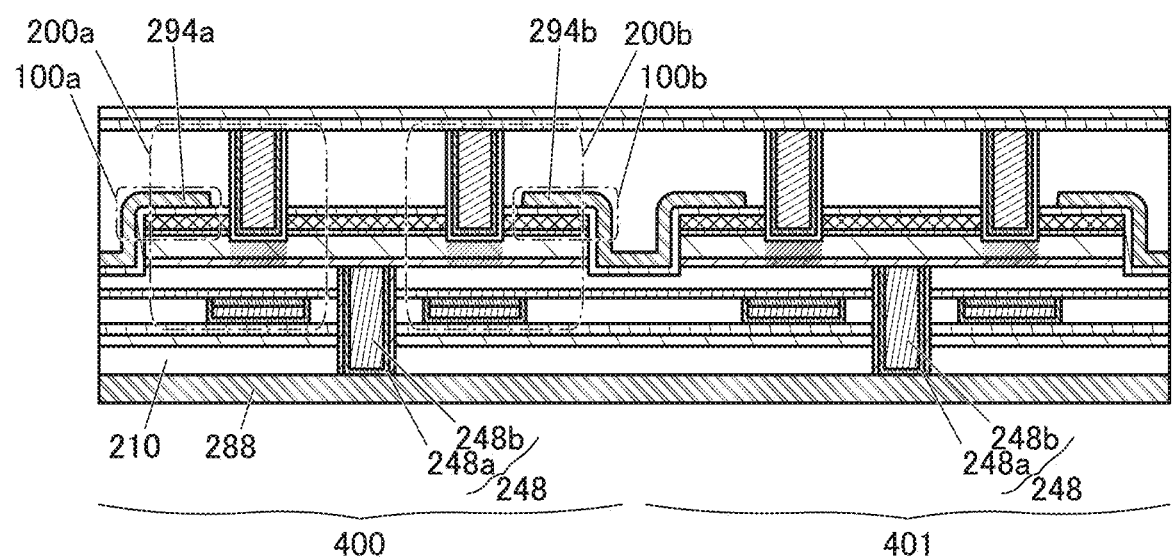
Figure 21:
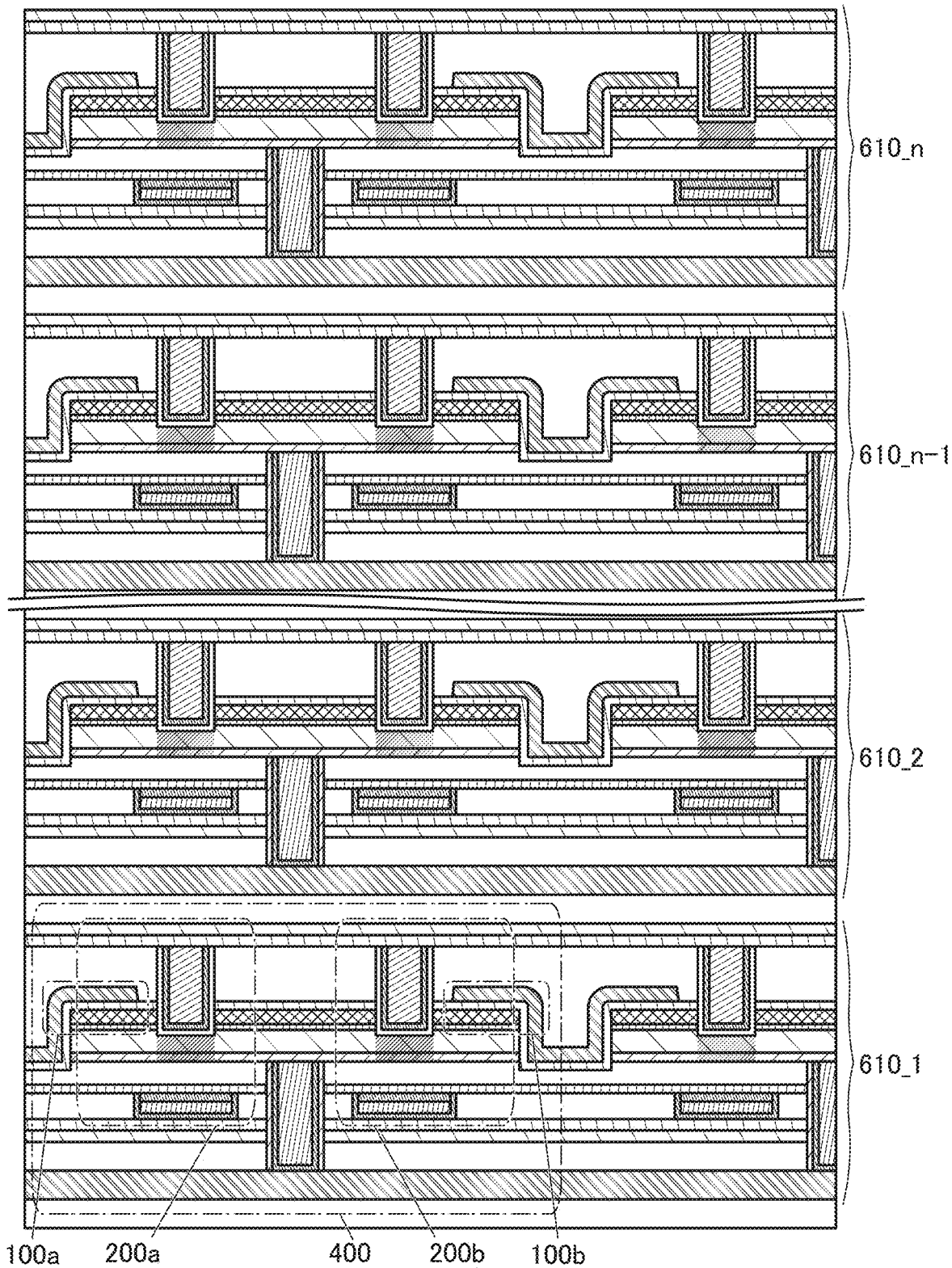
FIG. 21 is a cross-sectional view of a semiconductor device of one embodiment of the present invention.

FIG. 20 and FIG. 21 show an example of the semiconductor device (memory device) of one embodiment of the present invention.

The memory unit 400 illustrated in FIG. 20A is different from the memory unit 400 illustrated in FIG. 17A in the shapes of the capacitor 100a and the capacitor 100b.

The capacitor 100a includes the conductor 242a, the insulator 275 provided to cover the conductor 242a, and a conductor 294a over the insulator 275. The capacitor 100b includes the conductor 242c, the insulator 275 provided to cover the conductor 242c, and a conductor 294b over the insulator 275. In other words, the capacitor 100a and the capacitor 100b each form a MIM (Metal-Insulator-Metal) capacitor.

One of a pair of electrodes included in the capacitor 100, i.e., the conductor 242, can also serve as the source electrode or the drain electrode of the transistor 200. The dielectric layer included in the capacitor 100 can also serve as a protective layer provided in the transistor 200, i.e., the insulator 275. Thus, the manufacturing process of the capacitor 100 can also serve as part of the manufacturing process of the transistor; therefore, the productivity of the semiconductor device can be improved. Furthermore, one of a pair of electrodes included in the capacitor 100, that is, the conductor 242, also serves as the source electrode or the drain electrode of the transistor 200; therefore, the area in which the transistor 200 and the capacitor 100 are positioned can be reduced.

Note that the conductor 294a and the conductor 294b can be formed using, for example, a material that can be used for the conductor 242.

For example, as shown in FIG. 20B, a structure in which the memory unit 400 and the memory unit 401 having a structure similar to that of the memory unit 400 are connected through a capacitor portion may be employed. Here, the memory unit 400 and the memory unit 401 illustrated in FIG. 20B have a structure similar to that of the memory unit 400 illustrated in FIG. 20A. Thus, for the details of the structures of the memory unit 400 and the memory unit 401 illustrated in FIG. 20B, the above description of the memory unit 400 illustrated in FIG. 20A can be referred to.

FIG. 20B is a cross-sectional view in which the memory unit 400 including the transistor 200a, the transistor 200b, the capacitor 100a, and the capacitor 100b and the memory unit 401 having a structure similar to that of the memory unit 400 are connected through a capacitor portion.

As shown in FIG. 20B, the conductor 294b functioning as one electrode of the capacitor 100b included in the memory unit 400 also serves as one electrode of a capacitor device included in the memory unit 401 having a structure similar to that of the memory unit 400. Although not shown, the conductor 294a functioning as one electrode of the capacitor 100a included in the memory unit 400 also serves as one electrode of a capacitor device included in a semiconductor device on the left side of the memory unit 400, that is, a semiconductor device adjacent to the memory unit 400 in the A1 direction in FIG. 20B. The cell on the right side of the memory unit 401, that is, the cell in the A2 direction in FIG. 20B, has a similar structure.

In this manner, the memory units are arranged in a matrix in the same layer, whereby a cell array can be formed. With this structure of the cell array, the space between the adjacent cells can be reduced; thus, the projected area of the cell array can be reduced and high integration can be achieved.

As in FIG. 17B, in the semiconductor device illustrated in FIG. 20B, the insulator 210 is provided below the insulator 212, and the conductor 288 is provided below the insulator 210. The top surface of the conductor 288 is in contact with the bottom surface of the conductor 248 of the memory unit 400 and the memory unit 401. Thus, the memory unit 400 and the memory unit 401 are electrically connected to the conductor 288, which functions as a wiring, through the conductor 248. The conductor 288 functioning as a bit line and the conductor 260 functioning as a word line are preferably arranged to be perpendicular to each other.

The cell array including the memory units 400 having the structure illustrated in FIG. 20A and FIG. 20B may have a stacked-layer structure instead of a single-layer structure. FIG. 21 shows a cross-sectional view of n layers of cell arrays 610 that are stacked including the memory unit 400. When a plurality of cell arrays (a cell array 610_1 to a cell array 610_n) are stacked as shown in FIG. 21, cells can be integrally positioned without increasing the area occupied by the cell arrays. In other words, a 3D cell array can be formed. Furthermore, since the capacitor 100 having the structure illustrated in FIG. 20A and FIG. 20B can be formed at the position lower than that of the top surface of the conductor 260, the height of each cell array can be reduced as compared to the case where a capacitor having a cylinder structure is used. Thus, a plurality of cell arrays can be stacked relatively easily. A high integration of memory cells is thus possible and a semiconductor device with high storage capacity can be provided.

[Memory Device 4]

Figure 22:
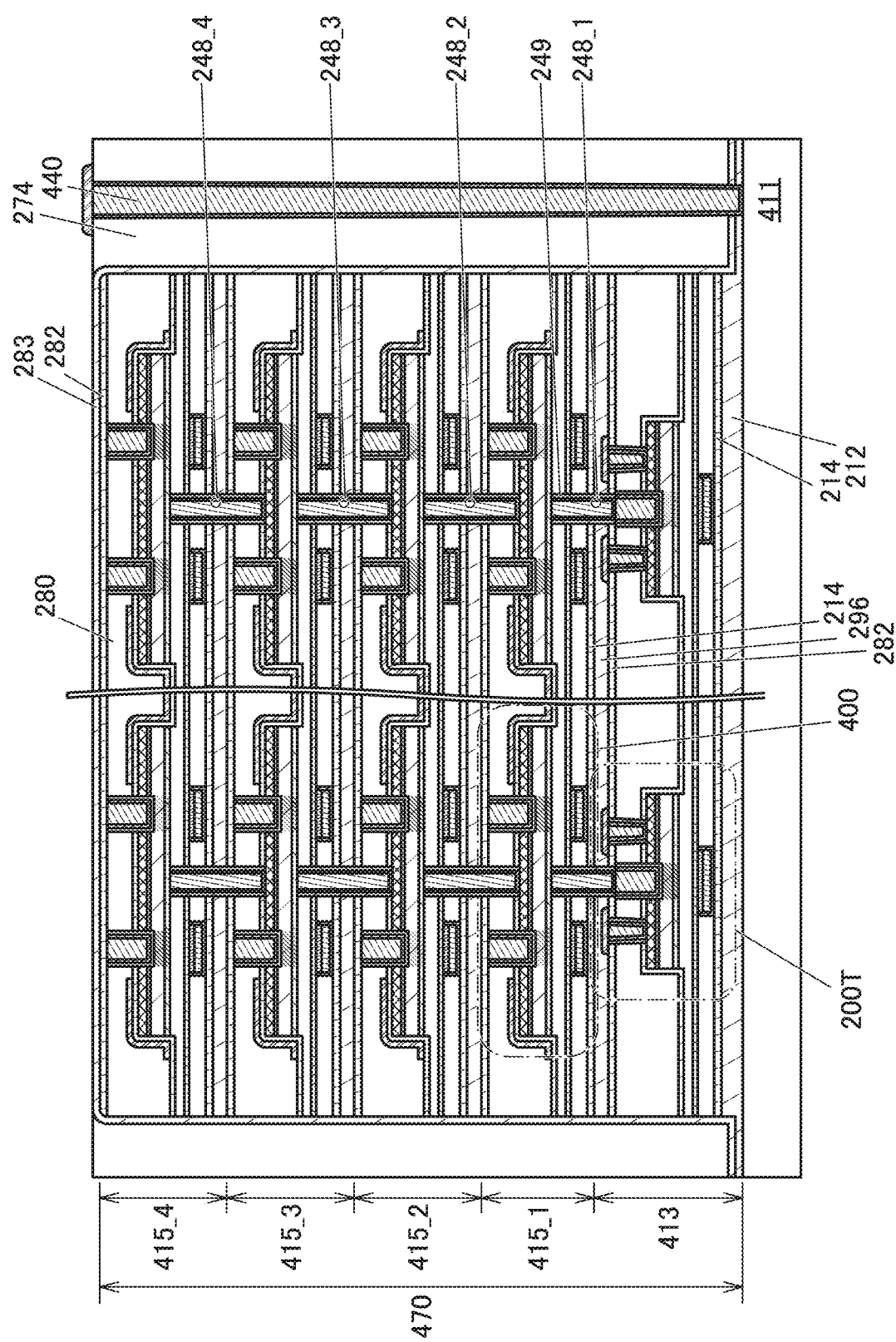
FIG. 22 is a cross-sectional view of a semiconductor device of one embodiment of the present invention.

FIG. 22 shows an example of the semiconductor device (memory device) of one embodiment of the present invention.

FIG. 22 shows an example in which a memory 470 includes a transistor layer 413 including a transistor 200T and a memory unit layer 415 of four layers (a memory unit layer 415_1 to a memory unit layer 415_4). The transistor 200T has a structure similar to that of the transistor 200 described in the above embodiment.

The memory unit layer 415_1 to the memory unit layer 415_4 each include a plurality of memory units 400. The memory units 400 included in the memory unit layer 415_1 to the memory unit layer 415_4 each have a structure similar to that of the memory unit 400. Thus, the description of FIG. 20A and the like can be referred to for the details of the memory unit 400.

The conductor 248_1 provided in the memory unit layer 415_1 is electrically connected to the transistor 200T, the conductor 248_2 provided in the memory unit layer 415_2 is connected to the conductor 242b provided in the memory unit layer 415_1, the conductor 248_3 provided in the memory unit layer 415_3 is connected to the conductor 242b provided in the memory unit layer 415_2, and the conductor 248_4 provided in the memory unit layer 415_4 is connected to the conductor 242b provided in the memory unit layer 415_3. Although the conductor 248_1 is connected to the gate electrode of the transistor 200T in FIG. 22, the present invention is not limited thereto, and the connection of the conductor 248_1 may be set as appropriate depending on the circuit configuration of the memory 470 or the like.

As described in the above embodiment, the region 232*b* of the oxide 230*b* overlaps with the conductor 242*b*, and thus has a high carrier concentration and electric conductivity. For this reason, with the above structure, the region 232*b* of the memory unit 400 provided in each memory unit layer 415 can be electrically connected to the transistor 200T through the conductor 248.

In this manner, a plurality of memory unit layers can be stacked, and thus the memory cells can be integrated without increasing the area occupied by the cell array. A high integration of memory cells is thus possible and a semiconductor device with high storage capacity can be provided.

The memory 470 is sealed with the insulator 212, the insulator 214, the insulator 282, and the insulator 283 (such a structure is referred to as a sealing structure below for convenience). The insulator 274 is provided in the periphery of the insulator 283. A conductor 440 is provided in the insulator 274, the insulator 283, and the insulator 212, and is electrically connected to an element layer 411.

The insulator 280 is provided in the sealing structure. The insulator 280 has a function of releasing oxygen by heating. Alternatively, the insulator 280 includes an excess-oxygen region.

Each of the insulator 212 and the insulator 283 is suitably formed using a material having a high barrier property against hydrogen. Each of the insulator 214 and the insulator 282 is suitably formed using a material having a function of capturing or fixing hydrogen.

Examples of the material having a high barrier property against hydrogen include silicon nitride and silicon nitride oxide. Examples of the material having a function of capturing or fixing hydrogen include aluminum oxide, hafnium oxide, and an oxide containing aluminum and hafnium (hafnium aluminate).

For the crystal structure of materials used for the insulator 212, the insulator 214, the insulator 282, and the insulator 283, an amorphous or crystalline structure may be employed, although the crystal structure is not limited thereto. For example, it is preferable to use an amorphous aluminum oxide film for the material having a function of capturing or fixing hydrogen. Amorphous aluminum oxide may capture or fix hydrogen more than aluminum oxide with high crystallinity.

The insulator 282 and the insulator 214 are preferably provided between the transistor layer 413 and the memory unit layer 415 or between the memory unit layers 415. An insulator 296 is preferably provided between the insulator 282 and the insulator 214. A material similar to that for the insulator 283 can be used for the insulator 296. Alternatively, silicon oxide or silicon oxynitride can be used. Alternatively, a known insulating material may be used.

Here, as the model of excess oxygen in the insulator 280 with respect to diffusion of hydrogen from an oxide semiconductor in contact with the insulator 280, the following model can be given.

Hydrogen in the oxide semiconductor diffuses to other structure bodies through the insulator 280 in contact with the oxide semiconductor. Owing to the hydrogen diffusion, the excess oxygen in the insulator 280 reacts with hydrogen in the oxide semiconductor, which yields the OH bonding to diffuse in the insulator 280. The hydrogen atom having the OH bonding reacts with the oxygen atom bonded to an atom (such as a metal atom) in the insulator 282 in reaching a material which has a function of capturing or fixing hydrogen (typically the insulator 282), and is captured or fixed in the insulator 282. The oxygen atom which had the OH bonding of the excess oxygen may remain as excess oxygen in the insulator 280. That is, it is highly probable that the excess oxygen in the insulator 280 serves as a bridge in the diffusion of the hydrogen.

A manufacturing process of the semiconductor device is one of important factors for the model.

For example, the insulator 280 containing excess oxygen is formed over the oxide semiconductor, and then the insulator 282 is formed. After that, heat treatment is preferably performed. Specifically, the heat treatment is performed at 350° C. or higher, preferably 400° C. or higher under an atmosphere containing oxygen, an atmosphere containing nitrogen, or a mixed atmosphere of oxygen and nitrogen. The heat treatment is performed for one hour or more, preferably four hours or more, and further preferably eight hours or more.

The heat treatment enables diffusion of hydrogen from the oxide semiconductor to the outside through the insulator 280 and the insulator 282. That is, the absolute amount of hydrogen in and near the oxide semiconductor can be reduced.

The insulator 283 is formed after the heat treatment. The insulator 283 is formed using a material having a high barrier property against hydrogen; thus, entry of hydrogen diffusing to the outside or external hydrogen into the inside, specifically, the oxide semiconductor or the insulator 280 side can be inhibited.

An example where the heat treatment is performed after the insulator 282 is formed is shown; however, one embodiment of the present invention is not limited thereto. For example, the heat treatment may be performed after the transistor layer 413 is formed or after the memory unit layer 415_1 to the memory unit layer 415_3 are formed. When hydrogen is diffused to the outside by the heat treatment, hydrogen is diffused to above the transistor layer 413 or in a lateral direction. Similarly, in the case where heat treatment is performed after the memory unit layer 415_1 to the memory unit layer 415_3 are formed, hydrogen is diffused into an upper area or in the lateral direction.

Through the above manufacturing process, the insulator 212 and the insulator 283 are bonded, whereby the sealing structure is formed.

With the above-described structure and the above-described manufacturing process, a semiconductor device using an oxide semiconductor with reduced hydrogen concentration can be provided. Accordingly, a semiconductor device with high reliability can be provided. According to another embodiment of the present invention, a semiconductor device with favorable electrical characteristics can be provided.

The structures, methods, and the like described in this embodiment can be used in combination as appropriate with the structures, configurations, methods, and the like described in the other embodiments.

Embodiment 3

In this embodiment, a memory device of one embodiment of the present invention including a transistor in which an oxide is used as a semiconductor (hereinafter referred to as an OS transistor in some cases) and a capacitor (hereinafter referred to as an OS memory device in some cases), is described with reference to FIG. 23A, FIG. 23B, and FIG. 24A to FIG. 24C. The OS memory device is a memory device including at least a capacitor and the OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 23A:
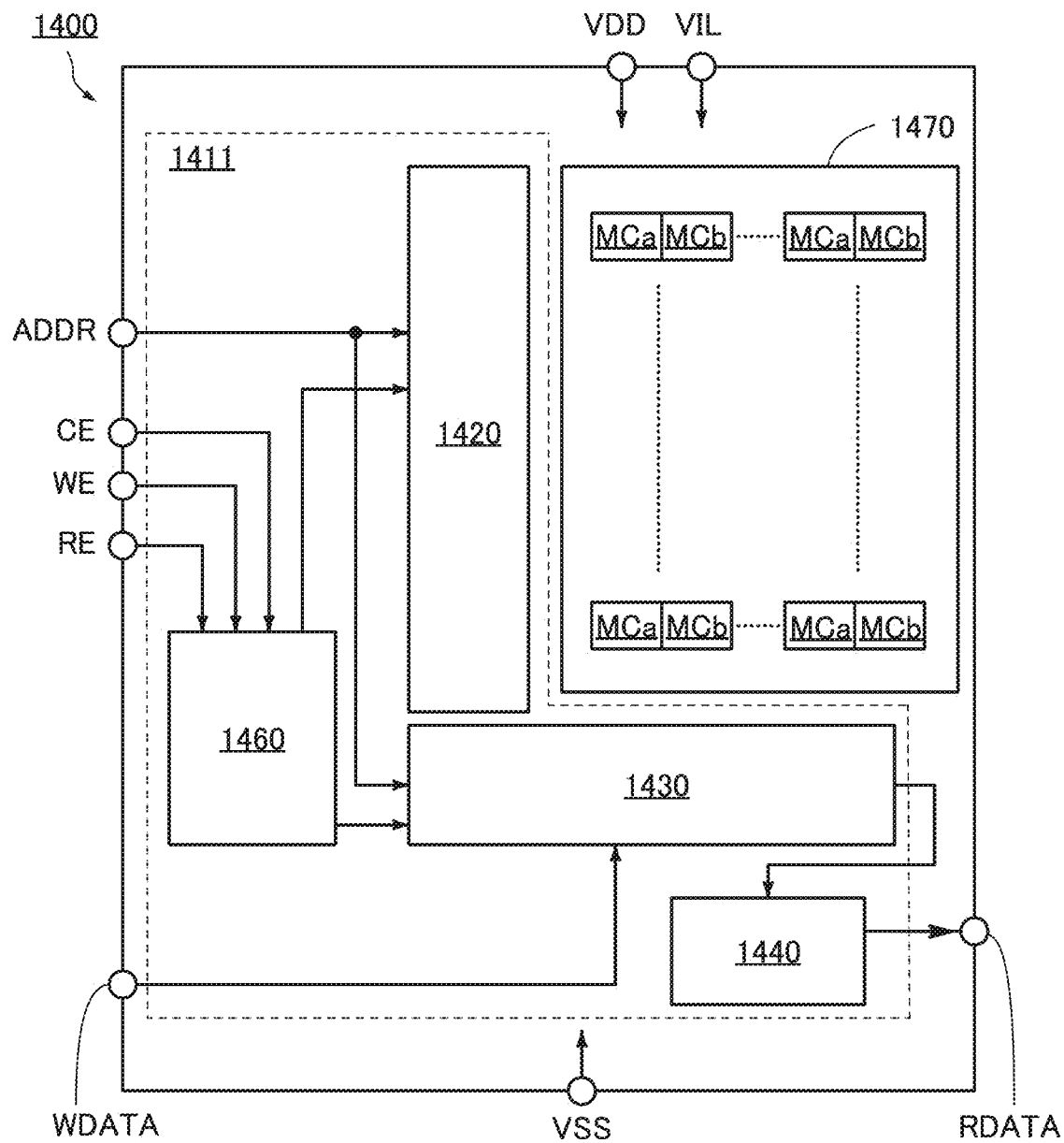
FIG. 23A and FIG. 23B are block diagrams of a memory device of one embodiment of the present invention.

FIG. 23A shows a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and are described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals are input as necessary.

The memory cell array 1470 includes a plurality of memory cells MCa and a plurality of memory cells MCb arranged in a matrix and a plurality of wirings. In the memory device described in this embodiment, one memory unit is formed of a pair of the memory cell MCa and the memory cell MCb, as illustrated in FIG. 23A. In the following description, the memory cell MCa and the memory cell MCb are collectively referred to as a memory cell MC in some cases. The number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 23B:
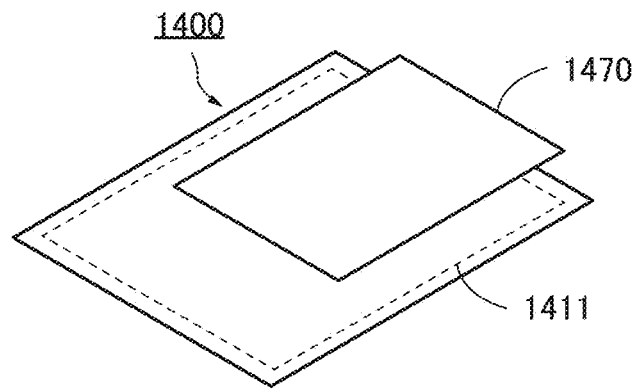

Note that FIG. 23A shows an example in which the peripheral circuit 1411 and the memory cell array 1470 are formed on the same plane; however, this embodiment is not limited thereto. For example, as shown in FIG. 23B, the memory cell array 1470 may be provided to overlap with part of the peripheral circuit 1411. For example, the sense amplifier may be provided below the memory cell array 1470 so that they overlap with each other.

As described in the above embodiment, a metal oxide such as an In-M-Zn oxide can be deposited on a substrate by a sputtering method or the like. Hence, the memory cell array 1470 can be provided to be over and overlap with the peripheral circuit 1411 formed on a silicon substrate. This increases the area occupied by the memory cell array that can be provided in one chip, resulting in an increase in the storage capacity of a semiconductor device.

Furthermore, the memory cell array 1470 may have a stacked-layer structure. When a plurality of memory cell arrays 1470 are stacked, memory cells can be integrally positioned without increasing the area occupied by the memory cell arrays 1470. In other words, a 3D cell array can be formed. A high integration of memory cells is thus possible and a semiconductor device with high storage capacity can be provided.

Figure 24A:
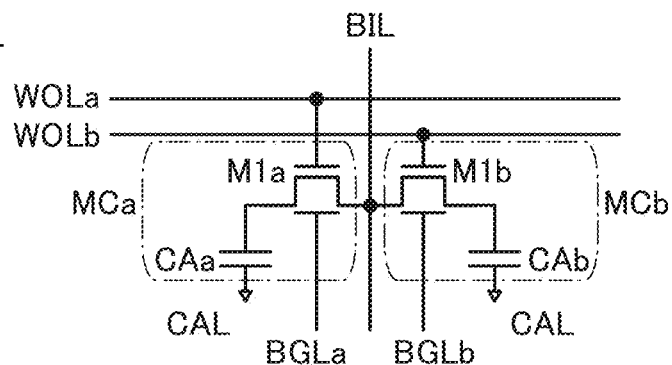
FIG. 24A, FIG. 24B, and FIG. 24C are circuit diagrams of structure examples of memory devices of one embodiment of the present invention.
Figure 24B:
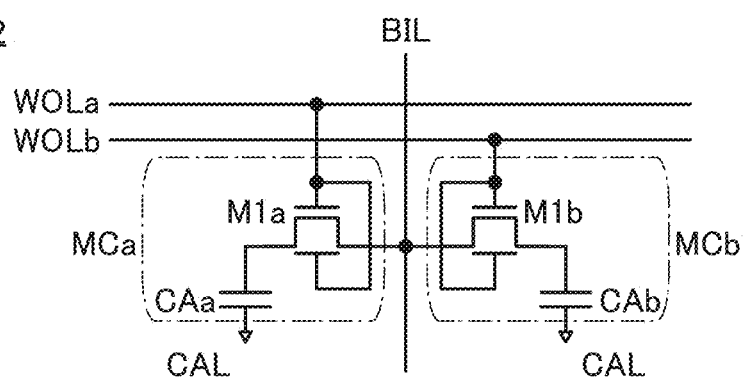
Figure 24C:
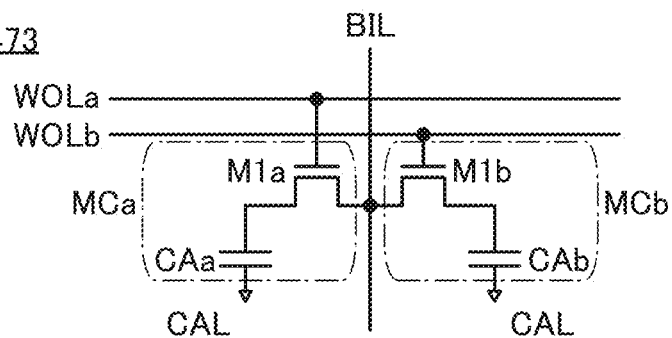

FIG. 24A to FIG. 24C show structure examples of a memory cell that can be applied to the memory cell MCa and the memory cell MCb.

[DOSRAM]

FIG. 24A to FIG. 24C show circuit structure examples of DRAM memory cells. In this specification and the like, a DRAM using a memory cell including one OS transistor and one capacitor is referred to as a DOSRAM (Dynamic Oxide Semiconductor Random Access Memory) in some cases. A memory unit 1471 illustrated in FIG. 24A includes the memory cell MCa and the memory cell MCb. The memory cell MCa includes a transistor M1$a$ and a capacitor CAa, and the memory cell MCb includes a transistor M1$b$ and a capacitor CAb. Note that the transistor M1$a$ and the transistor M1$b$ each include a gate (also referred to as a top gate in some cases) and a back gate.

A first terminal of the transistor M1$a$ is connected to a first terminal of the capacitor CAa, a second terminal of the transistor M1$a$ is connected to a wiring BIL, the gate of the transistor M1$a$ is connected to a wiring WOLa, and the back gate of the transistor M1$a$ is connected to a wiring BGLa. A second terminal of the capacitor CAa is connected to a wiring CAL. In a similar manner, a first terminal of the transistor M1$b$ is connected to a first terminal of the capacitor CAb, a second terminal of the transistor M1$b$ is connected to the wiring BIL, the gate of the transistor M1$b$ is connected to a wiring WOLb, and the back gate of the transistor M1$b$ is connected to a wiring BGLb. A second terminal of the capacitor CAb is connected to the wiring CAL.

The wiring BIL functions as a bit line, and the wiring WOLa and the wiring WOLb function as a word line. The wiring CAL functions as a wiring for applying a predetermined potential to the second terminals of the capacitor CAa and the capacitor CAb. In the time of data writing and data reading, a low-level potential is preferably applied to the wiring CAL. The wiring BGLa functions as a wiring for applying a potential to the back gate of the transistor M1$a$, and the wiring BGLb functions as a wiring for applying a potential to the back gate of the transistor M1$b$. By applying a given potential to the wiring BGLa (wiring BGLb), the threshold voltage of the transistor M1$a$ (transistor M1$b$) can be increased or decreased.

Here, the memory unit 1471 illustrated in FIG. 24A corresponds to the memory unit 400 illustrated in FIG. 17A and the like. In other words, the transistor M1$a$, the capacitor CAa, the transistor M1$b$, and the capacitor CAb correspond to the transistor 200*a*, the capacitor 100*a*, the transistor 200*b*, and the capacitor 100*b*, respectively. The wiring WOLa, the wiring WOLb, and the wiring BIL correspond to the conductor 260 of the transistor 200*a*, the conductor 260 of the transistor 200*b*, and the conductor 248 and the conductor 288, respectively.

The memory device of this embodiment is not limited to the memory unit 1471, and the circuit structure can be changed. For example, as in a memory unit 1472 shown in FIG. 24B, the back gate of the transistor M1a may be connected not to the wiring BGLa but to the wiring WOLa and the back gate of the transistor M1b may be connected not to the wiring BGLb but to the wiring WOLb in the memory device of this embodiment. For example, the memory device of this embodiment may be composed of single-gate transistors, that is, the transistor M1a and the transistor M1b that has no back gate, as in a memory unit 1473 shown in FIG. 24C.

In the case where the semiconductor device described in the above embodiment is used in the memory unit 1471 or the like, the transistor 200a can be used as the transistor M1a, the transistor 200b can be used as the transistor M1b, the capacitor 100a can be used as the capacitor CAa, and the capacitor 100b can be used as the capacitor CAb. When OS transistors are used as the transistor M1a and the transistor M1b, the leakage current of the transistor M1a and the transistor M1b can be extremely low. In other words, with the use of the transistor M1a and the transistor M1b, written data can be retained for a long period of time, and thus the frequency of the refresh operation for the memory cell can be decreased. In addition, refresh operation for the memory cell can be omitted. In addition, since the transistor M1a and the transistor M1b have an extremely low leakage current, multi-level data or analog data can be retained in the memory unit 1471, the memory unit 1472, and the memory unit 1473.

In the DOSRAM, when the sense amplifier is provided below the memory cell array 1470 to overlap with the memory cell array 1470 as described above, the bit line can be shortened. In particular, when the conductor 248 is provided below the oxide 230, the length of the bit line can be shorter than that when the conductor 248 is provided above the oxide 230, as described in the above embodiment. This reduces bit line capacity, which reduces the storage capacity of the memory cell.

The structures of the peripheral circuit 1411, the memory cell array 1470, and the like described in this embodiment are not limited to the above. The arrangement and functions of these circuits and the wirings, circuit components, and the like connected to the circuits can be changed, removed, or added as needed.

The structure described in this embodiment can be used in an appropriate combination with the structures described in the other embodiments and the like.

Embodiment 4

In this embodiment, an example of a chip 1200 on which the semiconductor device of the present invention is mounted is described with reference to FIG. 25A and FIG. 25B. A plurality of circuits (systems) are mounted on the chip 1200. A technique for integrating a plurality of circuits (systems) into one chip is referred to as system on chip (SoC) in some cases.

Figure 25A:
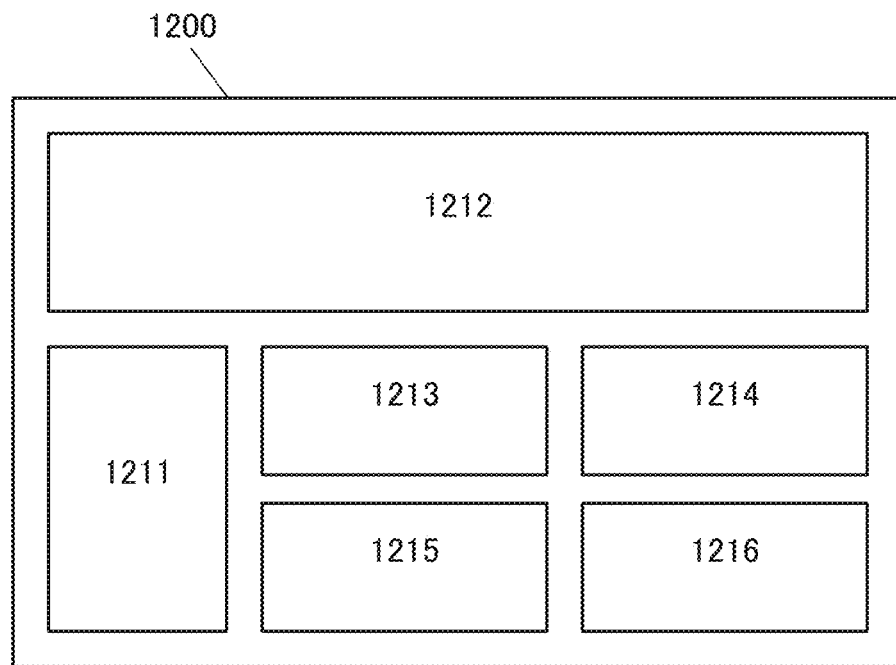
FIG. 25A and FIG. 25B are schematic views of a semiconductor device of one embodiment of the present invention.

As shown in FIG. 25A, the chip 1200 includes a CPU 1211, a GPU 1212, one or a plurality of analog arithmetic units 1213, one or a plurality of memory controllers 1214, one or a plurality of interfaces 1215, one or a plurality of network circuits 1216, and the like.

Figure 25B:
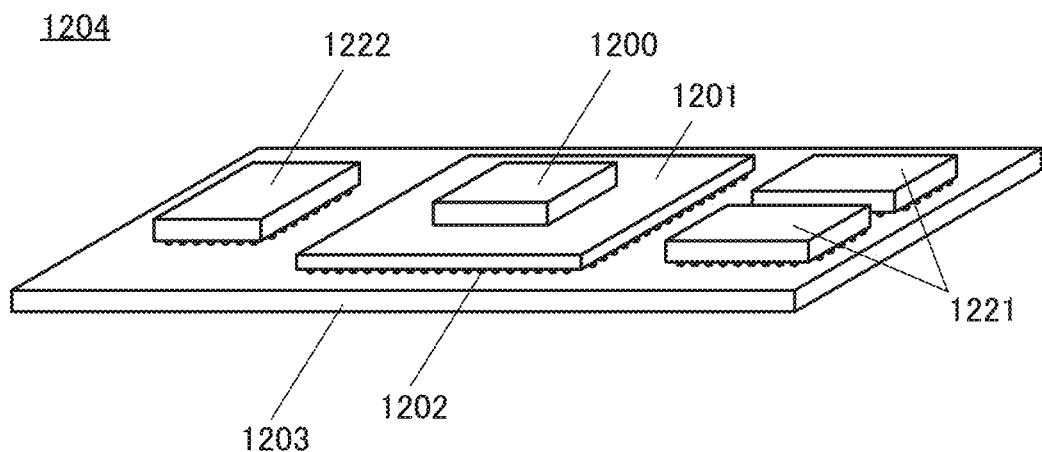

A bump (not shown) is provided on the chip 1200, and as shown in FIG. 25B, the chip 1200 is connected to a first surface of a printed circuit board (PCB) 1201. In addition, a plurality of bumps 1202 are provided on a rear side of the first surface of the PCB 1201, and the PCB 1201 is connected to a motherboard 1203.

Memory devices such as DRAMs 1221 and a flash memory 1222 may be provided over the motherboard 1203. For example, the DOSRAM described in the above embodiment can be used as the DRAM 1221. When the DOSRAM in the above embodiment is used as the DRAM 1221, the storage capacity of the DRAM 1221 can be increased.

The CPU 1211 preferably includes a plurality of CPU cores. In addition, the GPU 1212 preferably includes a plurality of GPU cores. Furthermore, the CPU 1211 and the GPU 1212 may each include a memory for temporarily storing data. Alternatively, a common memory for the CPU 1211 and the GPU 1212 may be provided in the chip 1200. The above-described DOSRAM or the like can be used as the memory. Moreover, the GPU 1212 is suitable for parallel computation of a number of data and thus can be used for image processing or product-sum operation. When an image processing circuit or a product-sum operation circuit using an oxide semiconductor of the present invention is provided in the GPU 1212, image processing and product-sum operation can be performed with low power consumption.

In addition, since the CPU 1211 and the GPU 1212 are provided on the same chip, a wiring between the CPU 1211 and the GPU 1212 can be shortened, and the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 has a function of controlling connection to a LAN (Local Area Network) or the like. The network circuit 1216 may further include a circuit for network security.

The circuits (systems) can be formed in the chip 1200 through the same manufacturing process. Therefore, even when the number of circuits needed for the chip 1200 increases, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAMs 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in an appropriate combination with the structures described in the other embodiments and the like.

Embodiment 5

In this embodiment, examples of electronic components and electronic devices in which the memory device or the like described in the above embodiment is incorporated will be described.

<Electronic Component>

Figure 26A:
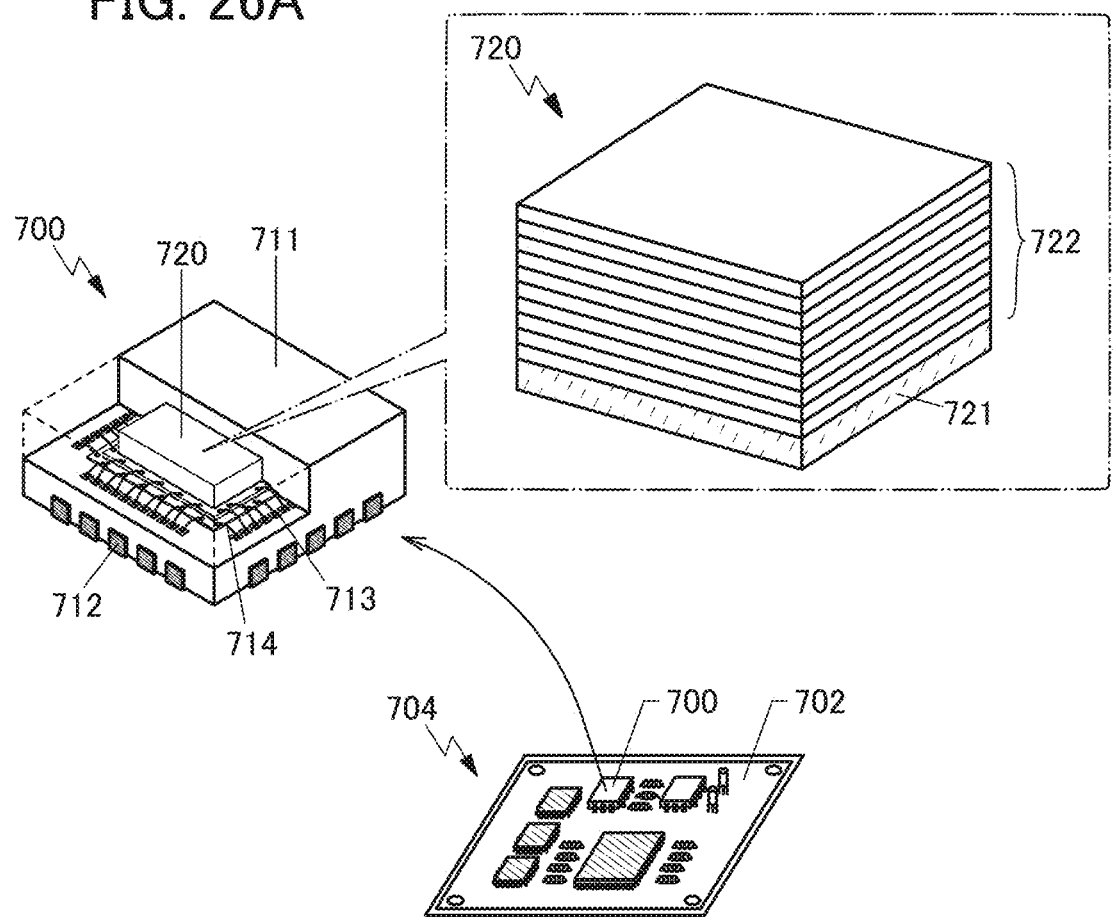
FIG. 26A and FIG. 26B are diagrams each illustrating an example of an electronic component of one embodiment of the present invention.
Figure 26B:
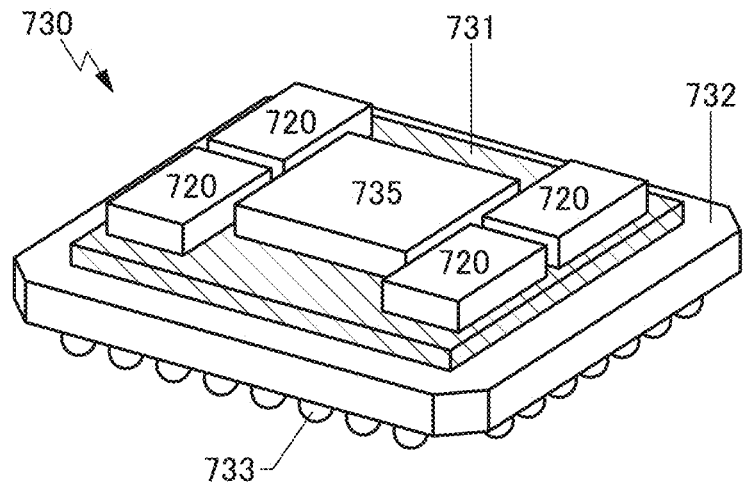

First, FIG. 26A and FIG. 26B show examples of an electronic component including a memory device 720.

FIG. 26A is a perspective view of an electronic component 700 and a substrate (circuit board 704) on which the electronic component 700 is mounted. The electronic component 700 in FIG. 26A includes the memory device 720 in a mold 711. FIG. 26A omits part of the electronic component to show the inside of the electronic component 700. The electronic component 700 includes a land 712 outside the mold 711. The land 712 is electrically connected to an electrode pad 713, and the electrode pad 713 is electrically connected to the memory device 720 via a wire 714. The electronic component 700 is mounted on a printed circuit board 702, for example. A plurality of such electronic components are combined and electrically connected to each other on the printed circuit board 702, which forms the circuit board 704.

The memory device 720 includes a driver circuit layer 721 and a storage circuit layer 722. For example, with the use of the 3D cell array described in the above embodiment, the memory circuit layer 722 can be formed.

FIG. 26B is a perspective view of an electronic component 730. The electronic component 730 is an example of a SiP (System in package) or an MCM (Multi Chip Module). In the electronic component 730, an interposer 731 is provided over a package substrate 732 (printed circuit board) and a semiconductor device 735 and a plurality of memory devices 720 are provided over the interposer 731.

The electronic component 730 using the memory device 720 as a high bandwidth memory (HBM) is illustrated as an example. An integrated circuit (a semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings have a single-layer structure or a layered structure. The interposer 731 has a function of electrically connecting an integrated circuit provided on the interposer 731 to an electrode provided on the package substrate 732. Accordingly, the interposer is sometimes referred to as a "redistribution substrate" or an "intermediate substrate". A through electrode may be provided in the interposer 731 to be used for electrically connecting the integrated circuit and the package substrate 732. In the case of using a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In an SiP, an MCM, or the like using a silicon interposer, a decrease in reliability due to a difference in expansion coefficient between an integrated circuit and the interposer is less likely to occur. Furthermore, a surface of a silicon interposer has high planarity, and a poor connection between the silicon interposer and an integrated circuit provided thereon is less likely to occur. It is particularly preferable to use a silicon interposer for a 2.5D package (2.5D mounting) in which a plurality of integrated circuits are arranged side by side on the interposer.

A heat sink (radiator plate) may be provided to overlap with the electronic component 730. In the case of providing a heat sink, the heights of integrated circuits provided on the interposer 731 are preferably equal to each other. In the electronic component 730 of this embodiment, the heights of the memory device 720 and the semiconductor device 735 are preferably equal to each other, for example.

An electrode 733 may be provided on the bottom portion of the package substrate 732 to mount the electronic component 730 on another substrate. FIG. 26B shows an example in which the electrode 733 is formed of a solder ball. Solder balls are provided in a matrix on the bottom portion of the package substrate 732, whereby a BGA (Ball Grid Array) can be achieved. Alternatively, the electrode 733 may be formed of a conductive pin. When conductive pins are provided in a matrix on the bottom portion of the package substrate 732, a PGA (Pin Grid Array) can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

This embodiment can be implemented in an appropriate combination with the structures described in the other embodiments and the like.

Embodiment 6

Figure 27A:
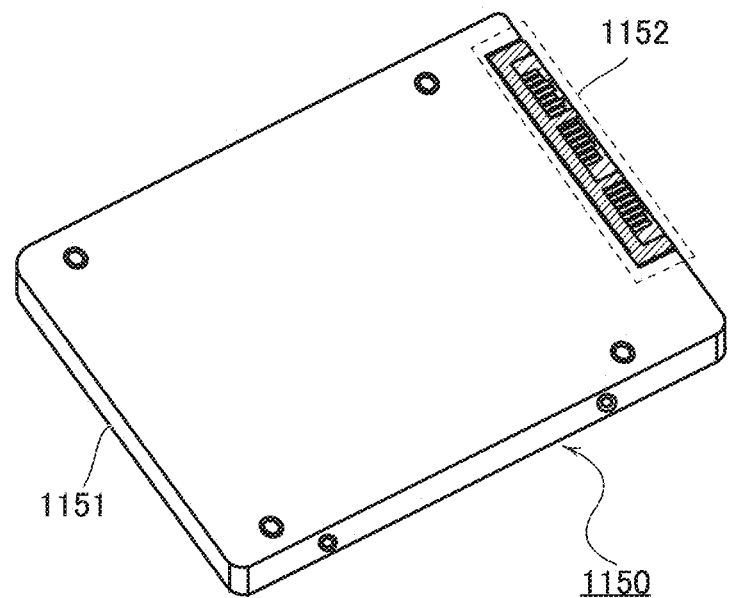
FIG. 27A and FIG. 27B are schematic views of a memory device of one embodiment of the present invention.
Figure 27B:
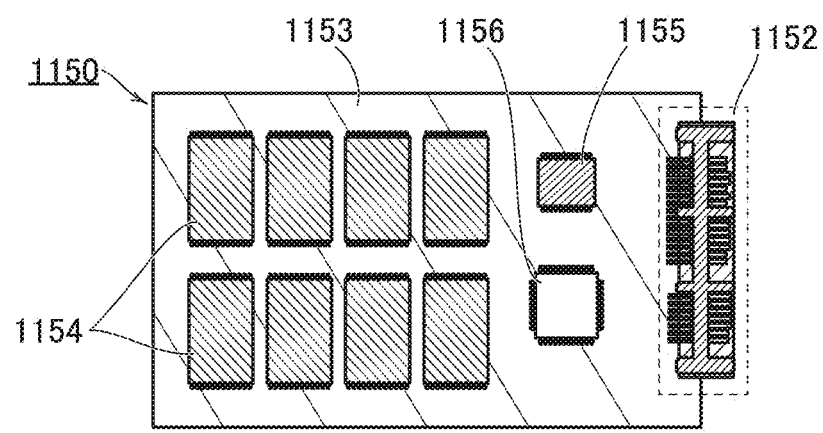

In this embodiment, application examples of the memory device using the semiconductor device described in the above embodiment are described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment can be applied to a variety of removable memory devices such as SSDs (solid state drives). FIG. 27A and FIG. 27B schematically show a structure example of a removable memory device. The semiconductor device described in the above embodiment can be processed into a packaged memory chip and used in a variety of memory devices and removable memories, for example.

FIG. 27A is a schematic external view of an SSD, and FIG. 27B is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip described in the above embodiment can be used, for example. When the memory chip 1154 is also provided on the back side of the substrate 1153, the capacity of the SSD 1150 can be increased.

This embodiment can be implemented in an appropriate combination with the structures described in the other embodiments and the like.

Embodiment 7

The semiconductor device of one embodiment of the present invention can be used as a processor such as a CPU and a GPU or a chip. FIG. 28A to FIG. 28H show specific examples of electronic devices including a chip or a processor such as a CPU or a GPU of one embodiment of the present invention.

<Electronic Device and System>

The GPU or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. When the GPU or the chip of one embodiment of the present invention is provided in the electronic device, the electronic device can include artificial intelligence.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 28A to FIG. 28H show examples of electronic devices.

[Information Terminal]

Figure 28A:
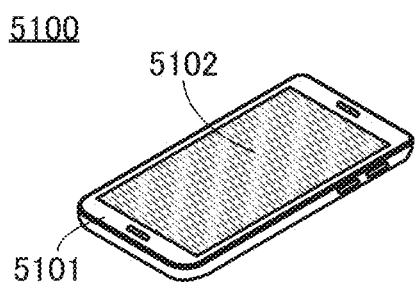
FIG. 28A, FIG. 28B, FIG. 28C, FIG. 28D, FIG. 28E, FIG. 28F, FIG. 28G, and FIG. 28H are diagrams illustrating electronic devices of one embodiment of the present invention.

FIG. 28A shows a mobile phone (smartphone), which is a type of information terminal. An information terminal 5100 includes a housing 5101 and a display portion 5102. As input interfaces, a touch panel is provided in the display portion 5102 and a button is provided in the housing 5101.

When the chip of one embodiment of the present invention is applied to the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 28B:
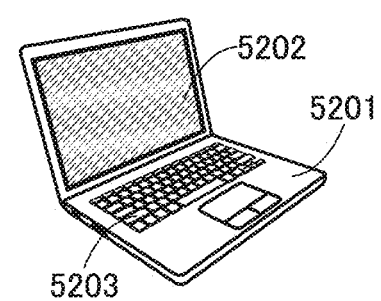

FIG. 28B shows a notebook information terminal 5200. The notebook information terminal 5200 includes a main body 5201 of the information terminal, a display portion 5202, and a keyboard 5203.

Like the information terminal 5100 described above, when the chip of one embodiment of the present invention is applied to the notebook information terminal 5200, the notebook information terminal 5200 can execute an application utilizing artificial intelligence. Examples of the application utilizing artificial intelligence include design-support software, text correction software, and software for automatic menu generation. Furthermore, with the use of the notebook information terminal 5200, novel artificial intelligence can be developed.

Note that although FIG. 28A and FIG. 28B show a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machines]

Figure 28C:
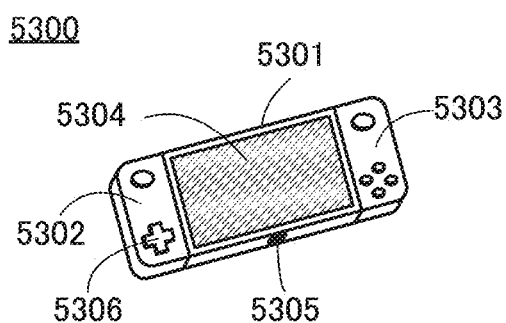

FIG. 28C shows a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not shown), an image to be output to the display portion 5304 can be output to another video device (not shown). In that case, the housing 5302 and the housing 5303 can each function as an operating unit. Thus, a plurality of players can play a game at the same time. The chip described in the above embodiment can be incorporated into the chip provided on a substrate in the housing 5301, the housing 5302 and the housing 5303.

Figure 28D:
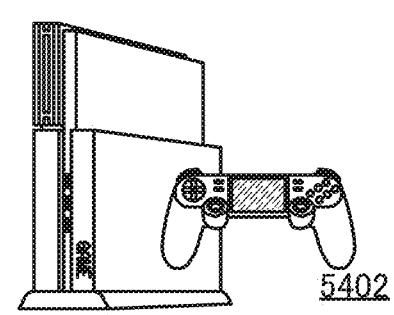

FIG. 28D shows a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is applied to the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, it becomes possible to change expressions such as questions posed by the player, the progress of the game, time, and actions and words of game characters.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are shown as examples of game machines in FIG. 28C and FIG. 28D, the game machine using the GPU or the chip of one embodiment of the present invention is not limited thereto. Examples of the game machine to which the GPU or the chip of one embodiment of the present invention is applied include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

Figure 28E:
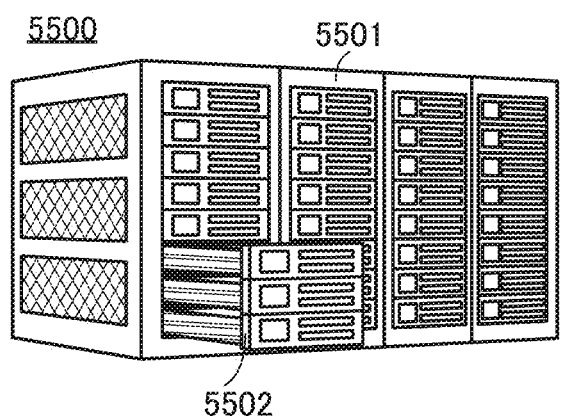
Figure 28F:
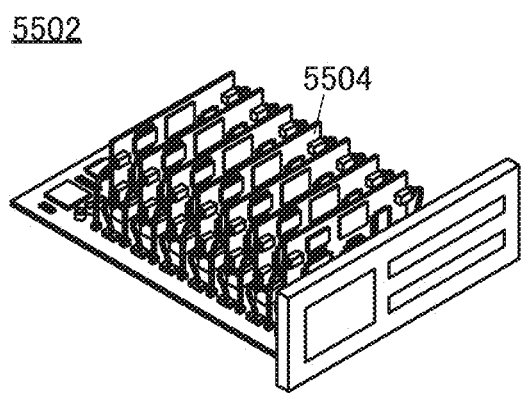

FIG. 28E shows a supercomputer 5500 as an example of a large computer. FIG. 28F shows a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip shown in the above embodiment can be mounted.

The supercomputer 5500 is a large computer mainly used for scientific computation. In scientific computation, an enormous amount of arithmetic operation needs to be processed at a high speed; hence, power consumption is large and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit, a peripheral circuit, and a module can be reduced.

Although a supercomputer is shown as an example of a large computer in FIG. 28E and FIG. 28F, a large computer using the GPU or the chip of one embodiment of the present invention is not limited thereto. Other examples of large computers in which the GPU or the chip of one embodiment of the present invention is usable include a computer that provides service (a server) and a large general-purpose computer (a mainframe).

[Moving Vehicle]

The GPU or the chip of one embodiment of the present invention can be applied to an automobile, which is a moving vehicle, and the periphery of a driver's seat in the automobile.

Figure 28G:
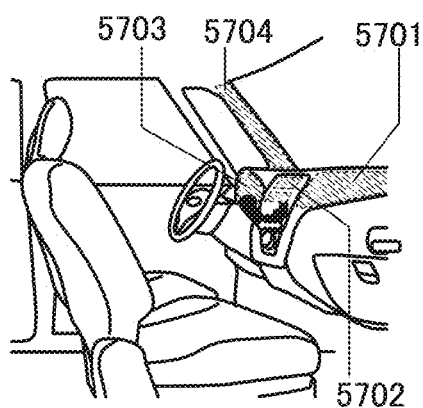

FIG. 28G shows an area around a windshield inside an automobile, which is an example of a moving vehicle. FIG. 28G shows a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging device (not shown) provided for the automobile. That is, displaying an image taken by the imaging device provided outside the automobile leads to compensation for the blind spot and an increase in safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be applied to a component of artificial intelligence, the chip can be used for an automatic driving system of the automobile, for example. The chip can also be used for a system for navigation, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is applied to each of these moving vehicles.

[Household Appliance]

Figure 28H:
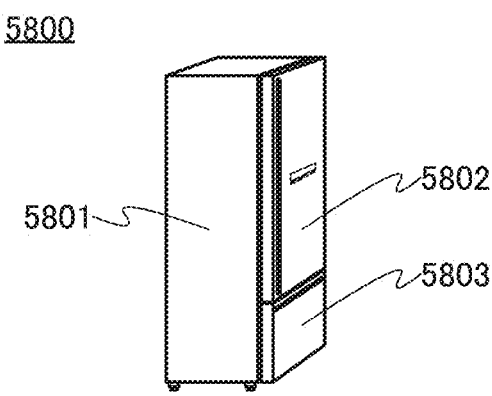

FIG. 28H shows an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

This embodiment can be implemented in an appropriate combination with the structures described in the other embodiments and the like.

REFERENCE NUMERALS

BGLa: wiring, BGLb: wiring, BIL: wiring, CAa: capacitor, CAb: capacitor, CAL: wiring, MCa: memory cell, MCb: memory cell, M1a: transistor, M1b: transistor, WOLa: wiring, WOLb: wiring, 100: capacitor, 100a: capacitor, 100b: capacitor, 110: conductor, 115: conductor, 120: conductor, 125: conductor, 130: insulator, 140: conductor, 142: insulator, 145: insulator, 150: insulator, 152: insulator, 153: conductor, 154: insulator, 156: insulator, 200: transistor, 200a: transistor, 200b: transistor, 200T: transistor, 205: conductor, 205a: conductor, 205b: conductor, 205c: conductor, 210: insulator, 212: insulator, 214: insulator, 216: insulator, 222: insulator, 224: insulator, 230: oxide, 230a: oxide, 230A: oxide film, 230b: oxide, 230B: oxide film, 230c: oxide, 230d: oxide, 232a: region, 232b: region, 232c: region, 232d: region, 232e: region, 240: conductor, 241: insulator, 242: conductor, 242a: conductor, 242A: conductive film, 242b: conductor, 242B: conductive layer, 242c: conductor, 243: oxide, 243a: oxide, 243A: oxide film, 243b: oxide, 243B: oxide layer, 243c: oxide, 248: conductor, 248_1: conductor, 248_2: conductor, 248_3: conductor, 248_4: conductor, 248a: conductor, 248b: conductor, 249: insulator, 250: insulator, 250A: insulating film, 260: conductor, 260a: conductor, 260b: conductor, 271: insulator, 272: insulator, 273: insulator, 274: insulator, 275: insulator, 280: insulator, 282: insulator, 283: insulator, 288: conductor, 294a: conductor, 294b: conductor, 296: insulator, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 358: insulator, 400: memory unit, 401: memory unit, 411: element layer, 413: transistor layer, 415: memory unit layer, 415_1: memory unit layer, 415_2: memory unit layer, 415_3: memory unit layer, 415_4: memory unit layer, 440: conductor, 470: memory, 610: cell array, 610_n: cell array, 610_1: cell array, 700: electronic component, 702: printed circuit board, 704: circuit board, 711: mold, 712: land, 713: electrode pad, 714: wire, 720: memory device, 721: driver circuit layer, 722: storage circuit layer, 730: electronic component, 731: interposer, 732: package substrate, 733: electrode, 735: semiconductor device, 1150: SSD, 1151: housing, 1152: connector, 1153: substrate, 1154: memory chip, 1155: memory chip, 1156: controller chip, 1200: chip, 1201: PCB, 1202: bump, 1203: motherboard, 1204: GPU module, 1211: CPU, 1212: GPU, 1213: analog arithmetic unit, 1214: memory controller, 1215: interface, 1216: network circuit, 1221: DRAM, 1222: flash memory, 1400: memory device, 1411: peripheral circuit, 1420: row circuit, 1430: column circuit, 1440: output circuit, 1460: control logic circuit, 1470: memory cell array, 1471: memory unit, 1472: memory unit, 1473: memory unit, 2700: manufacturing apparatus, 2701: atmosphere-side substrate supply chamber, 2702: atmosphere-side substrate transfer chamber, 2703a: load lock chamber, 2703b: unload lock chamber, 2704: transfer chamber, 2706a: chamber, 2706b: chamber, 2706c: chamber, 2706d: chamber, 2761: cassette port, 2762: alignment port, 2763a: transfer robot, 2763b: transfer robot, 2801: gas supply source, 2802: valve, 2803: high-frequency generator, 2804: waveguide, 2805: mode converter, 2806: gas pipe, 2807: waveguide, 2808: slot antenna plate, 2809: dielectric plate, 2810: high-density plasma, 2811: substrate, 2812: substrate holder, 2813: heating mechanism, 2815: matching box, 2816: high-frequency power source, 2817: vacuum pump, 2818: valve, 2819: exhaust port, 2820: lamp, 2821: gas supply source, 2822: valve, 2823: gas inlet, 2824: substrate, 2825: substrate holder, 2826: heating mechanism, 2828: vacuum pump, 2829: valve, 2830: exhaust port, 5100: information terminal, 5101: housing, 5102: display portion, 5200: notebook information terminal, 5201: main body, 5202: display portion, 5203: keyboard, 5300: portable game machine, 5301: housing, 5302: housing, 5303: housing, 5304: display portion, 5305: connection portion, 5306: operation key, 5400: stationary game machine, 5402: controller, 5500: supercomputer, 5501: rack, 5502: computer, 5504: substrate, 5701: display panel, 5702: display panel, 5703: display panel, 5704: display panel, 5800: electric refrigerator-freezer, 5801: housing, 5802: refrigerator door, and 5803: freezer door

The invention claimed is:

1. A semiconductor device comprising:
a first conductor positioned over a substrate;
an oxide positioned in direct contact with a top surface of the first conductor;
a second conductor, a third conductor, and a fourth conductor positioned over the oxide;
a first insulator in which a first opening and a second opening are formed, the first insulator being positioned over the second conductor to the fourth conductor;
a second insulator positioned in the first opening;
a fifth conductor positioned over the second insulator;
a third insulator positioned in the second opening; and
a sixth conductor positioned over the third insulator; insulator,
wherein the third conductor is positioned to overlap with the first conductor,
wherein the first opening is formed to overlap with a region between the second conductor and the third conductor, and
wherein the second opening is formed to overlap with a region between the third conductor and the fourth conductor.

2. The semiconductor device according to claim 1, further comprising a first capacitor and a second capacitor,
wherein the first capacitor is electrically connected to the second conductor, and
wherein the second capacitor is electrically connected to the fourth conductor.

3. The semiconductor device according to claim 2,
wherein the first capacitor is positioned over the second conductor, and
wherein the second capacitor is positioned over the fourth conductor.

4. The semiconductor device according to claim 1,
wherein the first conductor is connected to a wiring provided below the first conductor.

5. The semiconductor device according to claim 1,
wherein the second insulator is in contact with a top surface of the oxide and a side surface of the first insulator, and
wherein the third insulator is in contact with the top surface of the oxide and the side surface of the first insulator.

6. The semiconductor device according to claim 1,
wherein the oxide comprises a first oxide and a second oxide over the first oxide, wherein the first oxide and the second oxide each comprise indium, an element M (M is one or more selected from gallium, aluminum, yttrium, and tin), and zinc, and wherein an atomic ratio of indium to the element M in the first oxide is lower than an atomic ratio of indium to the element M in the second oxide.

7. A method of manufacturing a semiconductor device, comprising the steps of:

forming a first conductor over a substrate;

depositing an oxide film in direct contact with a top surface of the first conductor;

depositing a first conductive film over the oxide film;

forming an oxide and a second conductor by processing the oxide film and the first conductive film into an island shape;

forming a first insulator covering the oxide and the second conductor;

removing parts of the first insulator to form a first opening and a second opening each overlapping with the second conductor;

removing parts of the second conductor that overlap with the first opening and the second opening to form a third conductor, a fourth conductor, and a fifth conductor, the fourth conductor being positioned to overlap with the first conductor;

exposing regions of the oxide that do not overlap with the third conductor, the fourth conductor, and the fifth conductor;

depositing a first insulating film in contact with a top surface of the oxide;

performing microwave treatment in an atmosphere comprising oxygen;

depositing a second conductive film over the first insulating film; and forming a second insulator and a sixth conductor in the first opening and forming a third insulator and a seventh conductor in the second opening by performing a polishing treatment on the first insulating film and the second conductive film until a top surface of the first insulator is exposed.

8. The semiconductor device according to claim 1, wherein the second insulator is in contact with a top surface of the oxide and an inner surface of the first opening, and wherein the third insulator is in contact with the top surface of the oxide and an inner surface of the second opening.

* * * * *